(12) United States Patent
Tsunetsugu

(10) Patent No.: US 12,249,982 B2
(45) Date of Patent: Mar. 11, 2025

(54) SEMICONDUCTOR DEVICE

(71) Applicants: Kabushiki Kaisha Toshiba, Tokyo (JP); Toshiba Electronic Devices & Storage Corporation, Tokyo (JP)

(72) Inventor: Yukio Tsunetsugu, Yokohama Kanagawa (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 2 days.

(21) Appl. No.: 18/462,069

(22) Filed: Sep. 6, 2023

(65) Prior Publication Data

US 2024/0322822 A1    Sep. 26, 2024

(30) Foreign Application Priority Data

Mar. 22, 2023  (JP) .................... 2023-045736

(51) Int. Cl.
*H03K 17/785*   (2006.01)
(52) U.S. Cl.
CPC ................ *H03K 17/785* (2013.01)

(58) Field of Classification Search
CPC .................................................. H03K 17/785
See application file for complete search history.

(56) References Cited

U.S. PATENT DOCUMENTS 5,559,466 A    9/1996   Okumura et al.

FOREIGN PATENT DOCUMENTS

| JP | H07-46109 A | 2/1995 |
|----|-------------|--------|
| JP | H08-65127 A | 3/1996 |
| JP | H09-261027 A | 10/1997 |

*Primary Examiner* — Robert L Deberadinis
(74) *Attorney, Agent, or Firm* — Kim & Stewart LLP

(57) ABSTRACT

According to one embodiment, a semiconductor device includes first and second switch elements, first and second light emitting elements, first and second light receiving elements, first and second voltage control circuits, and first and second switch control circuits. The first switch control circuit is configured to cause the first light emitting element to emit light after a first time elapses after an input signal has transitioned from a first logic level to a second logic level. The second switch control circuit is configured to suspend light emission of the second light emitting element after a second time elapses after the input signal has transitioned from the second logic level to the first logic level.

19 Claims, 26 Drawing Sheets

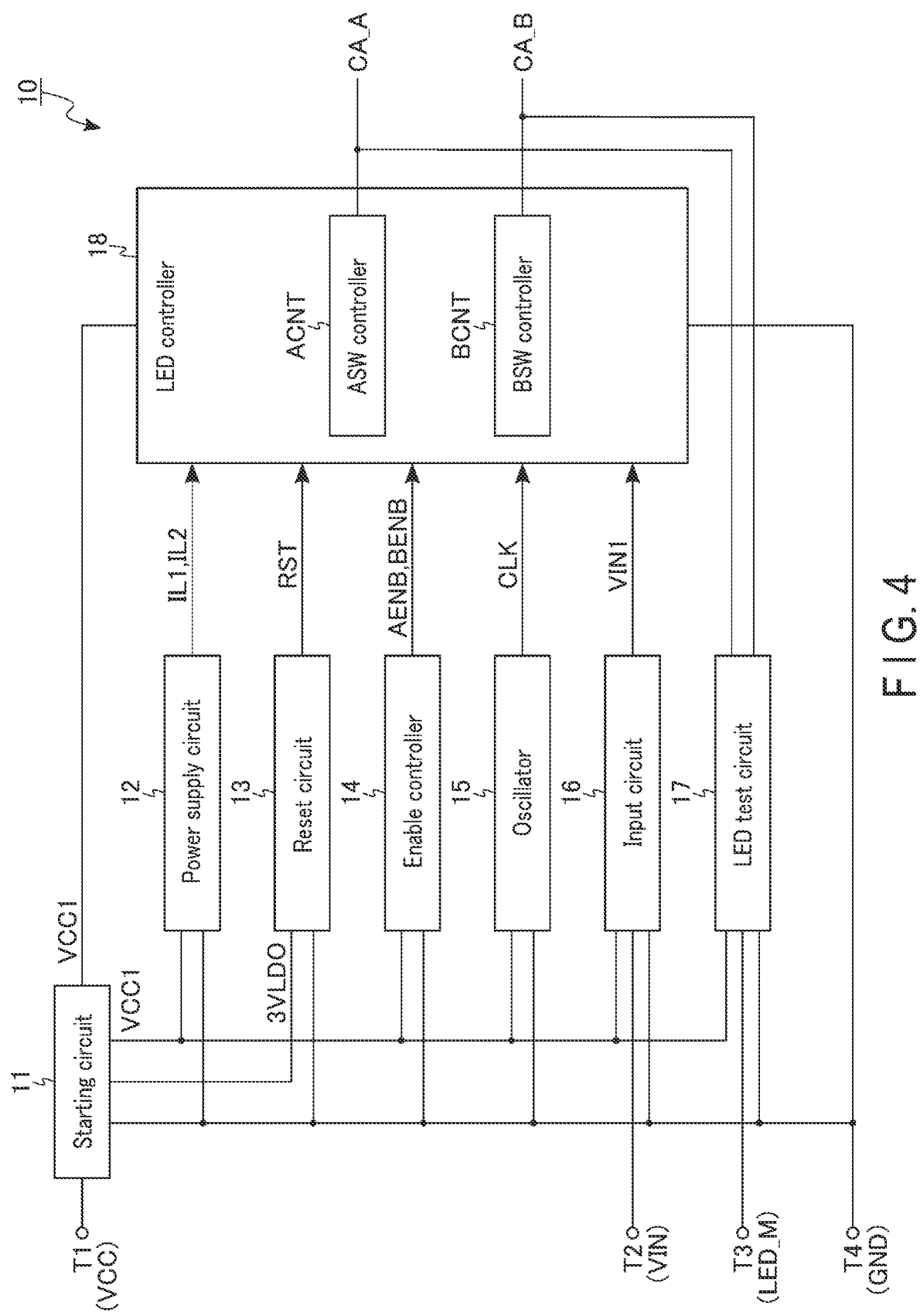
F I G. 4

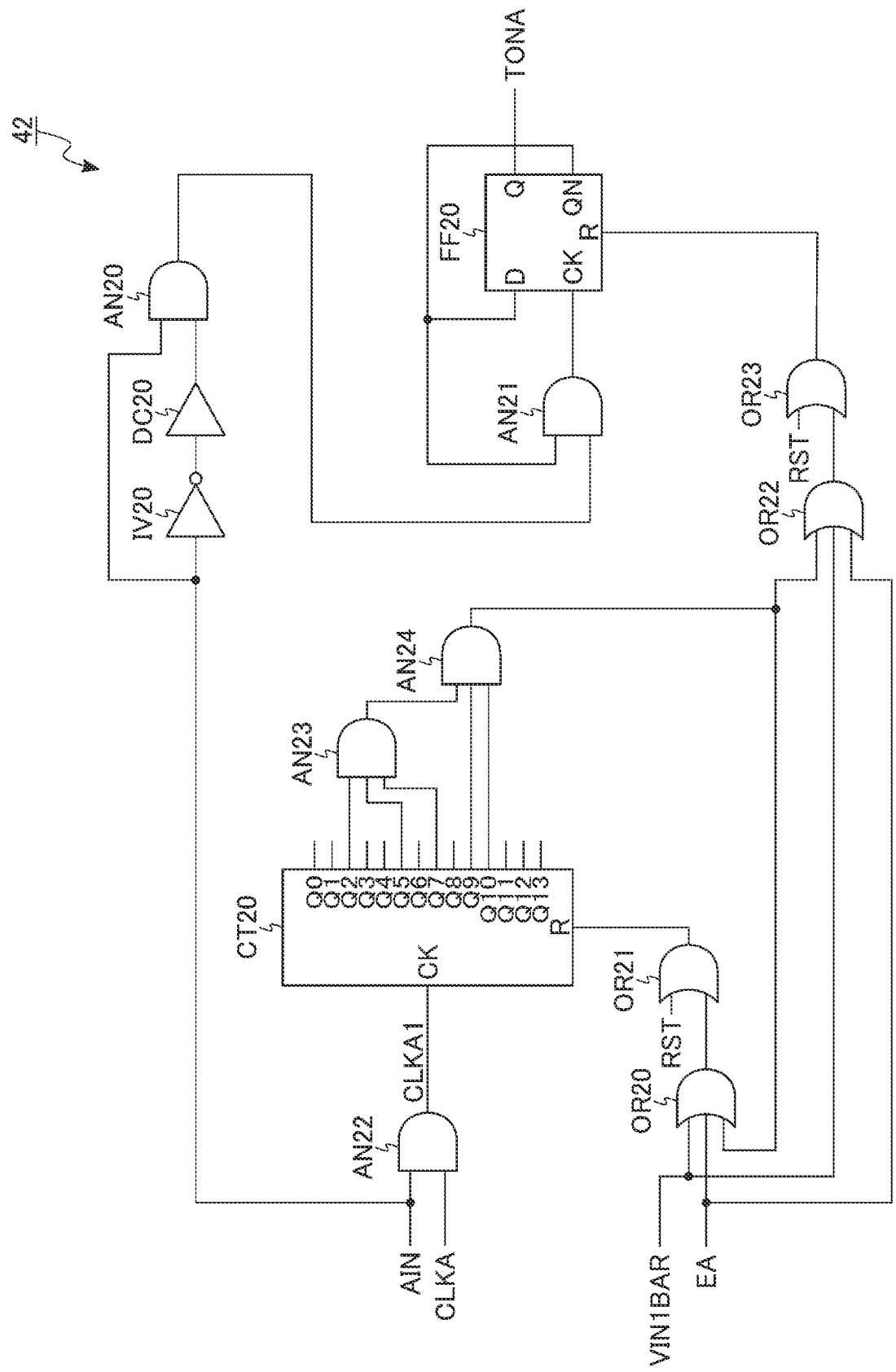
F I G. 10

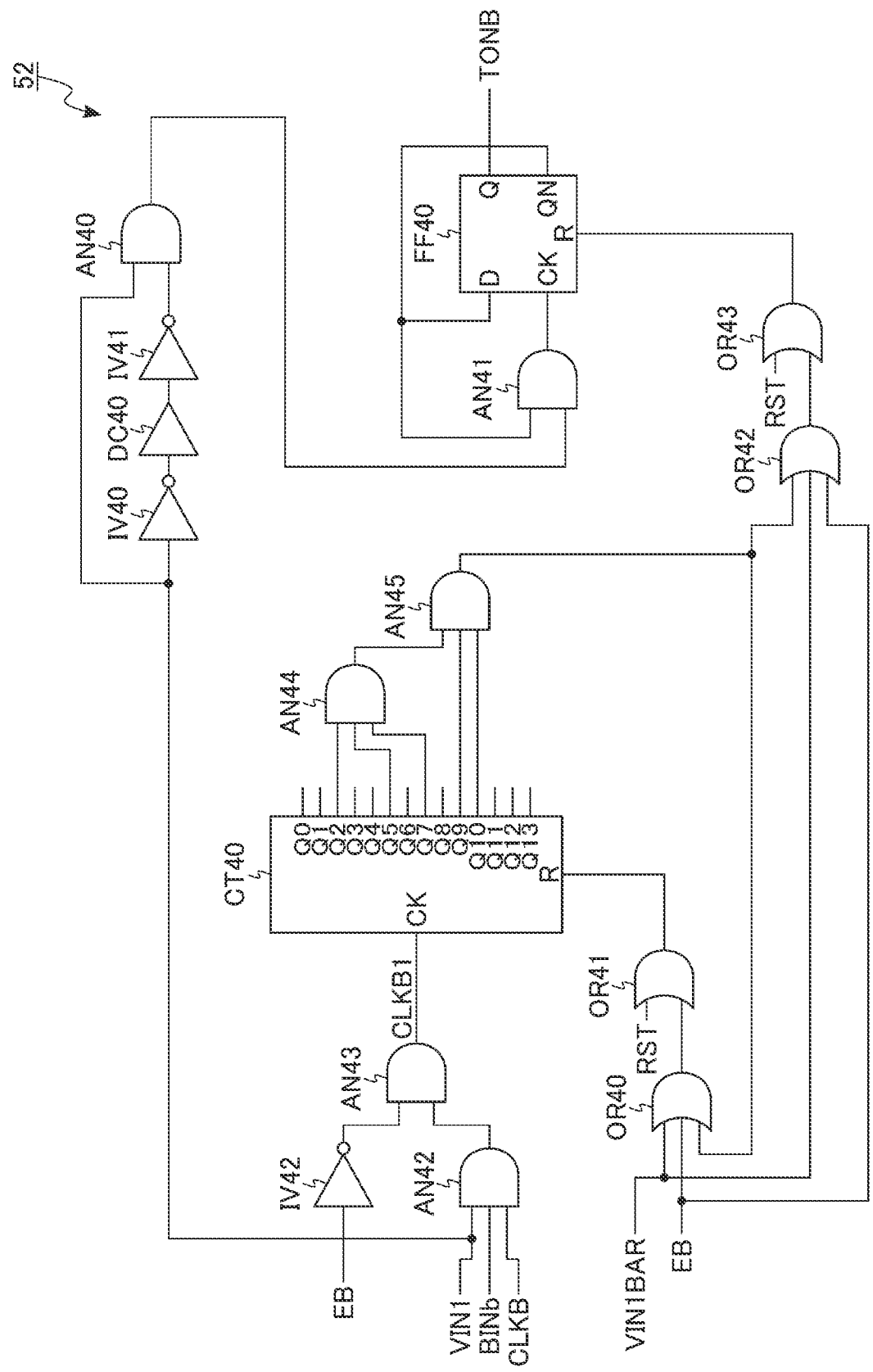
F I G. 12

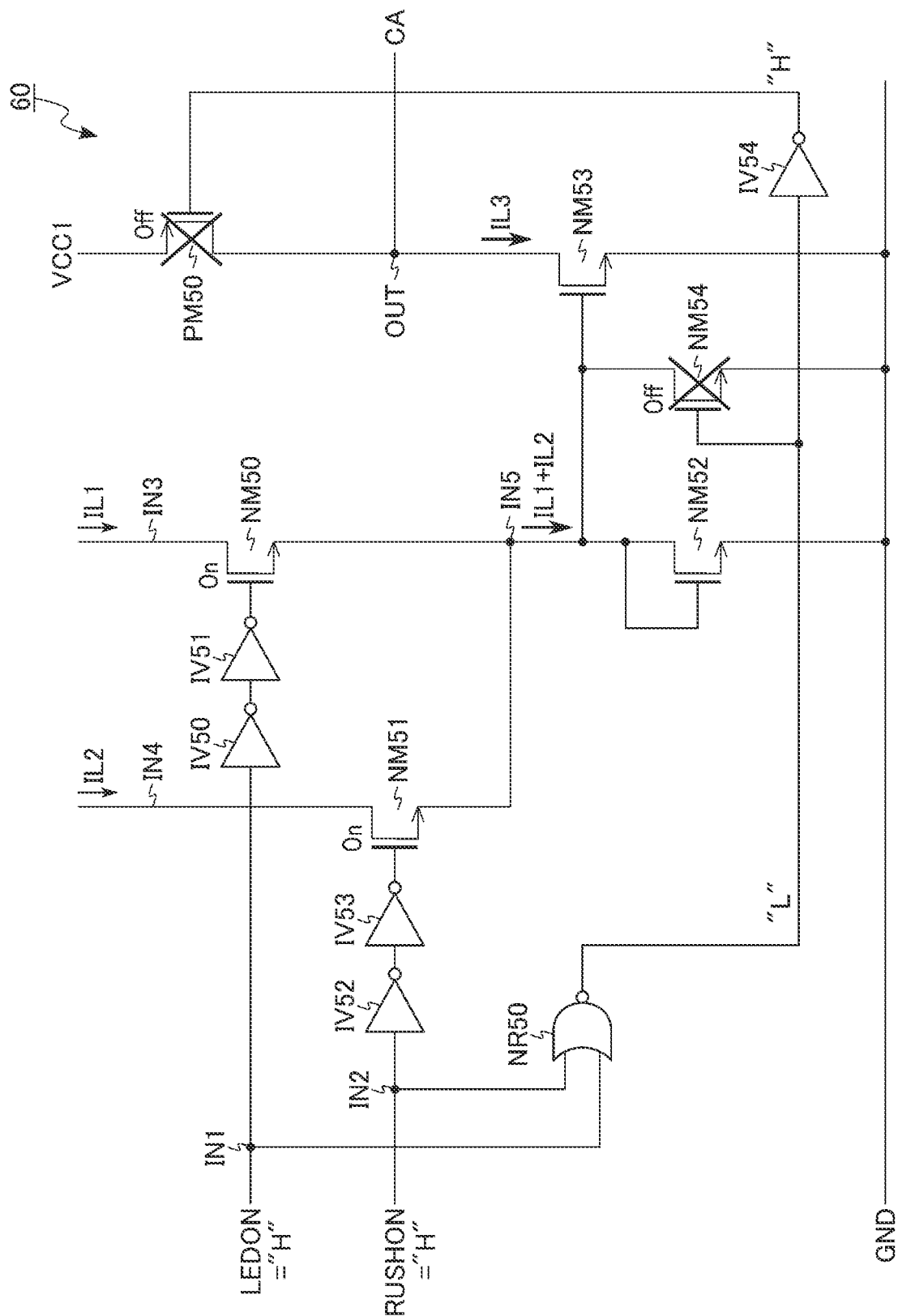
F I G. 14

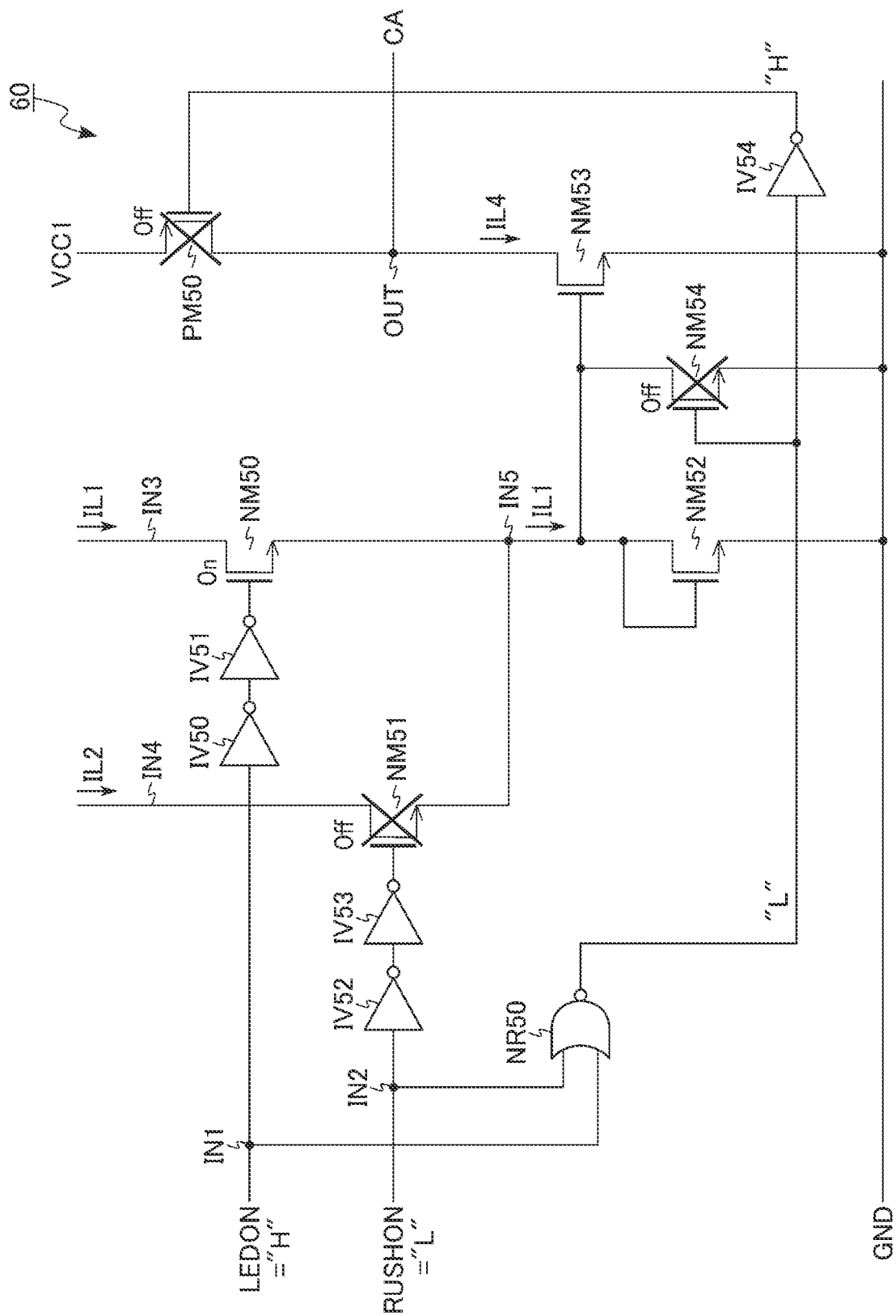
F I G. 15

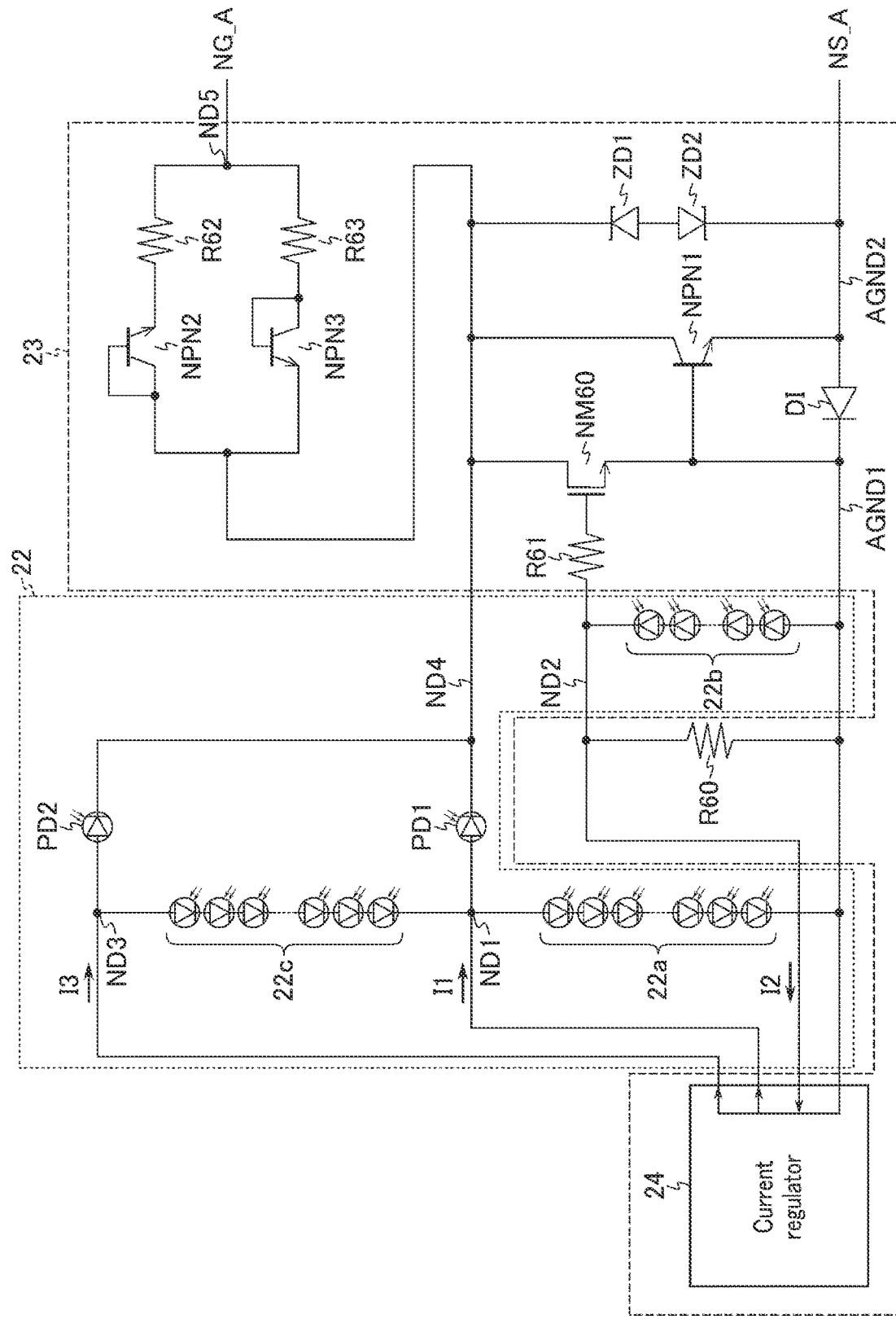
F I G. 16

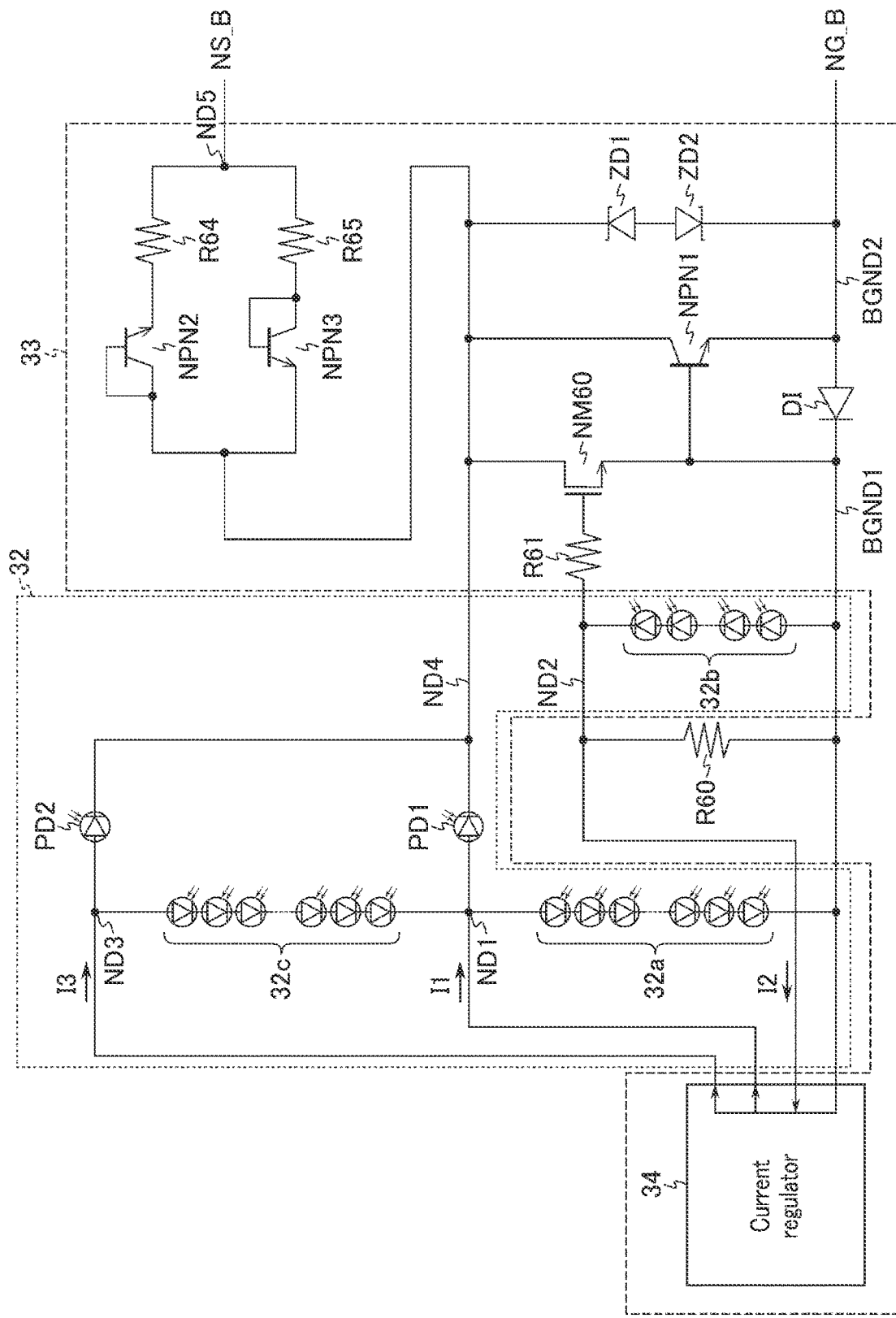
F I G. 17

| Input | | | Output | |
|---|---|---|---|---|
| VCC | GND | VIN | ASW1 | ASW2 |
| L | L | – | Off | Off |
| H | L | H | On | Off |
| H | L | L | Off | On |

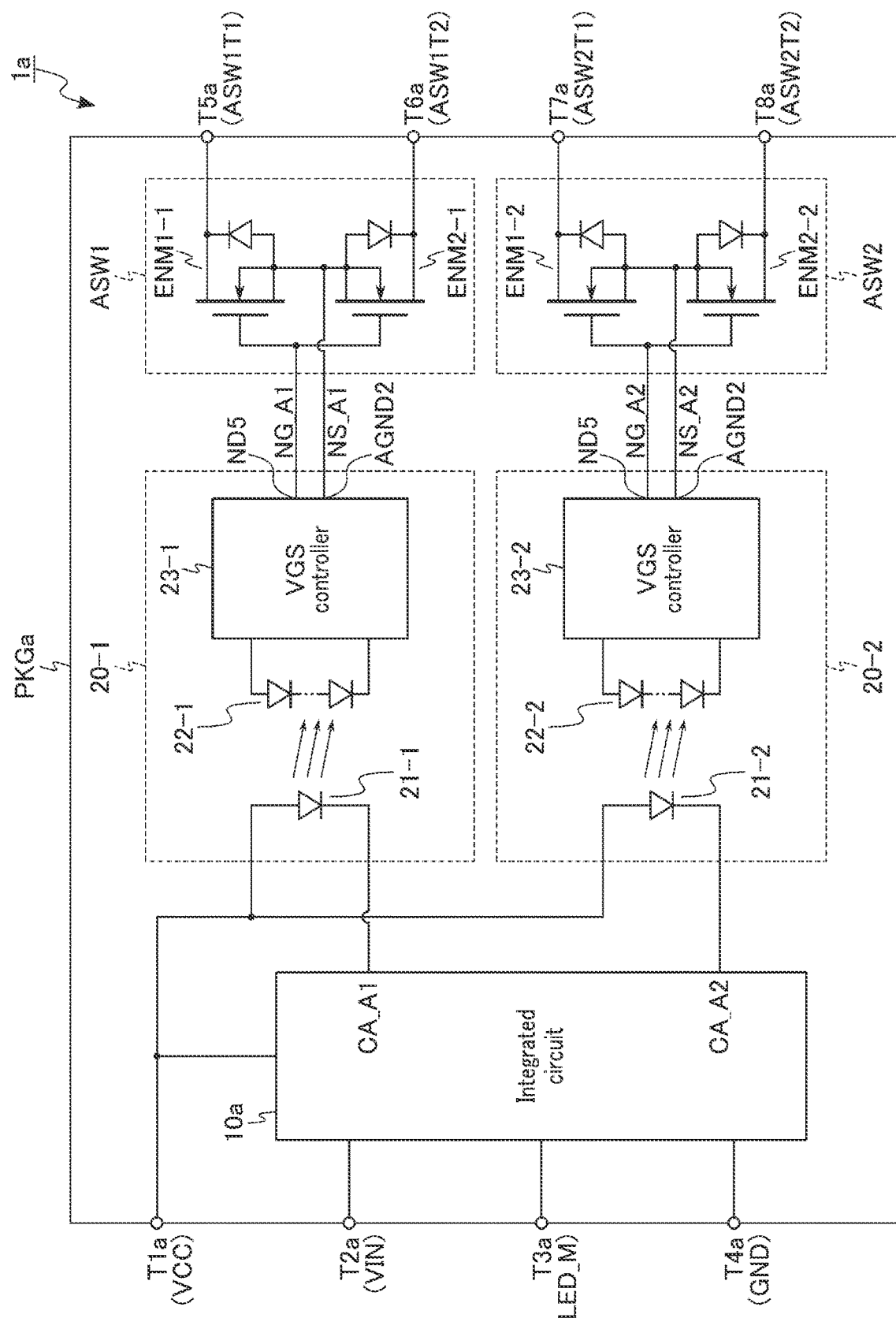
F I G. 24

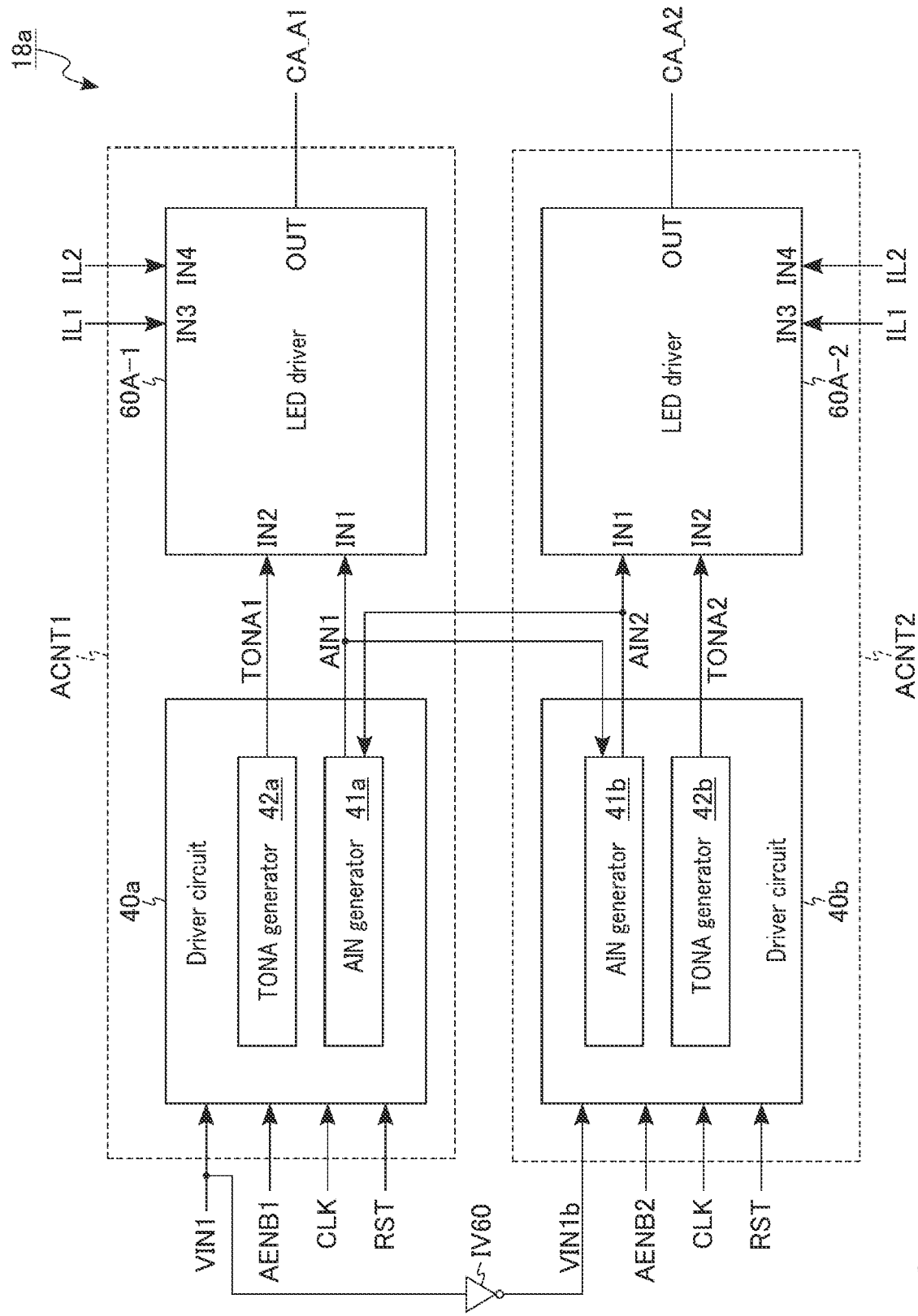
F I G. 26

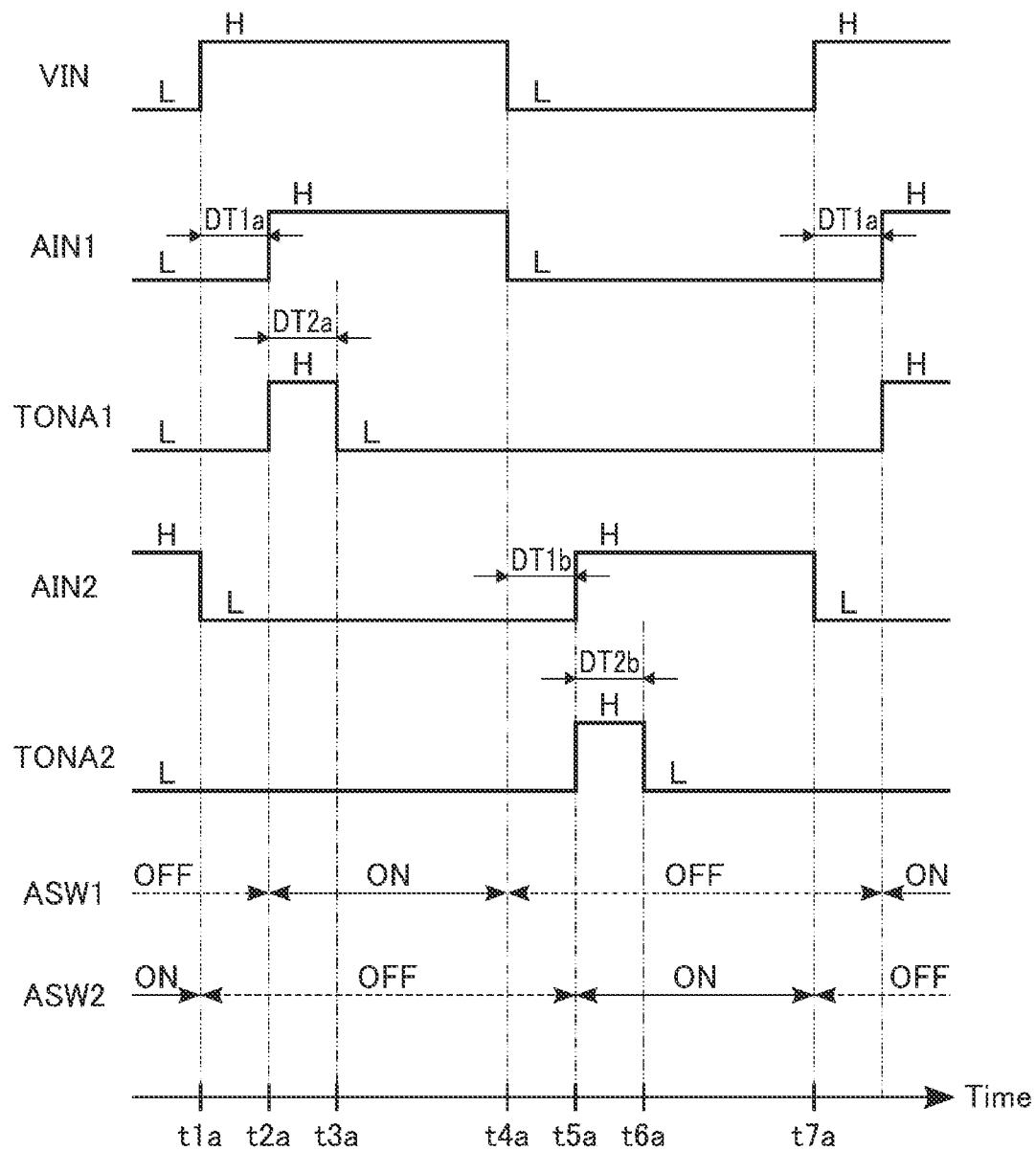
F I G. 27

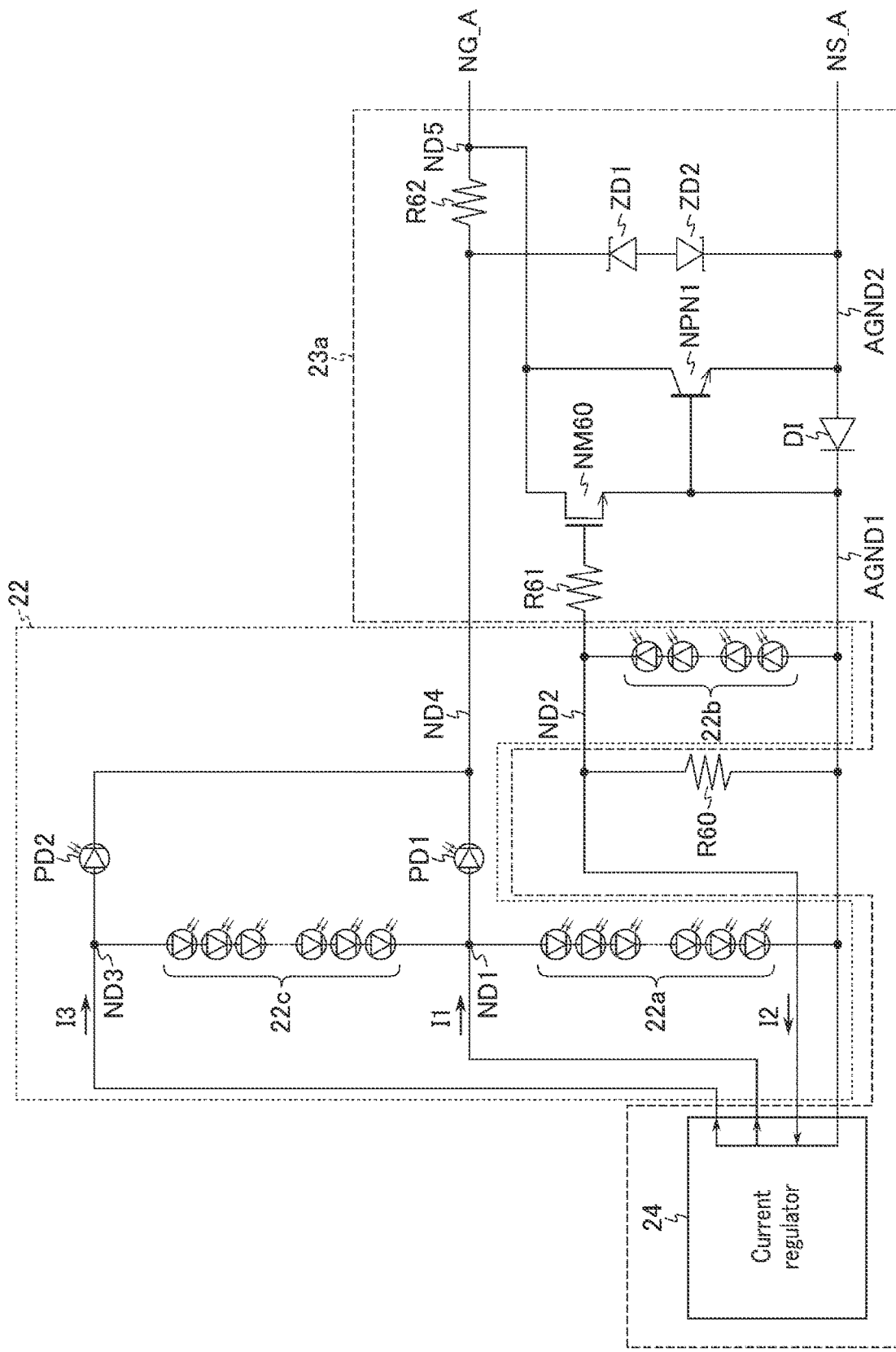
F I G. 28

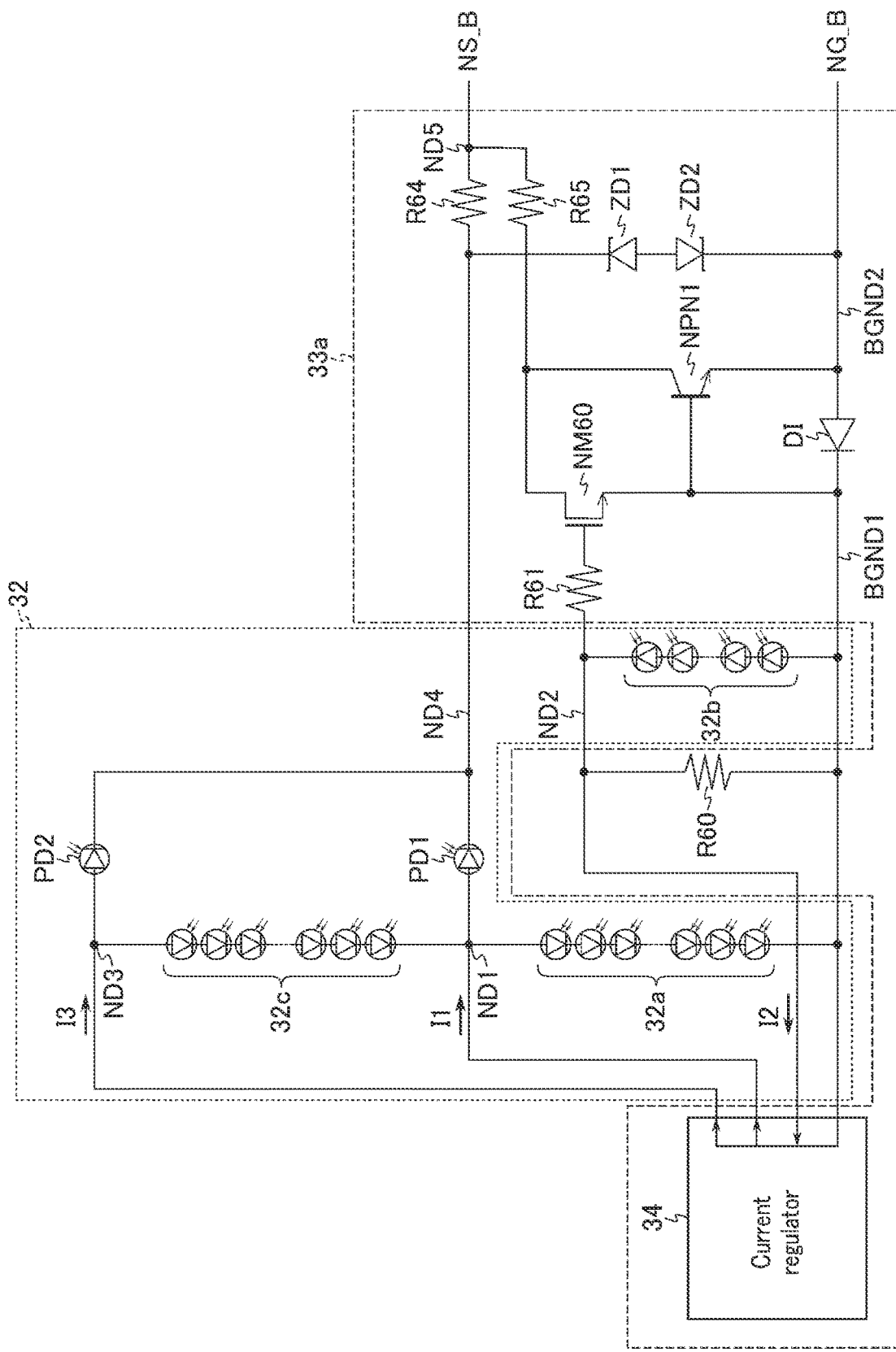
F I G. 29

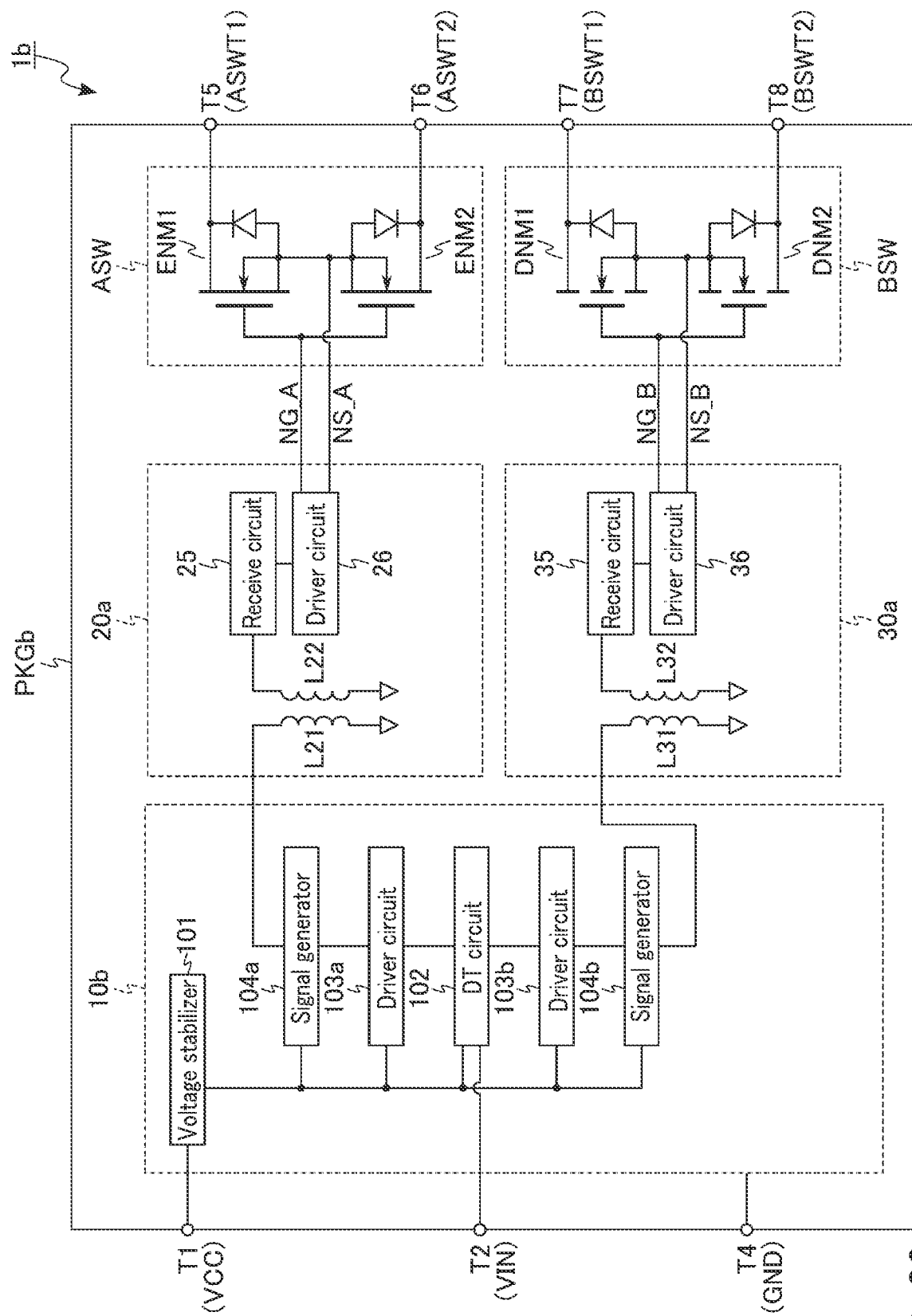
F I G. 30

SEMICONDUCTOR DEVICE

CROSS-REFERENCE TO RELATED APPLICATIONS

This application is based upon and claims the benefit of priority from Japanese Patent Application No. 2023-045736, filed Mar. 22, 2023, the entire contents of which are incorporated herein by reference.

FIELD

Embodiments described herein relate generally to a semiconductor device.

BACKGROUND

There is known a semiconductor device capable of turning on and off a switch element of a circuit on a secondary side (reception side) by controlling a circuit on a primary side (transmission side) in a state where the circuit on the primary side and the circuit on the secondary side are electrically insulated. Furthermore, as a type of such a semiconductor device, a photorelay including a circuit on the primary side with a light emitting element (for example, a light emitting diode (LED)) and a circuit on the secondary side with a light receiving element (for example, a photodiode) is known. For example, in the photorelay, a circuit on the secondary side includes a light receiving element and a metal oxide semiconductor field effect transistor (MOSFET) pair with source commonly connected (that is, source common MOSFET). In addition, a C-contact type photorelay using two sets of source common MOSFETs is known as a type of photo relay. The C-contact type photorelay is configured to turn on one of the two sets of source common MOSFETs and turn off the other. In this case, ON/OFF of the two sets of source common MOSFETs is controlled by controlling light emission/non-light emission of the light emitting element on the primary side. In such a photorelay, it is preferable that the two sets of source common MOSFETs are not simultaneously turned on.

BRIEF DESCRIPTION OF THE DRAWINGS

FIG. 4 is a block diagram illustrating an example of a configuration of an integrated circuit included in the semiconductor device according to the first embodiment.

FIG. 10 is a circuit diagram illustrating an example of a circuit configuration of a TONA generator in the integrated circuit included in the semiconductor device according to the first embodiment.

FIG. 12 is a circuit diagram illustrating an example of a circuit configuration of a TONB generator in the integrated circuit included in the semiconductor device according to the first embodiment.

FIG. 14 is a circuit diagram illustrating a first example of operation characteristics of the LED driver in the integrated circuit included in the semiconductor device according to the first embodiment.

FIG. 15 is a circuit diagram illustrating a second example of operation characteristics of the LED driver in the integrated circuit included in the semiconductor device according to the first embodiment.

FIG. 16 is a circuit diagram illustrating an example of a circuit configuration of a light receiving section and a VGS controller in an ASW control section included in the semiconductor device according to the first embodiment.

FIG. 17 is a circuit diagram illustrating an example of a circuit configuration of a light receiving section and a VGS controller in a BSW control section included in the semiconductor device according to the first embodiment.

FIG. 20 is a time chart illustrating an example of operation of the A-type switch and the B-type switch when the semiconductor device according to the first embodiment is powered on.

FIG. 21 is a time chart illustrating an example of a change in a gate-source voltage when the semiconductor device according to the first embodiment is powered on.

FIG. 24 is a block diagram illustrating an example of a configuration of a package of the semiconductor device according to the second embodiment.

FIG. 26 is a block diagram illustrating an example of an LED controller configuration in the integrated circuit included in the semiconductor device according to the second embodiment.

FIG. 27 is a time chart illustrating an example of operation of two of A-type switches when the semiconductor device according to the second embodiment is powered on.

FIG. 28 is a circuit diagram illustrating a modification of the circuit configuration of the light receiving section and the VGS controller included in the ASW control section.

FIG. 29 is a circuit diagram illustrating a modification of the circuit configuration of the light receiving section and the VGS controller included in the BSW control section.

FIG. 30 is a block diagram illustrating a modification of the configuration of the package of the semiconductor device.

DETAILED DESCRIPTION

Figures 1, 2:
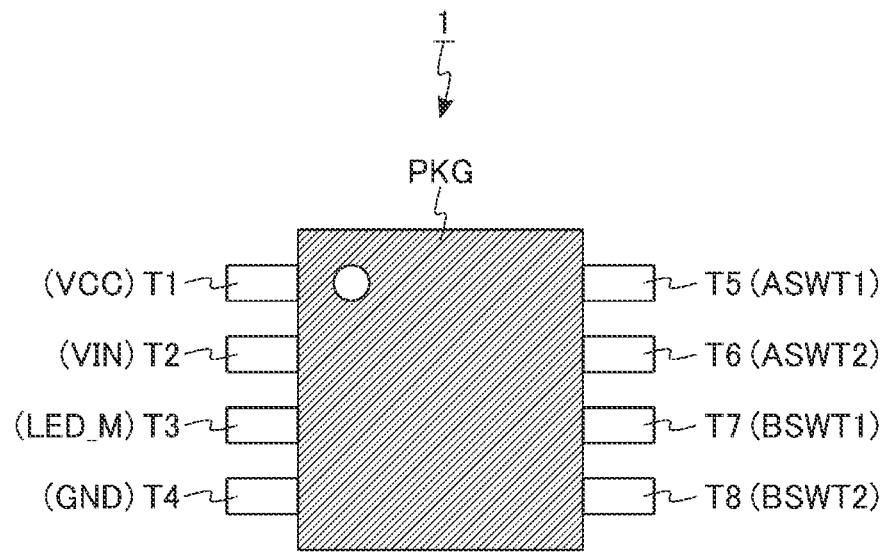
FIG. 1 is a plan view illustrating an example of an external appearance of a semiconductor device according to a first embodiment.
FIG. 2 is a table illustrating an example of input/output characteristics of the semiconductor device according to the first embodiment.

In general, according to one embodiment, a semiconductor device includes a first switch element, a second switch element, a first light emitting element, a second light emitting element, a first light receiving element, a second light receiving element, a first voltage control circuit, a second voltage control circuit, a first switch control circuit, and a second switch control circuit. The first switch element includes a first MOS transistor and a second MOS transistor each having one end connected to a first node and a gate end connected to a second node. The second switch element includes a third MOS transistor and a fourth MOS transistor each having one end connected to a third node and a gate end connected to a fourth node. The first light receiving element is configured to generate a current based on light generated by the first light emitting element. The second light receiving element is configured to generate a current based on light generated by the second light emitting element. The first voltage control circuit is configured to apply a voltage to the second node based on the current generated by the first light receiving element. The second voltage control circuit is configured to apply a voltage to the third node based on the current generated by the second light receiving element. The first switch control circuit is configured to cause the first light emitting element to emit light after a first time elapses after an input signal has transitioned from a first logic level to a second logic level. The second switch control circuit is configured to suspend light emission of the second light emitting element after a second time elapses after the input signal has transitioned from the second logic level to the first logic level. Each of the first MOS transistor and the second MOS transistor is an enhancement type N-channel MOSFET. Each of the third MOS transistor and the fourth MOS transistor is a depletion type N-channel MOSFET.

Hereinbelow, each embodiment is described with reference to the drawings. Each embodiment exemplifies a device and a method for embodying the technical idea of the invention. The drawings are schematic or conceptual. Dimensions, ratios, and the like of the drawings are not necessarily the same as actual ones. In the following description, components having substantially the same function and configuration are denoted by the same reference numerals.

In the present specification, descriptions will be given for a case where a logic level "L (Low)" indicates that an input signal is a non-signal and a logic level "H (High)" indicates that an input signal is a signal. The "H" level corresponds to a reverse logic level of the "L" level. The association between the presence or absence of the input signal and the logic level may be changed according to the circuit configuration.

In the present specification, examples of the switch element included in the semiconductor device used as the photorelay include an enhancement type N-channel MOSFET and a depletion type N-channel MOSFET. Hereinafter, the N-channel MOSFET is referred to as a "NMOS transistor". The P-channel MOSFET is referred to as a "PMOS transistor". An NPN bipolar transistor is referred to as a "NPN transistor". A switch element using an enhancement type NMOS transistor is referred to as an "A-type switch ASW". A switch element using a depletion type NMOS transistor is referred to as a "B-type switch BSW".

<1> First Embodiment

A semiconductor device 1 according to the first embodiment is a photo relay including an A-type switch ASW and a B-type switch BSW, and configured to electrically switch ON/OFF of the A-type switch ASW and the B-type switch BSW according to an input signal. The semiconductor device 1 suppresses the occurrence of simultaneous turn-on of the A-type switch ASW and the B-type switch BSW by adjusting the on-off timing of each of the A-type switch ASW and the B-type switch BSW. Hereinafter, details of the semiconductor device 1 according to the first embodiment will be described.

<1-1> Configuration

First, a configuration of the semiconductor device 1 according to the first embodiment will be described.

<1-1-1> External Appearance of Semiconductor Device 1

FIG. 1 is a plan view illustrating an example of an external appearance of the semiconductor device 1 according to the first embodiment. As illustrated in FIG. 1, the semiconductor device 1 is sealed in a package PKG in which terminals T1 to T8 are exposed, for example. The package PKG includes a light emitting element, a light receiving element, and the like for the semiconductor device 1 to function as a photorelay.

The terminals T1 to T4 are terminals on the input side of the semiconductor device 1. Specifically, the terminal T1 is a power supply terminal of the semiconductor device 1. For example, a power supply voltage VCC is applied to the terminal T1. The terminal T2 is an input terminal of the semiconductor device 1. For example, an input signal VIN is input to the terminal T2. The input signal VIN is a control signal used for a switching instruction of two switch elements included in the photorelay. The terminal T3 is, for example, a terminal used for an operation test of an LED included in the semiconductor device 1. The terminal T4 is a ground terminal of the semiconductor device 1. For example, a ground voltage GND is applied to the terminal T4. In a case where the operation test of the LED is not performed, the terminal T3 may be a non-contact terminal. In this case, the function related to the operation test of the LED is omitted from the integrated circuit in the semiconductor device 1, and the chip size can be designed to be small. As described above, an inexpensive product group may be configured as the semiconductor device 1.

The terminals T5 and T6 are terminals on the output side of the semiconductor device 1. Specifically, the terminal T5 corresponds to one end (ASWT1) of the A-type switch ASW included in the semiconductor device 1. The terminal T6 corresponds to other end (ASWT2) of the A-type switch ASW included in the semiconductor device 1. The semiconductor device 1 can form or cut off a current path between the terminals T5 and T6 based on the input signal VIN. The state in which the current path between the terminals T5 and T6 is formed in the semiconductor device 1 corresponds to the ON state of the A-type switch ASW. The state in which the current path between the terminals T5 and T6 is cut off in the semiconductor device 1 corresponds to the OFF state of the A-type switch ASW.

The terminals T7 and T8 are terminals on the output side of the semiconductor device 1. Specifically, the terminal T7 corresponds to one end (BSWT1) of the B-type switch BSW included in the semiconductor device 1. The terminal T8 corresponds to other end (BSWT2) of the B-type switch BSW included in the semiconductor device 1. The semiconductor device 1 can form or cut off a current path between the terminals T7 and T8 based on the input signal VIN. The state in which the current path between the terminals T7 and T8 is formed in the semiconductor device 1 corresponds to the ON state of the B-type switch BSW. The state in which the current path between the terminals T7 and T8 is cut off in the semiconductor device 1 corresponds to the OFF state of the B-type switch BSW.

<1-1-2> Input/output Characteristics of Semiconductor Device 1

FIG. 2 is a table illustrating an example of input/output characteristics of the semiconductor device 1 according to the first embodiment. FIG. 2 illustrates a correspondence relationship between the states of the power supply voltage VCC, the ground voltage GND, and the input signal VIN corresponding to the input side and the states of the A-type switch ASW and the B-type switch BSW corresponding to the output side. As illustrated in FIG. 2, the semiconductor device 1 can operate in one of three states. Additionally, the ground voltage GND is at the "L" level in any of the three states.

In a case where the power supply voltage VCC is at the "L" level or the power supply is not connected to the terminal T1, the semiconductor device 1 enters a state not to accept control by the input signal VIN ("–" in FIG. 2). In this case, the A-type switch ASW enters the OFF state, and the B-type switch BSW enters the ON state.

In a case where the power supply voltage VCC is at the "H" level, the semiconductor device 1 is in a state to receive control by the input signal VIN. That is, in a case where the power supply voltage VCC is at the "H" level, the semiconductor device 1 complementarily controls ON/OFF of the A-type switch ASW and the B-type switch BSW based on the input signal VIN.

Specifically, in a case where the power supply voltage VCC is at the "H" level and the input signal VIN is at the "H" level, the semiconductor device 1 controls the A-type switch ASW and the B-type switch BSW, such that the A-type switch ASW enters the ON state and the B-type switch BSW enters the OFF state. In a case where the power supply voltage VCC is at the "H" level and the input signal VIN is at the "L" level, the semiconductor device 1 controls the A-type switch ASW and the B-type switch BSW, such that the A-type switch ASW enters the OFF state and the B-type switch BSW enters the ON state.

<1-1-3> Configuration of Package PKG

Figure 3:
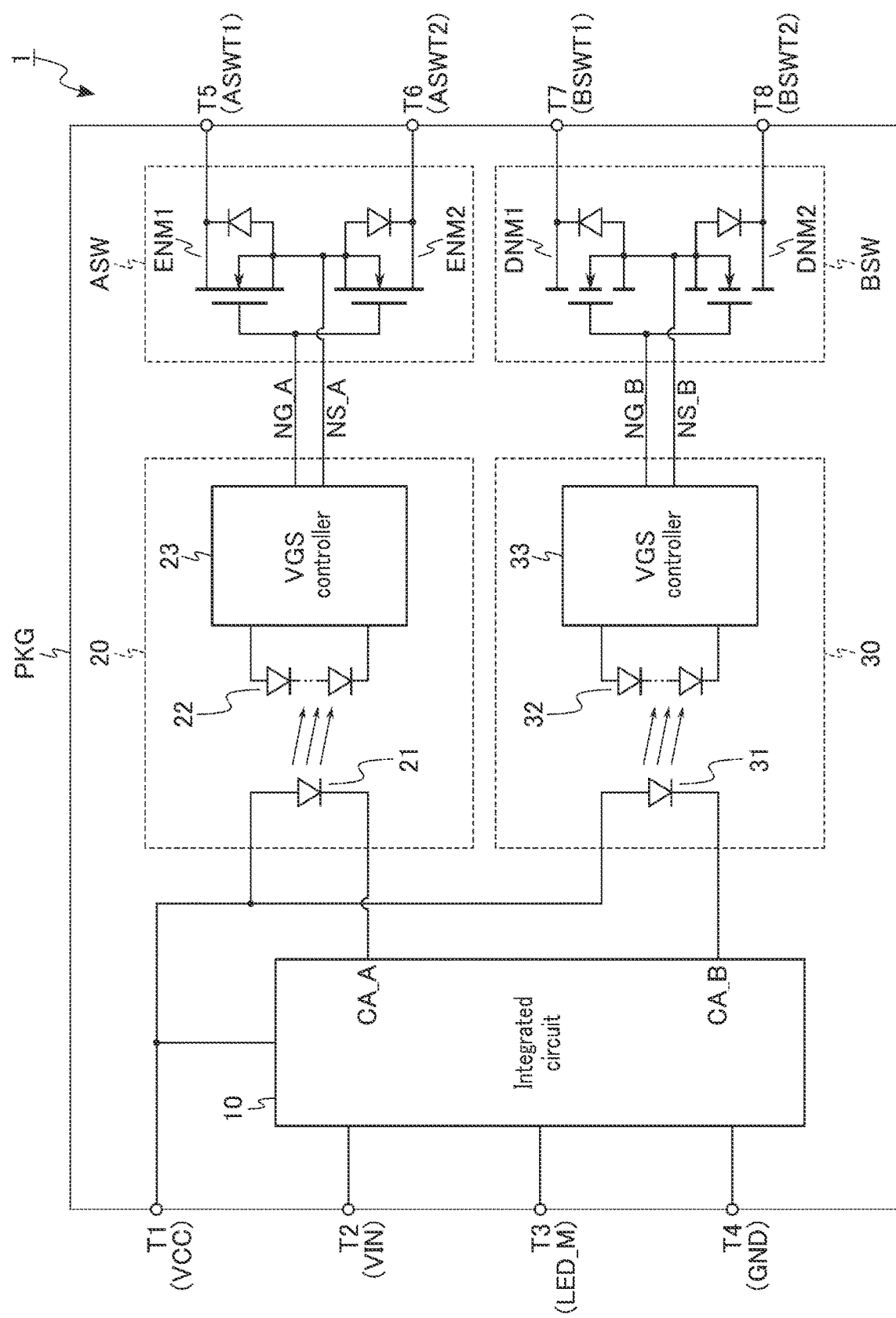
FIG. 3 is a block diagram illustrating an example of a configuration of a package of the semiconductor device according to the first embodiment.

FIG. 3 is a block diagram illustrating a configuration of the package PKG of the semiconductor device 1 according to the first embodiment. As illustrated in FIG. 3, the package PKG includes, for example, an A-type switch ASW, a B-type switch BSW, an integrated circuit 10, an ASW control section 20, and a BSW control section 30.

The A-type switch ASW includes NMOS transistors ENM1 and ENM2. Each of the NMOS transistors ENM1 and ENM2 is an enhancement type NMOS transistor. The gate ends of the NMOS transistors ENM1 and ENM2 are connected to node NG_A. A drain end of the NMOS transistor ENM1 is connected to the terminal T5. A drain end of the NMOS transistor ENM2 is connected to the terminal T6. The source ends of the NMOS transistors ENM1 and ENM2 are connected to node NS_A. FIG. 3 illustrates parasitic diodes formed between the source end and the drain end of each of the NMOS transistors ENM1 and ENM2. The state in which each of the NMOS transistors ENM1 and ENM2 enters the ON state corresponds to the ON state of the A-type switch ASW. The state in which each of the NMOS transistors ENM1 and ENM2 enters the OFF state corresponds to the OFF state of the A-type switch ASW.

The B-type switch BSW includes NMOS transistors DNM1 and DNM2. Each of the NMOS transistors DNM1 and DNM2 is a depletion type NMOS transistor. The gate ends of the NMOS transistors DNM1 and DNM2 are connected to node NG_B. A drain end of the NMOS transistor DNM1 is connected to the terminal T7. A drain end of the NMOS transistor DNM2 is connected to the terminal T8. The source ends of the NMOS transistors DNM1 and DNM2 are connected to node NS_B. FIG. 3 illustrates parasitic diodes formed between the source end and the drain end of each of the NMOS transistors DNM1 and DNM2. The state in which each of the NMOS transistors DNM1 and DNM2 enters the ON state corresponds to the ON state of the B-type switch BSW. The state in which each of the NMOS transistors DNM1 and DNM2 enters the OFF state corresponds to the OFF state of the B-type switch BSW.

The integrated circuit 10 is a circuit disposed on the input side of the semiconductor device 1, and controls each of the ASW control section 20 and the BSW control section 30. The integrated circuit 10 is connected to each of the terminals T1 to T4. The integrated circuit 10 includes nodes CA_A and CA_B. The integrated circuit 10 is configured to control the voltage of each of the nodes CA_A and CA_B based on the power supply voltage VCC supplied to the terminal T1 and the input signal VIN supplied to the terminal T2. Furthermore, the integrated circuit 10 is configured to supply, to the terminal T3, for example, a current based on the current flowing through the nodes CA_A and/or CA_B.

The ASW control section 20 controls ON/OFF of the A-type switch ASW based on the control of the integrated circuit 10. The ASW control section 20 includes a light-emitting diode (LED) 21, a light receiving section 22, and a VGS controller 23. The LED 21 is a light emitting element controlled to emit light or not to emit light by the integrated circuit 10. The anode of the LED 21 is connected to the terminal T1. The cathode of the LED 21 is connected to the node CA_A of the integrated circuit 10. The light receiving section 22 includes a light receiving element that generates a current by light irradiation. In a case where the LED 21 is in a light emitting state, the light receiving section 22 receives light emitted from the LED 21 and enters ON state. The light receiving section 22 in the ON state supplies a current to the VGS controller 23. The VGS controller 23 operates based on the current generated by the light receiving section 22 and controls the voltages at the nodes NG_A and NS_A. The ASW control section 20 is configured to be able to apply a positive voltage to the gate ends of the NMOS transistors ENM1 and ENM2. As a result, the ASW control section 20 can generate a positive potential difference between the gate and the source of the NMOS transistors ENM1 and ENM2.

The BSW control section 30 controls ON/OFF of the B-type switch BSW based on the control of the integrated circuit 10. The BSW control section 30 includes a Light-Emitting Diode (LED) 31, a light receiving section 32, and a VGS controller 33. The LED 31 is a light emitting element controlled to emit light or not to emit light by the integrated circuit 10. The anode of the LED 31 is connected to the terminal T1. The cathode of the LED 31 is connected to the node CA_B of the integrated circuit 10. The light receiving section 32 includes a light receiving element that generates a current by light irradiation. In a case where the LED 31 is in the light emitting state, the light receiving section 32 receives light emitted from the LED 31 and enters ON state. The light receiving section 32 in the ON state supplies a current to the VGS controller 33. The VGS controller 33 operates based on the current generated by the light receiving section 32 and controls the voltages at the nodes NG_B and NS_B. The BSW control section 30 is configured to be able to apply a positive voltage to the source ends of the NMOS transistors DNM1 and DNM2. As a result, the ASW control section 20 can generate a negative potential difference between the gate and the source of the NMOS transistors DNM1 and DNM2.

<1-1-4> Configuration of Integrated Circuit 10

FIG. 4 is a block diagram illustrating an example of a configuration of the integrated circuit 10 included in the semiconductor device 1 according to the first embodiment. As illustrated in FIG. 4, the integrated circuit 10 includes, for example, a starting circuit 11, a power supply circuit 12, a reset circuit 13, an enable controller 14, an oscillator 15, an input circuit 16, an LED test circuit 17, and an LED controller 18. Each of the starting circuit 11, the power supply circuit 12, the reset circuit 13, the enable controller 14, the oscillator 15, the input circuit 16, the LED test circuit 17, and the LED controller 18 is connected to the terminal T4. Hereinafter, the node connected to the terminal T4 is referred to as a ground node (GND).

The starting circuit 11 generates power supply voltages VCC1 and 3VLDO based on the power supply voltage VCC supplied to the terminal T1. The starting circuit 11 supplies the generated power supply voltage 3VLDO to the reset circuit 13. The reset circuit 13 operates based on the power supply voltage 3VLDO supplied by the starting circuit 11. The 3VLDO is a high-side voltage source of a logic circuit, and is generated by, for example, a low drop 3V series power supply. The voltage value of 3VLDO can be appropriately changed according to the circuit configuration of the integrated circuit 10. In addition, the starting circuit 11 supplies the generated power supply voltage VCC1 to each of the power supply circuit 12, the enable controller 14, the oscillator 15, the input circuit 16, the LED test circuit 17, and the LED controller 18. Each of the power supply circuit 12, the enable controller 14, the oscillator 15, the input circuit 16, the LED test circuit 17, and the LED controller 18 operates based on the power supply voltage VCC1 supplied by the starting circuit 11. Hereinafter, a node used for supplying the power supply voltage VCC1 is referred to as a power supply node. Note that the starting circuit 11 may be configured to generate a plurality of types of power supply voltages. The starting circuit 11 may be configured to supply at least one type of power supply voltage corresponding to the circuit configuration to each of the power supply circuit 12, the reset circuit 13, the enable controller 14, the oscillator 15, the input circuit 16, the LED test circuit 17, and the LED controller 18.

The power supply circuit 12 generates currents IL1 and IL2, and supplies the generated currents IL1 and IL2 to the LED controller 18. The power supply circuit 12 has a built-in current source having temperature dependency, for example, in a case where the power supply voltage VCC1 is equal to or higher than a predetermined voltage.

The reset circuit 13 generates a reset signal RST and supplies the generated reset signal RST to the LED controller 18. The reset signal RST is a control signal used to initialize the logic circuit included in the LED controller 18. A detailed configuration of the reset circuit 13 will be described later.

The enable controller 14 generates enable signals AENB and BENB, and supplies the generated enable signals AENB and BENB to the LED controller 18. The enable signal AENB is a control signal for enabling control of conduction (ON/OFF) of the A-type switch ASW. In a case where the enable signal AENB is at the "H" level, the conduction control of the A-type switch ASW is enabled. The enable signal BENB is a control signal for enabling control of conduction (ON/OFF) of the B-type switch BSW. In a case where the enable signal BENB is at the "H" level, the conduction control of the B-type switch BSW is enabled. A detailed configuration of the enable controller 14 will be described later.

The oscillator 15 generates a clock signal CLK and supplies the generated clock signal CLK to the LED controller 18. The clock signal CLK is a periodic electrical signal. The clock frequency of the clock signal CLK is, for example, 1 MHz.

The input circuit 16 receives the input signal VIN input to the terminal T2. Then, the input circuit 16 supplies the received input signal VIN to the LED controller 18 as an input signal VIN1. The input circuit 16 includes, for example, a level shifter.

The LED test circuit 17 has a function of supplying the terminal T3 with a current based on the current flowing through the nodes CA_A and/or CA_B. That is, the LED test circuit 17 may supply the terminal T3 with the current flowing through the LED 21 and/or the LED 31. The current flowing through the LED 21 and/or the LED 31 may be monitored by a device connected to the terminal T3.

The LED controller 18 operates based on the currents IL1 and IL2, the reset signal RST, the enable signals AENB and BENB, the clock signal CLK, and the input signal VIN1. The LED controller 18 includes an ASW controller ACNT and a BSW controller BCNT. The ASW controller ACNT controls the voltage of the node CA_A. That is, the ASW controller ACNT controls the current of the cathode of the LED 21. The BSW controller BCNT controls the current of the node CA_B. That is, the BSW controller BCNT controls the current of the cathode of the LED 31. A detailed configuration of the LED controller 18 will be described later.

<1-1-4-1> Configuration of Reset Circuit 13

Figure 5:
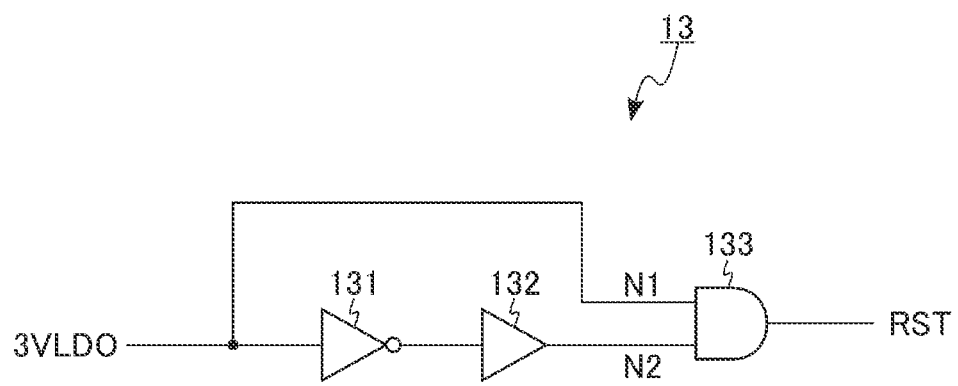
FIG. 5 is a circuit diagram illustrating an example of a configuration of a reset circuit in an integrated circuit included in the semiconductor device according to the first embodiment.

FIG. 5 is a circuit diagram illustrating an example of a configuration of the reset circuit 13 in the integrated circuit 10 included in the semiconductor device 1 according to the first embodiment. As illustrated in FIG. 5, the reset circuit 13 includes, for example, an inverter 131, a delay circuit 132, and a logical conjunction (AND) circuit 133. Although not illustrated, each of the inverter 131, the delay circuit 132, and the AND circuit 133 is connected to the power supply node and the ground node, and operates based on the power supply voltage 3VLDO.

The power supply voltage 3VLDO input to the reset circuit 13 of FIG. 4 is input to each of the input terminal of the inverter 131 and the first input terminal N1 of the AND circuit 133. An output terminal of the inverter 131 is connected to an input terminal of the delay circuit 132. An output terminal of the delay circuit 132 is connected to the second input terminal N2 of the AND circuit 133. The AND circuit 133 performs a logical AND operation of a signal input to the first input terminal N1 and a signal input to the second input terminal N2, and outputs an operation result as a reset signal RST.

Figure 6:
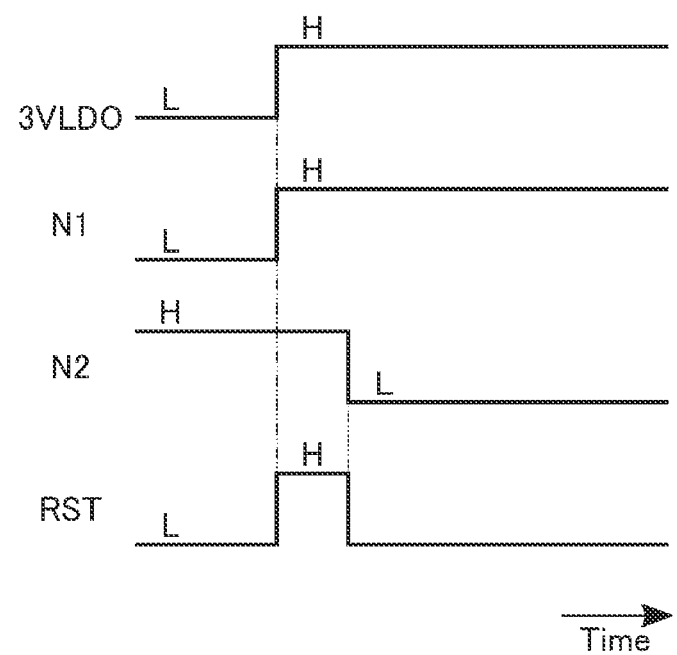
FIG. 6 is a time chart illustrating an example of operation characteristics of the reset circuit in the integrated circuit included in the semiconductor device according to the first embodiment.

Hereinafter, an example of operation characteristics of the reset circuit 13 will be described with reference to FIG. 6. FIG. 6 is a time chart illustrating an example of operation characteristics of the reset circuit 13 in the integrated circuit 10 included in the semiconductor device 1 according to the first embodiment. FIG. 6 illustrates changes in the respective voltages of the power supply voltage 3VLDO, the first input terminal N1 and the second input terminal N2 of the AND circuit 133, and the reset signal RST.

In a case where the power supply voltage 3VLDO maintains the "L" level, the voltage of the first input terminal N1 of the AND circuit 133 is at the "L" level. On the other hand, the voltage of the second input terminal N2 of the AND circuit 133 is at the "H" level, which is the logic level of the power supply voltage 3VLDO inverted by the inverter 131.

If the power supply voltage 3VLDO transitions from the "L" level to the "H" level, the voltage of the first input terminal N1 of the AND circuit 133 immediately transitions from the "L" level to the "H" level. At this time, the output signal of the inverter 131 also transitions from the "H" level to the "L" level. Then, the logic level of the output signal of the inverter 131 is delayed by the delay circuit 132 and then reflected in the voltage of the second input terminal N2 of the AND circuit 133. Therefore, in the AND circuit 133, the voltage of each of the nodes N1 and N2 is at the "H" level only for a period based on the delay time by the delay circuit 132 after the power supply voltage 3VLDO transitions from the "L" level to the "H" level, and the reset signal RST at the "H" level is output in this period. Thereafter, the AND circuit 133 outputs the reset signal RST at the "L" level based on the fact that the voltage of the first input terminal N1 has turned to the "H" level and the voltage of the second input terminal N2 has turned to the "L" level.

As described above, the reset circuit 13 is configured to output one pulse signal based on the transition of the power supply voltage 3VLDO from the "L" level to the "H" level. Note that the circuit configuration of the reset circuit 13 may be any other circuit configuration as long as the operation described above can be realized. For example, the above description has been given on the case where the power supply voltage 3VLDO is supplied from the starting circuit 11 to the reset circuit 13, but the power supply voltage VCC1 may be supplied from the starting circuit 11 to the reset circuit 13 instead of the power supply voltage 3VLDO.

<1-1-4-2> Configuration of Enable Controller 14

Figure 7:
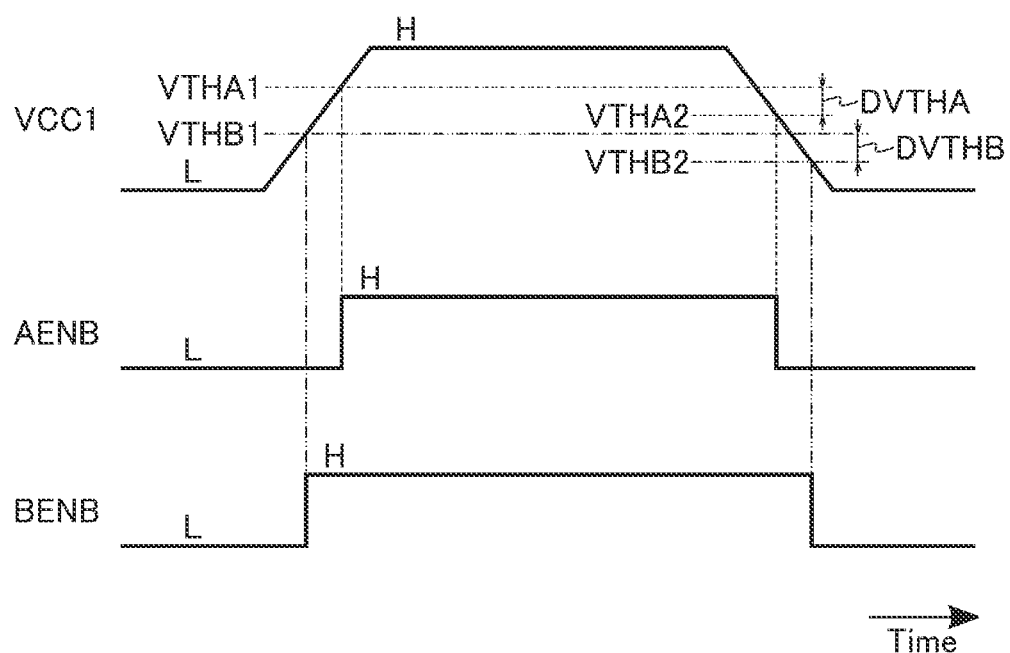
FIG. 7 is a time chart illustrating an example of operation characteristics of an enable controller in the integrated circuit included in the semiconductor device according to the first embodiment.

FIG. 7 is a time chart illustrating an example of operation characteristics of the enable controller 14 in the integrated circuit 10 included in the semiconductor device 1 according to the first embodiment. FIG. 7 illustrates changes in the power supply voltage VCC1 and the voltages of the enable signals AENB and BENB. As illustrated in FIG. 7, the enable controller 14 is configured such that the threshold of the enable signal AENB is different from the threshold of the enable signal BENB. Furthermore, the enable controller 14 is configured such that, for example, the thresholds of the enable signals AENB and BENB are different between a case where the power supply voltage VCC1 transitions from the "L" level to the "H" level and a case where the power supply voltage VCC1 transitions from the "H" level to the "L" level.

Specifically, the threshold value VTHA1 of the enable signal AENB in a case where the power supply voltage VCC1 transitions from the "L" level to the "H" level is higher than the threshold value VTHA2 of the enable signal AENB in a case where the power supply voltage VCC1 transitions from the "H" level to the "L" level. The threshold value VTHB1 of the enable signal BENB in a case where the power supply voltage VCC1 transitions from the "L" level to the "H" level is higher than the threshold value VTHB2 of the enable signal BENB in a case where the power supply voltage VCC1 transitions from the "H" level to the "L" level.

Further, the threshold value VTHA1 of the enable signal AENB is higher than the threshold value VTHB1 of the enable signal BENB. The threshold value VTHA2 of the enable signal AENB is higher than the threshold value VTHB2 of the enable signal BENB. In the enable controller 14, the difference DVTHA between the thresholds VTHA1 and VTHA2 of the enable signal AENB and the difference DVTHB between the thresholds VTHB1 and VTHB2 of the enable signal BENB can be changed as appropriate.

Accordingly, in the enable controller 14, in the process in which the power supply voltage VCC1 transitions from the "L" level to the "H" level, after the enable signal BENB transitions from the "L" level to the "H" level, the enable signal AENB transitions from the "L" level to the "H" level. In addition, in the enable controller 14, in the process in which the power supply voltage VCC1 transitions from the "H" level to the "L" level, after the enable signal AENB transitions from the "H" level to the "L" level, the enable signal BENB transitions from the "H" level to the "L" level.

As described above, the enable controller 14 is configured such that a period in which the enable signal AENB is at the "H" level is included in a period in which the enable signal BENB is at the "H" level. Note that the circuit configuration of the enable controller 14 may be any circuit configuration as long as the operation described above can be realized.

<1-1-4-3> Configuration of LED Controller 18

Figure 8:
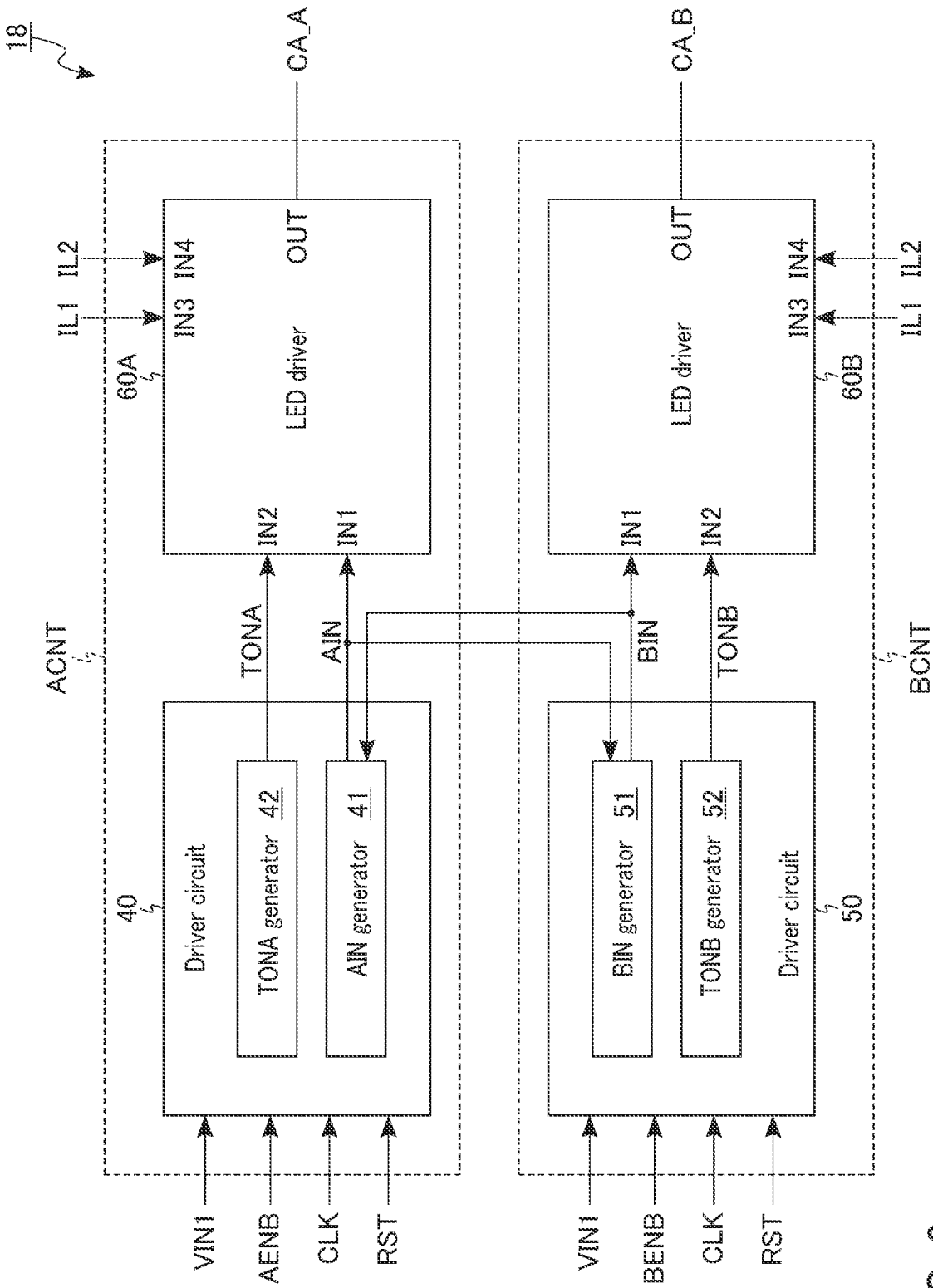
FIG. 8 is a block diagram illustrating an example of an LED controller configuration in the integrated circuit included in the semiconductor device according to the first embodiment.

FIG. 8 is a block diagram illustrating an example of the LED controller 18 configuration in the integrated circuit 10 included in the semiconductor device 1 according to the first embodiment. As illustrated in FIG. 8, the LED controller 18 includes, for example, driver circuits 40 and 50, and LED drivers 60A and 60B. A set of the driver circuit 40 and the LED driver 60A corresponds to the ASW controller ACNT. A set of the driver circuit 50 and the LED driver 60B corresponds to the BSW controller BCNT.

The driver circuit 40 controls the LED driver 60A based on the input signal VIN1, the enable signal AENB, the clock signal CLK, and the reset signal RST. The driver circuit 40 includes an AIN generator 41 and a TONA generator 42. The AIN generator 41 generates a control signal AIN. The control signal AIN is a signal that controls light emission of the LED 21 associated with the A-type switch ASW. The TONA generator 42 generates a control signal TONA. The control signal TONA is a signal used to accelerate the rise of the emission of the LED 21 associated with the A-type switch ASW.

The driver circuit 50 controls the LED driver 60B based on the input signal VIN1, the enable signal BENB, the clock signal CLK, and the reset signal RST. The driver circuit 50 includes a BIN generator 51 and a TONB generator 52. The BIN generator 51 generates a control signal BIN. The control signal BIN is a signal that controls light emission of the LED 31 associated with the B-type switch BSW. The TONB generator 52 generates a control signal TONB. The control signal TONB is a signal used to accelerate the rise of the emission of the LED 31 associated with the B-type switch BSW.

The LED driver 60A controls light emission and non-light emission of the LED 21 by controlling the voltage of the node CA_A. The LED driver 60A has nodes IN1 to IN4 and OUT. The control signal AIN is input to the node IN1 of the LED driver 60A. The control signal TONA is input to the node IN2 of the LED driver 60A. The current IL1 is input to the node IN3 of the LED driver 60A. The current IL2 is input to the node IN4 of the LED driver 60A. The node OUT of the LED driver 60A is connected to the node CA_A. The LED driver 60A amplifies the currents IL1 and/or IL2 based on the control signals AIN and TONA, for example. Then, the LED driver 60A can control the current at the node OUT by the amplified current IL1 and/or IL2.

The LED driver 60B controls light emission and non-light emission of the LED 31 by controlling the voltage of the node CA_B. The LED driver 60B has nodes IN1 to IN4 and OUT. The control signal BIN is input to the node IN1 of the LED driver 60B. The control signal TONB is input to the node IN2 of the LED driver 60B. The current IL1 is input to the node IN3 of the LED driver 60B. The current IL2 is input to the node IN4 of the LED driver 60B. The node OUT of the LED driver 60B is connected to the node CA_B of the LED 31. The LED driver 60B amplifies the currents IL1 and/or IL2 based on the control signals BIN and TONB, for example. Then, the LED driver 60B can control the current at the node OUT by the amplified current IL1 and/or IL2.

Hereinafter, detailed circuit configurations of the AIN generator 41, the TONA generator 42, the BIN generator 51, the TONB generator 52, and the LED drivers 60A and 60B included in the LED controller 18 will be sequentially described. The LED drivers 60A and 60B have a common circuit configuration except that an input control signal and a node CA to be connected are different. Therefore, hereinafter, a circuit configuration common between the LED drivers 60A and 60B will be described as a circuit configuration of the LED driver 60.

A counter CT described in the drawings referred to below is a synchronous counter. The counter CT includes, for example, a clock input terminal CK, a reset terminal R, and output terminals Q0 to Q13. The counter CT executes a counting operation of the clock signal input to the clock input terminal CK. Then, the counter CT outputs the count result from the output terminals Q0 to Q13. The count result is indicated in binary numbers by the output signals from the output terminals Q0 to Q13. For example, the counter CT is configured to set the output signal from the output terminal Qk to the "H" level if the clock signal is counted $2^k$ times (k is an integer of 0 to 13). In addition, the counter CT is configured to be reset based on an input of a signal at the "H" level to the reset terminal R. The reset counter CT outputs a signal at the "L" level from each of the output terminals Q0 to Q13. Note that the number of output terminals Q included in the counter CT may be any other number.

A flip-flop circuit FF described in the drawings referred to below is a D-type flip-flop circuit. The flip-flop circuit FF includes a data input terminal D, a clock input terminal CK, a reset terminal R, a non-inverting output terminal Q, and an inverting output terminal QN. The flip-flop circuit FF samples a signal input to the data input terminal D according to a signal input to the clock input terminal. Then, the flip-flop circuit FF outputs the sampling result from the non-inverting output terminal Q as a non-inverted output signal. In addition, the flip-flop circuit FF outputs an inverted output signal obtained by inverting the non-inverted output signal from the inverting output terminal QN. In addition, the flip-flop circuit FF is configured to be reset based on an input of a signal at the "H" level to the reset terminal R. The reset flip-flop circuit FF outputs a signal at the "L" level from the non-inverting output terminal Q.

(1: Circuit Configuration of AIN Generator 41)

Figure 9:
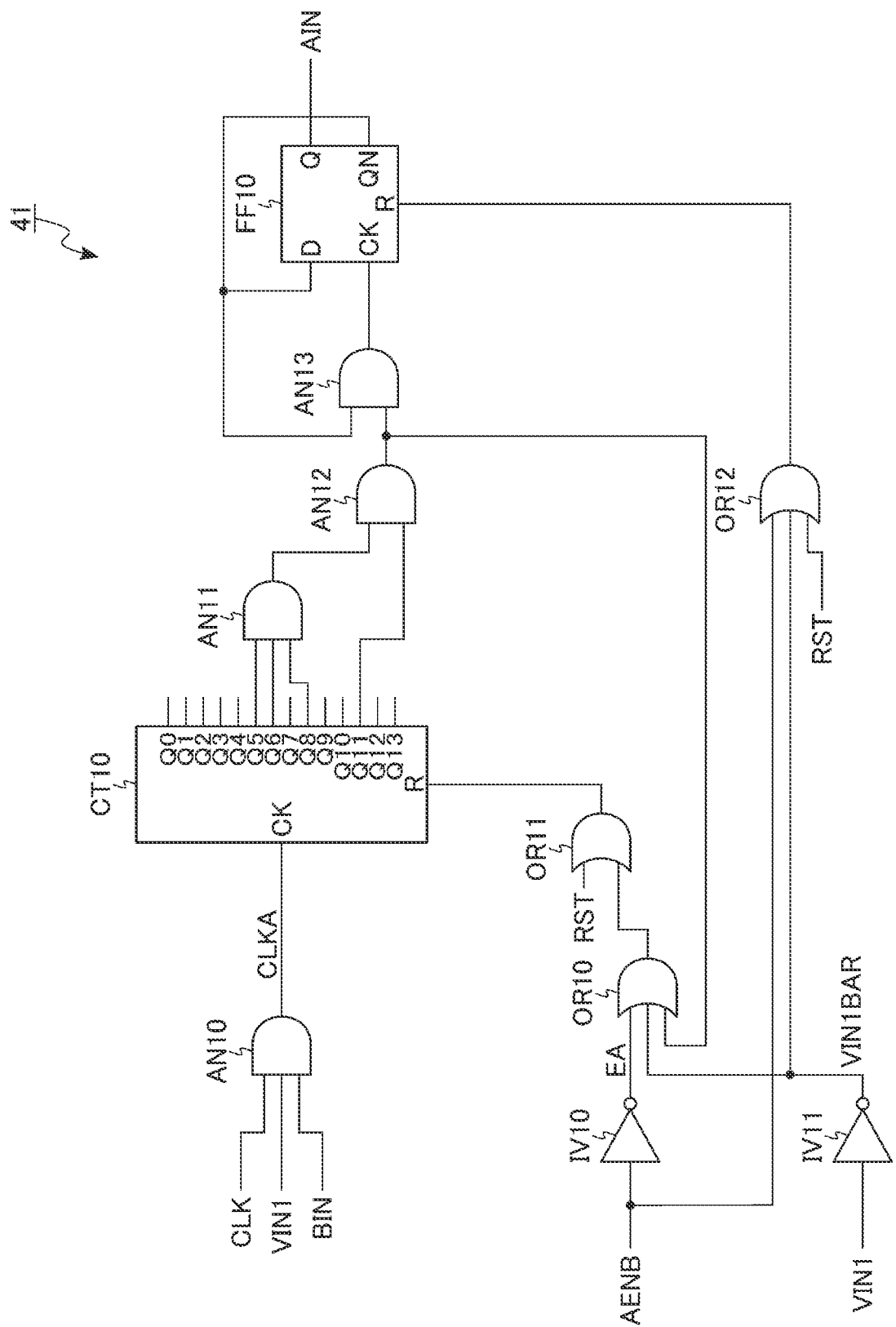
FIG. 9 is a circuit diagram illustrating an example of a circuit configuration of an AIN generator in the integrated circuit included in the semiconductor device according to the first embodiment.

FIG. 9 is a circuit diagram illustrating an example of a circuit configuration of the AIN generator 41 in the integrated circuit 10 included in the semiconductor device 1 according to the first embodiment. As illustrated in FIG. 9, the AIN generator 41 includes, for example, logical conjunction (AND) circuits AN10 to AN13, logical disjunction (OR) circuits OR10 to OR12, inverters IV10 and IV11, a counter CT10, and a flip-flop circuit FF10. Although not illustrated, each of the AND circuits AN10 to AN13, the OR circuits OR10 to OR12, the inverters IV10 and IV11, the counter CT10, and the flip-flop circuit FF10 is connected to the power node and the ground node, and operates based on the power supply voltage VCC1 applied to the power node.

The AND circuit AN10 performs an AND operation of the clock signal CLK, the input signal VIN1, and the control signal BIN, and outputs an operation result as the clock signal CLKA. The counter CT10 executes the counting operation of the clock signal CLKA input to the clock input terminal CK and outputs the count result from the output terminals Q0 to Q13. The AND circuit AN11 executes an AND operation of output signals of the output terminals Q5, 06, and Q8 of the counter CT10, and outputs an operation result. The AND circuit AN12 executes an AND operation of an output signal of the AND circuit AN11 and an output signal of the output terminal Q11 of the counter CT10, and outputs an operation result.

The AND circuit AN13 executes an AND operation of the output signal of the AND circuit AN12 and the inverted output signal of the flip-flop circuit FF10 and outputs an operation result. The output signal of the AND circuit AN13 is input to the clock input terminal CK of the flip-flop circuit FF10. A data input terminal D of the flip-flop circuit FF10 is connected to an inverting output terminal QN of the flip-flop circuit FF10. The non-inverted output signal output from the non-inverting output terminal Q of the flip-flop circuit FF10 corresponds to the control signal AIN. In a case the signal at the "H" level is input to the clock input terminal CK, the flip-flop circuit FF10 in the reset state outputs a non-inverted output signal at the "H" level from the non-inverting output terminal Q.

The inverter IV10 inverts the enable signal AENB and outputs the inverted enable signal as an enable signal EA. The inverter IV11 inverts the input signal VIN1 and outputs the inverted signal as an input signal VIN1BAR. The OR circuit OR10 performs a logical OR operation of the enable signal EA, the input signal VIN1BAR, and the output signal of the AND circuit AN12, and outputs an operation result.

The OR circuit OR11 performs an OR operation of the output signal of the OR circuit OR10 and the reset signal RST, and outputs an operation result. The output signal of the OR circuit OR11 is input to the reset terminal R of the counter CT10. The OR circuit OR12 performs an OR operation of the enable signal AENB, the input signal VIN1BAR, and the reset signal RST, and outputs an operation result. The output signal of the OR circuit OR12 is input to the reset terminal R of the flip-flop circuit FF10.

The AIN generator 41 described above is configured such that each of the counter CT10 and the flip-flop circuit FF10 is reset if the reset signal RST becomes the "H" level. In addition, if the input signal VIN1 transitions from the "L" level to the "H" level in a state where the enable signal AENB is at the "H" level, the AIN generator 41 causes the control signal AIN to transition from the "L" level to the "H" level after the dead time (hereinafter referred to as "dead time DT1") by a set of the counter CT10 and the AND circuits AN11 and AN12 elapses. Then, if the input signal VIN1 transitions from the "H" level to the "L" level in a state where the enable signal AENB is at the "H" level, the output signal of the OR circuit OR12 becomes the "H" level, and the flip-flop circuit FF10 is reset. That is, if the input signal VIN1 transitions from the "H" level to the "L" level, the AIN generator 41 immediately causes the control signal AIN to transition from the "H" level to the "L" level.

Note that the circuit configuration of the AIN generator 41 may be any other circuit configuration as long as the operation described above can be realized. The dead time DT1 can be easily changed by changing the connection between the AND circuits AN11 and AN12 and the counter CT10. If the dead time DT1 can be formed, the set of the counter CT10 and the AND circuits AN11 and AN12 may not be used. The counter CT10 may be configured by an analog circuit. For example, the counter CT10 may be a delay circuit including a minute current source, an inverse Widlar circuit, a capacitance, and the like.

(2: Circuit Configuration of TONA Generator 42)

FIG. 10 is a circuit diagram illustrating an example of a circuit configuration of the TONA generator 42 in the integrated circuit 10 included in the semiconductor device 1 according to the first embodiment. As illustrated in FIG. 10, the TONA generator 42 includes, for example, logical conjunction (AND) circuits AN20 to AN24, logical disjunction (OR) circuits OR20 to OR23, an inverter IV20, a delay circuit DC20, a counter CT20, and a flip-flop circuit FF20. Although not illustrated, each of the AND circuits AN20 to AN24, the OR circuits OR20 to OR23, the inverter IV20, the delay circuit DC20, the counter CT20, and the flip-flop circuit FF20 is connected to the power node and the ground node, and operates based on the power supply voltage VCC1 applied to the power node.

The inverter IV20 inverts and outputs the control signal AIN. The delay circuit DC20 delays and outputs the output signal of the inverter IV20. The AND circuit AN20 executes an AND operation of the control signal AIN and the output signal of the delay circuit DC20, and outputs an operation result. A set of the inverter IV20, the delay circuit DC20, and the AND circuit AN20 outputs one pulse signal based on the fact that the control signal AIN becomes the "H" level.

The AND circuit AN21 executes an AND operation of the output signal of the AND circuit AN20 and the inverted output signal of the flip-flop circuit FF20, and outputs an operation result. The output signal of the AND circuit AN21 is input to the clock input terminal CK of the flip-flop circuit FF20. A data input terminal D of the flip-flop circuit FF20 is connected to an inverting output terminal QN of the flip-flop circuit FF20. The non-inverted output signal output from the non-inverting output terminal Q of the flip-flop circuit FF20 corresponds to the control signal TONA. In a case where a pulse signal is input to the clock input terminal CK, the flip-flop circuit FF20 in the reset state outputs a non-inverted output signal at the "H" level from the non-inverting output terminal Q.

The AND circuit AN22 executes an AND operation of the control signal AIN and the clock signal CLKA, and outputs an operation result as a clock signal CLKA1. The counter CT20 executes the counting operation of the clock signal CLKA1 input to the clock input terminal CK and outputs the count result from the output terminals Q0 to Q13. The AND circuit AN23 executes an AND operation of output signals of the output terminals Q2, 05, and Q7 of the counter CT20, and outputs an operation result. The AND circuit AN24 executes an AND operation of an output signal of the AND circuit AN23 and each output signal of the output terminals Q9 and Q10 of the counter CT20, and outputs an operation result.

The OR circuit OR20 performs an OR operation of the enable signal EA, the input signal VIN1BAR, and the output signal of the AND circuit AN24, and outputs an operation result. The OR circuit OR21 performs an OR operation of the output signal of the OR circuit OR20 and the reset signal RST, and outputs an operation result. The output signal of the OR circuit OR21 is input to the reset terminal R of the counter CT20. The OR circuit OR22 performs an OR operation of the enable signal EA, the input signal VIN1BAR, and the output signal of the AND circuit AN24, and outputs an operation result. The OR circuit OR23 performs an OR operation of the output signal of the OR circuit OR22 and the reset signal RST, and outputs an operation result. The output signal of the OR circuit OR23 is input to the reset terminal R of the flip-flop circuit FF20.

The TONA generator 42 described above is configured such that each of the counter CT20 and the flip-flop circuit FF20 is reset in a case where the reset signal RST becomes the "H" level. In addition, if the control signal AIN transitions from the "L" level to the "H" level in a state in which the enable signal EA is at the "L" level, that is, in a state in which the enable signal AENB is at the "H" level, the TONA generator 42 immediately causes the control signal TONA to transition from the "L" level to the "H" level. Then, in a case where the dead time (hereinafter referred to as "dead time DT2") by a set of the counter CT20 and the AND circuits AN23 and AN24 elapses after the control signal AIN transitions to the "H" level, the output signal of the OR circuit OR23 becomes the "H" level, and the flip-flop circuit FF20 is reset. In other words, based on the transition of the control signal AIN from the "L" level to the "H" level, the TONA generator 42 outputs the control signal TONA at the "H" level only during the dead time DT2.

Note that the circuit configuration of the TONA generator 42 may be any other circuit configuration as long as the operation described above can be realized. The dead time DT2 can be easily changed by changing the connection between the AND circuits AN23 and AN24 and the counter CT20. If the dead time DT2 can be formed, the set of the counter CT20 and the AND circuits AN23 and AN24 may not be used. The counter CT20 may be configured by an analog circuit. For example, the counter CT20 may be a one-shot pulse generator including a minute current source, an inverse Widlar circuit, a capacitance, a comparator, and the like.

(3: Circuit Configuration of BIN Generator 51)

Figure 11:
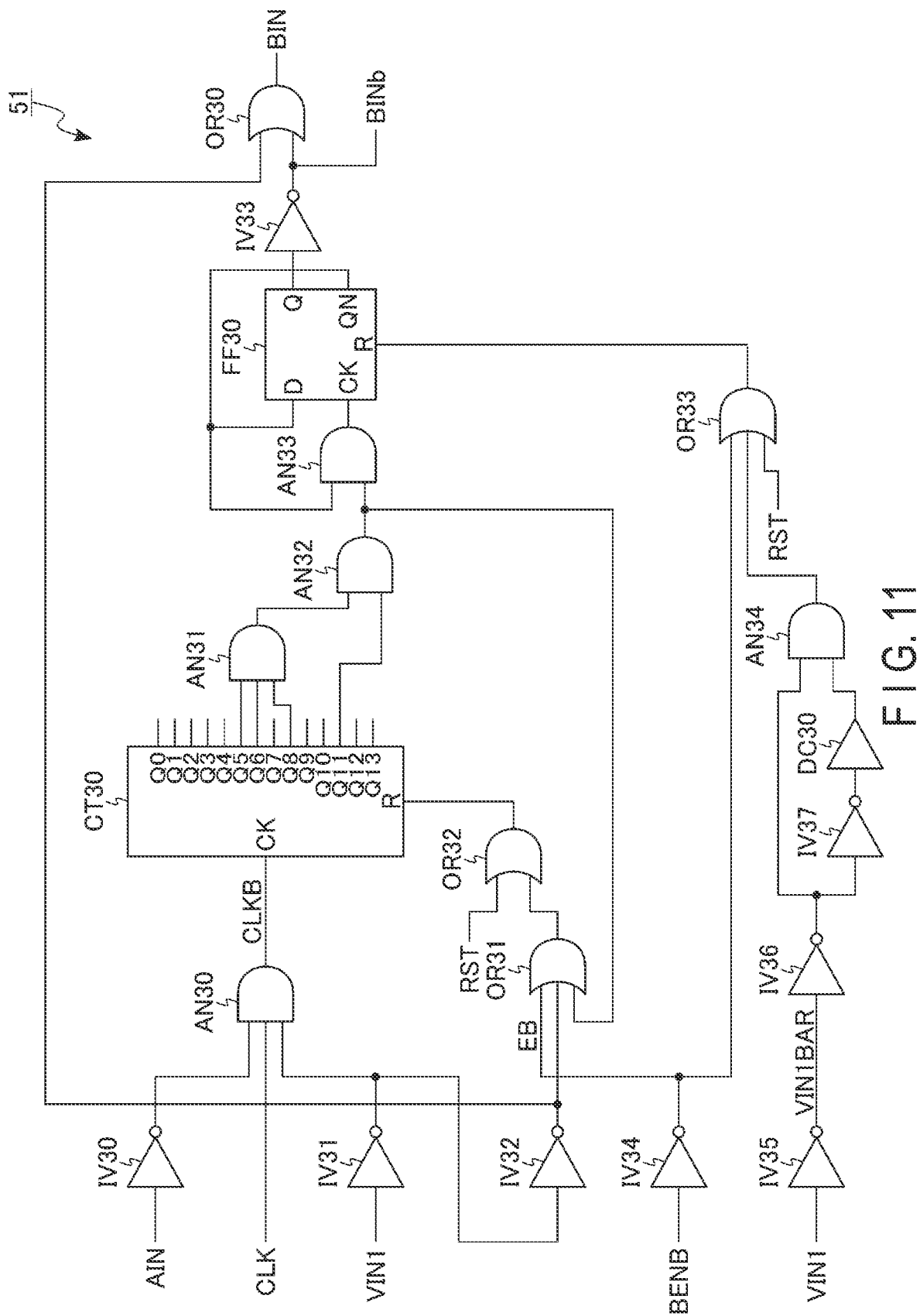
FIG. 11 is a circuit diagram illustrating an example of a circuit configuration of a BIN generator in the integrated circuit included in the semiconductor device according to the first embodiment.

FIG. 11 is a circuit diagram illustrating an example of a circuit configuration of the BIN generator 51 in the integrated circuit 10 included in the semiconductor device 1 according to the first embodiment. As illustrated in FIG. 11, the BIN generator 51 includes, for example, logical conjunction (AND) circuits AN30 to AN34, logical disjunction (OR) circuits OR30 to OR33, an inverters IV30 to IV37, a delay circuit DC30, a counter CT30, and a flip-flop circuit FF30. Although not illustrated, each of the AND circuits AN30 to AN34, the OR circuits OR30 to OR33, the inverters IV30 to IV37, the delay circuit DC30, the counter CT30, and the flip-flop circuit FF30 is connected to the power node and the ground node, and operates based on the power supply voltage VCC1 applied to the power node.

The inverter IV30 inverts and outputs the control signal AIN. The inverter IV31 inverts and outputs the input signal VIN1. The inverter IV32 inverts and outputs the output signal of the inverter IV31. The AND circuit AN30 executes an AND operation of the clock signal CLK, the output signal of the inverter IV30, and the output signal of the inverter IV31, and outputs an operation result as a clock signal CLKB. The counter CT30 executes the counting operation of the clock signal CLKB input to the clock input terminal CK and outputs the count result from the output terminals Q0 to Q13. The AND circuit AN31 executes an AND operation of output signals of the output terminals Q5, 06, and 08 of the counter CT30 and outputs an operation result. The AND circuit AN32 executes an AND operation of an output signal of the AND circuit AN31 and an output signal of the output terminal Q11 of the counter CT30, and outputs an operation result.

The AND circuit AN33 executes an AND operation of the output signal of the AND circuit AN32 and the inverted output signal of the flip-flop circuit FF30, and outputs an operation result. The output signal of the AND circuit AN33 is input to the clock input terminal CK of the flip-flop circuit FF30. A data input terminal D of the flip-flop circuit FF30 is connected to an inverting output terminal QN of the flip-flop circuit FF30. The non-inverted output signal output from the non-inverting output terminal Q of the flip-flop circuit FF 30 is output to the inverter IV33. In a case the signal at the "H" level is input to the clock input terminal CK, the flip-flop circuit FF30 in the reset state outputs a non-inverted output signal at the "H" level. The inverter IV33 inverts the non-inverted output signal of the flip-flop circuit FF30 and outputs the inverted signal as a control signal BINb. The OR circuit OR30 performs an OR operation of the control signal BINb and the output signal of the inverter IV32, and outputs an operation result as the control signal BIN.

The inverter IV34 inverts the enable signal BENB and outputs the inverted enable signal as an enable signal EB. The OR circuit OR31 performs an OR operation of the enable signal EB, the output signal of the inverter IV32, and the output signal of the AND circuit AN32, and outputs an operation result. The OR circuit OR32 performs an OR operation of the output signal of the OR circuit OR31 and the reset signal RST, and outputs an operation result. The output signal of the OR circuit OR32 is input to the reset terminal R of the counter CT30.

The inverter IV35 inverts the input signal VIN1 and outputs the inverted signal as an input signal VIN1BAR. The level of the input signal VIN1 input to the inverter IV31 and the level of the input signal VIN1 input to the inverter IV35 may be different. The inverter IV36 inverts and outputs the input signal VIN1BAR. The inverter IV37 inverts and outputs the output signal of the inverter IV36. The delay circuit DC30 delays and outputs the output signal of the inverter IV37. The AND circuit AN34 executes an AND operation of the output signal of the inverter IV36 and the output signal of the delay circuit DC30, and outputs an operation result. A set of the inverter IV37, the delay circuit DC30, and the AND circuit AN34 outputs one pulse signal based on the fact that the input signal VIN1 becomes the "H" level. The OR circuit OR33 performs an OR operation of the enable signal EB, the output signal of the AND circuit AN34, and the reset signal RST, and outputs an operation result. The output signal of the OR circuit OR33 is input to the reset terminal R of the flip-flop circuit FF30.

The BIN generator 51 described above is configured such that each of the counter CT30 and the flip-flop circuit FF30 is reset in a case where the reset signal RST becomes the "H" level. In addition, if the input signal VIN1 transitions from the "L" level to the "H" level in a state where the enable signal BENB is at the "H" level, the OR circuit OR33 inputs one pulse signal to the flip-flop circuit FF30, and the flip-flop circuit FF30 is reset. As a result, the BIN generator 51 immediately causes the control signal BIN to transition from the "L" level to the "H" level based on the transition of the input signal VIN1 from the "L" level to the "H" level. Then, if the input signal VIN1 transitions from the "H" level to the "L" level in a state where the enable signal BENB is at the "H" level, the counter CT30 starts the counting operation of the clock signal CLKB. Then, the BIN generator 51 causes the control signal BIN to transition from the "H" level to the "L" level after the dead time (hereinafter referred to as "dead time DT3") by a set of the counter CT30 and the AND circuits AN31 and AN32 elapses after the input signal VIN1 transitions to the "L" level.

Note that the circuit configuration of the BIN generator 51 may be any other circuit configuration as long as the operation described above can be realized. The dead time DT3 can be easily changed by changing the connection between the AND circuits AN31 and AN32 and the counter CT30. If the dead time DT3 can be formed, the set of the counter CT30 and the AND circuits AN31 and AN32 may not be used. The counter CT30 may be configured by an analog circuit. For example, the counter CT30 may be a delay circuit including a minute current source, an inverse Widlar circuit, a capacitance, and the like.

(4: Circuit Configuration of TONB Generator 52)

FIG. 12 is a circuit diagram illustrating an example of a circuit configuration of a TONB generator 52 in the integrated circuit 10 included in the semiconductor device 1 according to the first embodiment. As illustrated in FIG. 12, the TONB generator 52 includes, for example, logical conjunction (AND) circuits AN40 to AN45, logical disjunction (OR) circuits OR40 to OR43, an inverters IV40 to IV42, a delay circuit DC40, a counter CT40, and a flip-flop circuit FF40. Although not illustrated, each of the AND circuits AN40 to AN45, the OR circuits OR40 to OR43, the inverters IV40 to IV42, the delay circuit DC40, the counter CT40, and the flip-flop circuit FF40 is connected to the power node and the ground node, and operates based on the power supply voltage VCC1 applied to the power node.

The inverter IV40 inverts and outputs the input signal VIN1. The delay circuit DC40 delays and outputs the output signal of the inverter IV40. The inverter IV41 inverts and outputs the output signal of the delay circuit DC40. The AND circuit AN40 executes an AND operation of the input signal VIN1 and the output signal of the inverter IV41, and outputs an operation result. A set of the inverter IV40, the delay circuit DC40, the inverter IV41, and the AND circuit AN 40 delays and outputs the input signal VIN1 at the "H" level. For example, the control signal BIN output from the BIN generator 51 and the control signal TONB output from the TONB generator 52 are synchronized with each other by a delay of a signal by the set of the inverter IV40, the delay circuit DC40, the inverter IV41, and the AND circuit AN40.

The AND circuit AN41 executes an AND operation of the output signal of the AND circuit AN40 and the inverted output signal of the flip-flop circuit FF40, and outputs an operation result. The output signal of the AND circuit AN41 is input to the clock input terminal CK of the flip-flop circuit FF40. A data input terminal D of the flip-flop circuit FF40 is connected to an inverting output terminal QN of the flip-flop circuit FF40. The non-inverted output signal output from the non-inverting output terminal Q of the flip-flop circuit FF40 corresponds to the control signal TONB. In a case the signal at the "H" level is input to the clock input terminal CK, the flip-flop circuit FF40 in the reset state outputs a non-inverted output signal at the "H" level.

The inverter IV42 inverts and outputs the enable signal EB. The AND circuit AN42 executes an AND operation of the input signal VIN1, the control signal BINb, and the clock signal CLKB, and outputs an operation result. The AND circuit AN43 executes an AND operation of the output signal of the inverter IV42 and the output signal of the AND circuit AN42, and outputs an operation result as the clock signal CLKB1. The counter CT40 executes the counting operation of the clock signal CLKB1 input to the clock input terminal CK and outputs the count result from the output terminals Q0 to Q13. The AND circuit AN44 executes an AND operation of output signals of the output terminals Q2, 05, and Q7 of the counter CT40, and outputs an operation result. The AND circuit AN45 executes an AND operation of an output signal of the AND circuit AN44 and each output signal of the output terminals Q9 and Q10 of the counter CT40, and outputs an operation result.

The OR circuit OR40 performs an OR operation of the enable signal EB, the input signal VIN1BAR, and the output signal of the AND circuit AN45, and outputs an operation result. The OR circuit OR41 performs an OR operation of the output signal of the OR circuit OR40 and the reset signal RST, and outputs an operation result. The output signal of the OR circuit OR41 is input to the reset terminal R of the counter CT40. The OR circuit OR42 performs an OR operation of the enable signal EB, the input signal VIN1BAR, and the output signal of the AND circuit AN45, and outputs an operation result. The OR circuit OR43 performs an OR operation of the output signal of the OR circuit OR42 and the reset signal RST, and outputs an operation result. The output signal of the OR circuit OR43 is input to the reset terminal R of the flip-flop circuit FF40.

The TONB generator 52 described above is configured such that each of the counter CT40 and the flip-flop circuit FF40 is reset in a case where the reset signal RST becomes the "H" level. Furthermore, if the control signal BIN transitions from the "L" level to the "H" level in a state where the enable signal EB is at the "L" level, the TONB generator 52 causes the control signal TONB transition from the "L" level to the "H" level in synchronization with the input signal VINB. Then, in a case where the dead time (hereinafter referred to as "dead time DT4") by a set of the counter CT40 and the AND circuits AN44 and AN45 elapses after the control signal BIN transitions to the "H" level, the output signal of the OR circuit OR43 becomes the "H" level, and the flip-flop circuit FF40 is reset. In other words, based on the transition of the control signal BIN from the "L" level to the "H" level, the TONB generator 52 outputs the control signal TONB at the "H" level only during the dead time DT4.

Note that the circuit configuration of the TONB generator 52 may be any other circuit configuration as long as the operation described above can be realized. The dead time DT4 can be easily changed by changing the connection between the AND circuits AN44 and AN45 and the counter CT40. If the dead time DT4 can be formed, the set of the counter CT40 and the AND circuits AN44 and AN45 may not be used. The counter CT40 may be configured by an analog circuit. For example, the counter CT40 may be a one-shot pulse generator including a minute current source, an inverse Widlar circuit, a capacitance, a comparator, and the like.

(5: Circuit Configuration of LED Driver 60)

Figure 13:
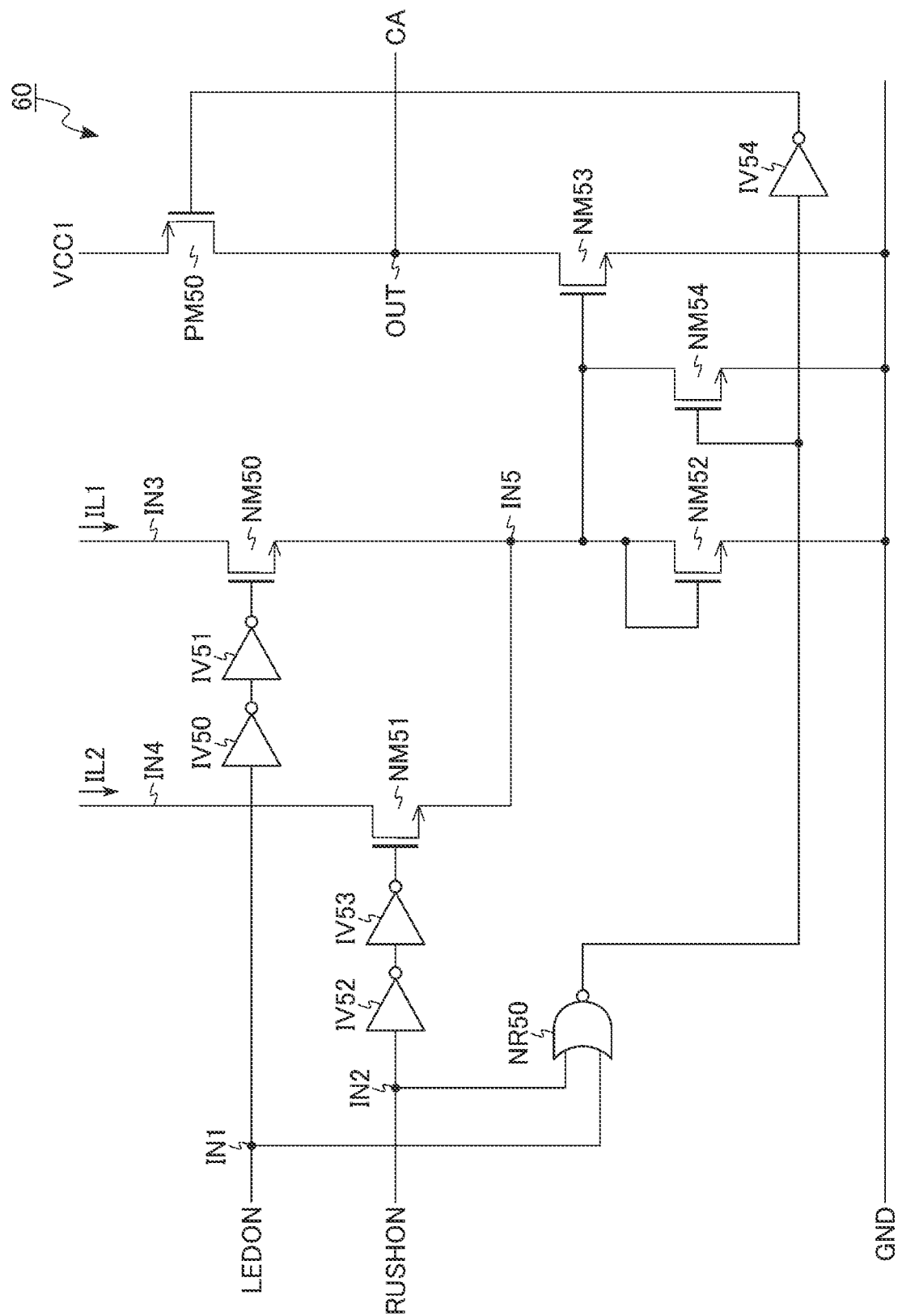
FIG. 13 is a circuit diagram illustrating an example of a circuit configuration of an LED driver in the integrated circuit included in the semiconductor device according to the first embodiment.

FIG. 13 is a circuit diagram illustrating an example of a circuit configuration of the LED driver 60 in the integrated circuit 10 included in the semiconductor device 1 according to the first embodiment. As illustrated in FIG. 13, the LED driver 60 includes, for example, nodes IN1 to IN5 and OUT, inverters IV50 to IV54, a negative OR (NOR) circuit NR50, NMOS transistors NM50 to NM54, and a PMOS transistor PM50. Although not illustrated, each of the inverters IV50 to IV54 and the NOR circuit NR50 is connected to the power node and the ground node, and operates based on the power supply voltage VCC1 applied to the power node.

The node IN1 is connected to the gate end of the NMOS transistor NM50 via the inverters IV50 and IV51. The control signal LEDON is input to the node IN1. The control signal LEDON corresponds to the control signal AIN in the case of the LED driver 60A, and corresponds to the control signal BIN in the case of the LED driver 60B.

The node IN2 is connected to the gate end of the NMOS transistor NM51 via the inverters IV52 and IV53. The control signal RUSHON is input to the node IN2. The control signal RUSHON corresponds to the control signal TONA in the case of the LED driver 60A, and corresponds to the control signal TONB in the case of the LED driver 60B.

A drain end of the NMOS transistor NM50 is connected to the node IN3. A drain end of the NMOS transistor NM51 is connected to the node IN4. The current IL1 is supplied to the node IN3. The current IL2 is supplied to the node IN4. The source ends of the NMOS transistors NM50 and NM51 are connected to node IN5.

A gate end and a drain end of the NMOS transistor NM52 is connected to the node IN5. A source end of the NMOS transistor NM52 is connected to a ground node (GND). A gate end of the NMOS transistor NM53 is connected to the node IN5. A drain end of the NMOS transistor NM53 is connected to the node OUT. A source end of the NMOS transistor NM53 is connected to a ground node (GND). The NMOS transistors NM 52 and NM 53 constitute a current mirror circuit. The current mirror ratio of the NMOS transistors NM52 and NM53 is, for example, 1:100.

A first input terminal and a second input terminal of the NOR circuit NR50 are connected to the nodes IN1 and IN2, respectively. The NOR circuit NR50 performs an OR operation of the control signals LEDON and RUSHON, and outputs an operation result. An output end of the NOR circuit NR50 is connected to a gate end of the NMOS transistor NM54. A drain end of the NMOS transistor NM54 is connected to the node IN5. A source end of the NMOS transistor NM54 is connected to a ground node (GND). The NMOS transistor NM54 is used as a discharge path of the node IN5.

In addition, the output end of the NOR circuit NR50 is connected to the gate end of the PMOS transistor PM50 via the inverter IV54. The power supply voltage VCC1 is applied to the source end of the PMOS transistor PM50. A drain end of the PMOS transistor PM50 is connected to the node OUT. The node OUT is connected to the node CA. The node CA corresponds to the node CA_A (cathode of the LED 21) in the case of the LED driver 60A, and corresponds to the node CA_B (cathode of the LED 31) in the case of the LED driver 60B.

In a case where each of the control signals LEDON and RUSHON is at the "L" level, each of the PMOS transistor PM50 and the NMOS transistor NM54 enters the ON state, and each of the NMOS transistors NM50 and NM51 enters OFF state. In a case where each of the NMOS transistors NM50 and NM51 is in the OFF state, neither of the currents IL1 and IL2 is supplied to the node IN5. Further, in a case where the NMOS transistor NM54 is in the ON state, the node IN5 is discharged through the NMOS transistor NM54 and becomes the "L" level. Therefore, each of the NMOS transistors NM52 and NM53 enters OFF state. Then, the node OUT is charged via the PMOS transistor PM50, and the voltage of the node CA increases. As a result, in the LED associated with the LED driver 60, the voltage difference between the anode and the cathode becomes small, and the LED enters a non-light emitting state.

FIG. 14 is a circuit diagram illustrating a first example of operation characteristics of the LED driver 60 in the integrated circuit 10 included in the semiconductor device 1 according to the first embodiment. The first example corresponds to a case where each of the control signals LEDON and RUSHON is at the "H" level in the LED driver 60. As illustrated in FIG. 14, in a case where each of the control signals LEDON and RUSHON is at the "H" level, each of the NMOS transistors NM50 and NM51 enters the ON state. In addition, since the NOR circuit NR50 outputs the signal at the "L" level, the NMOS transistor NM54 enters the OFF state. Further, since the inverter IV54 outputs the signal at the "H" level, the PMOS transistor PM50 enters the OFF state.

If each of the NMOS transistors NM50 and NM51 enters the ON state, the node IN5 is charged by the current IL1 supplied via the NMOS transistor NM50 and the current IL2 supplied via the NMOS transistor NM51. Then, the total current IL1+IL2 that is the sum of the current IL1 and the current IL2 is amplified by the current mirror circuit including the NMOS transistors NM52 and NM53. Then, the current IL3 amplified by the current mirror circuit flows through the NMOS transistor NM53. As a result, the node OUT is discharged, and the voltage of the cathode of the associated LED falls. For example, the amount of the current IL3 corresponds to a value calculated by (IL1+IL2)×100 ("100" is the current mirror ratio).

FIG. 15 is a circuit diagram illustrating a second example of operation characteristics of the LED driver 60 in the integrated circuit 10 included in the semiconductor device 1 according to the first embodiment. The second example corresponds to a case where the control signal RUSHON transitions from the "H" level to the "L" level after a state corresponding to the first example in the LED driver 60. As illustrated in FIG. 15, in a case where the control signal LEDON is at the "H" level and the control signal RUSHON is at the "L" level, the NMOS transistor NM50 enters the ON state, and the NMOS transistor NM51 enters the OFF state. In addition, since the NOR circuit NR50 outputs the signal at the "L" level, the NMOS transistor NM54 enters the OFF state. Further, since the inverter IV54 outputs the signal at the "H" level, the PMOS transistor PM50 enters the OFF state.

If the NMOS transistor NM50 enters the ON state and the NMOS transistor NM51 enters the OFF state, the node IN5 is charged by the current IL1 supplied via the NMOS transistor NM50. Then, the current IL1 is amplified by the current mirror circuit including the NMOS transistors NM52 and NM53. Then, the current IL4 amplified by the current mirror circuit flows through the NMOS transistor NM53. As a result, the node OUT is discharged, and the voltage of the cathode of the associated LED maintains the "L" level. For example, the amount of the current IL4 corresponds to a value calculated by (IL1)×100 ("100" is the current mirror ratio). In the second example, since the current IL2 is not amplified by the current mirror circuit, the amount of current for discharging the node OUT is smaller than that in the first example.

Note that the circuit configuration of the LED driver 60 may be any other circuit configuration as long as the operation described above can be realized. The LED test circuit 17 is configured to be capable of inputting, for example, a current based on the current IL3 or IL4 to the terminal T3. The current flowing through the LED 21 and/or 31 based on the control signal RUSHON may be determined based on the difference between the current IL3 and the current IL4. The TONA generator 42 and the TONB generator 52 that generate the control signal corresponding to the control signal RUSHON may be referred to as a "LED current amplifier (adder)" and a "current amplifier (adder)", respectively. The current amplifier (adder) is configured to amplify (add) the current flowing through the LEDs 21 or 31 for a predetermined time from the rise of the control signal AIN or BIN.

<1-1-5> Configuration of ASW Control Section 20

FIG. 16 is a circuit diagram illustrating an example of a circuit configuration of the light receiving section 22 and the VGS controller 23 in the ASW control section 20 included in the semiconductor device 1 according to the first embodiment. As illustrated in FIG. 16, the light receiving section 22 includes, for example, photodiode arrays 22a, 22b, and 22c, and photodiodes PD1 and PD2. Each of the photodiode arrays 22a, 22b, and 22c includes photodiodes connected in series. The VGS controller 23 includes, for example, nodes ND1 to ND5, AGND1 and AGND2, a diode DI, Zener diodes ZD1 and ZD2, resistance elements R60 to R 63, a depletion NMOS transistor NM60, NPN transistors NPN1 to NPN3, and a current regulator 24. The depletion NMOS transistor NM60 is a depletion type NMOS transistor.

An anode side end of the photodiode array 22a is connected to the node ND1. A cathode side end of the photodiode array 22a is connected to the node AGND1. The photodiode array 22a generates a current based on light irradiation and generates a potential difference between the nodes ND1 and AGND1. An anode side end of the photodiode array 22b is connected to the node AGND1. A cathode side end of the photodiode array 22b is connected to the node ND2. The photodiode array 22b generates a current based on light irradiation and generates a potential difference between the nodes AGND1 and ND2. An anode side end of the photodiode array 22c is connected to the node ND3. A cathode side end of the photodiode array 22c is connected to the node ND1. The photodiode array 22c generates a current based on light irradiation and generates a potential difference between the nodes ND3 and ND1.

An anode of the photodiode PD1 is connected to the node ND1. A cathode of the photodiode PD1 is connected to the node ND4. An anode of the photodiode PD2 is connected to the node ND3. A cathode of the photodiode PD2 is connected to the node ND4. Hereinafter, the current flowing through the node ND1 is referred to as "I1", the current flowing through the node ND2 is referred to as "I2", and the current flowing through the node ND3 is referred to as "I3". The current I1 flowing through the photodiode PD1 and the current I3 flowing through the photodiode PD2 flow into the node ND4.

The current regulator 24 operates based on the voltage generated by the light receiving section 22. The current regulator 24 is connected to each of the nodes ND1 to ND3 and AGND1 of the VGS controller 23. The current I2 is input to the current regulator 24 via the node ND2. The current regulator 24 includes, for example, a current source that controls a current flowing through each of the nodes ND1 to ND3. The currents I1 to I3 of the current regulator 24 are proportional to the light receiving surface illuminance and the light receiving area of the light receiving section 22 of the light emitted based on the LED current flowing through the LED 21. Therefore, by controlling the LED current of the LED 21, each of the currents I1 to I3 is adjusted to a magnitude appropriate for driving the A-type switch ASW.

The resistance element R60 is connected between the node ND2 and the AGND1. The resistance element R61 is connected between the node ND2 and the gate end of the depletion NMOS transistor NM60. A drain end of the depletion NMOS transistor NM60 is connected to the node ND4. A source end of the depletion NMOS transistor NM60 is connected to the node AGND1. A base end of the NPN transistor NPN1 is connected to the node AGND1 and a source end of the depletion NMOS transistor NM60. A collector end of the NPN transistor NPN1 is connected to the node ND4. An emitter end of the NPN transistor NPN1 is connected to the node AGND2. A set of the depletion NMOS transistor NM60 and the NPN transistor NPN1 is Darlington-connected. The set of the depletion NMOS transistor NM60 and the NPN transistor NPN1 is used as a discharge path from the node ND4 to the nodes AGND1 and AGND2. Note that the set of the depletion NMOS transistor NM60 and the NPN transistor NPN1 may be referred to as a "Darlington transistors".

An anode of the diode DI is connected to the node AGND2. A cathode of the diode DI is connected to the node AGND1. An anode of the Zener diode ZD1 is connected to an anode of the Zener diode ZD2. A cathode of the Zener diode ZD1 is connected to the node ND4. A cathode of the Zener diode ZD2 is connected to the node AGND2. The set of Zener diodes ZD1 and ZD2 functions as a protection circuit of the VGS controller 23.

The base end and the collector end of the NPN transistor NPN2 are connected to the node ND4. An emitter end of the NPN transistor NPN2 is connected to one end of the resistance element R62. The other end of the resistance element R62 is connected to the node ND5. The NPN transistor NPN2 is diode-connected between the nodes ND4 and ND5, and has a rectification characteristic in a direction from the node ND4 to the node ND5. A set of the NPN transistor NPN2 and the resistance element R62 corresponds to the charging path of the node ND5.

An emitter end of the NPN transistor NPN3 is connected to the node ND4. A base end and a collector end of the NPN transistor NPN3 are connected to one end of the resistance element R63. The other end of the resistance element R63 is connected to the node ND5. The NPN transistor NPN3 is diode-connected between the nodes ND4 and ND5, and has a rectification characteristic in a direction from the node ND5 to the node ND4. A set of the NPN transistor NPN3 and the resistance element R63 corresponds to the discharging path of the node ND5.

The node AGND2 is connected to the node NS_A. That is, the voltage of the node AGND2 is applied to the source ends of the NMOS transistors ENM1 and ENM2 included in the A-type switch ASW. The node ND5 of the VGS controller 23 is connected to the node NG_A. That is, the voltage of the node ND5 of the VGS controller 23 is applied to the gate ends of the NMOS transistors ENM1 and ENM2 included in the A-type switch ASW.

If the light receiving section 22 is not irradiated with the light of the LED 21, no voltage is applied to the gate end of the depletion NMOS transistor NM60, so that the depletion NMOS transistor NM60 enters the ON state. Therefore, the node ND4 is discharged via a set of the depletion NMOS transistor NM60 and the NPN transistor NPN1 (that is, the Darlington transistors). In addition, the node ND5 (that is, the node NG_A) is discharged via the NPN transistor NPN3 at a speed based on the resistance value of the resistance element R63 and the input capacitances of the NMOS transistors ENM1 and ENM2 included in the A-type switch ASW.

If the light receiving section 22 is irradiated with the light of the LED 21, a negative voltage is applied to the gate end of the depletion NMOS transistor NM60 by the photodiode array 22b, so that the depletion NMOS transistor NM60 enters the OFF state. Therefore, a discharge path by the set of the depletion NMOS transistor NM60 and the NPN transistor NPN1 (that is, the Darlington transistors) is cut off. In addition, the currents I1 and I2 generated by the light receiving section 22 are supplied to the node ND4, and the voltage of the node ND4 increases. Then, the node ND5 (that is, the node NG_A) is charged via the NPN transistor NPN2 at a speed based on the resistance value of the resistance element R62 and the input capacitances of the NMOS transistors ENM1 and ENM2 included in the A-type switch ASW. As a result, the VGS controller 23 can apply a positive voltage to the gate ends of the NMOS transistors ENM1 and ENM2. In other words, the VGS controller 23 can generate a positive potential difference between the gate and the source of each of the NMOS transistors ENM1 and ENM2.

Note that the resistance value of the resistance element R62 is designed to be higher than the resistance value of the resistance element R63. The resistance value of the resistance element R62 is, for example, 1 kiloohms. The resistance value of the resistance element R63 is, for example, 100 ohms. Therefore, the discharge speed of the node NG_A, that is, the speed of discharging from the node ND5 to the node ND4 is faster than the charge speed of the node NG_A, that is, the speed of charging from the node ND4 to the node ND5. As described above, the ASW control section 20 is configured such that the transition of the A-type switch ASW from the OFF state to the ON state is delayed, and the transition of the A-type switch ASW from the ON state to the OFF state is accelerated. The circuit configuration of the ASW control section 20 may be any other circuit configuration as long as the operation described above can be realized.

<1-1-6> Configuration of BSW Control Section 30

FIG. 17 is a circuit diagram illustrating an example of a circuit configuration of the light receiving section 32 and the VGS controller 33 in the BSW control section 30 included in the semiconductor device 1 according to the first embodiment. As illustrated in FIG. 17, the light receiving section 32 includes, for example, photodiode arrays 32a, 32b, and 32c, and photodiodes PD1 and PD2. The VGS controller 33 includes, for example, nodes ND1 to ND5, BGND1 and BGND2, a diode DI, Zener diodes ZD1 and ZD2, resistance elements R60, R61, R64, and R 65, a depletion NMOS transistor NM60, NPN transistors NPN1 to NPN3, and a current regulator 34.

The connection of each configuration of the light receiving section 32 is similar to that in the connection of each configuration of the light receiving section 22, the photodiode arrays 22a, 22b, and 22c are replaced with photodiode arrays 32a, 32b, and 32c, respectively, and the node AGND1 is replaced with the node BGND1. The connection of each configuration of the VGS controller 33 is similar to that in the connection of each configuration of the VGS controller 23, the nodes AGND1 and AGND2 are replaced with the nodes BGND1 and BGND2, respectively, and the resistance elements R62 and R63 are replaced with the resistance elements R64 and R65, respectively. The set of the depletion NMOS transistor NM60 and the NPN transistor NPN1 (that is, the Darlington transistors) of the VGS controller 33 is used as a discharge path from the node ND4 to the nodes BGND1 and BGND2. The set of Zener diodes ZD1 and ZD2 of the VGS controller 33 functions as a protection circuit of the VGS controller 33.

The current regulator 34 operates based on the voltage generated by the light receiving section 32. The current regulator 34 is connected to each of the nodes ND1 to ND3 and BGND1 of the VGS controller 33. The current I2 is input to the current regulator 34 via the node ND2. The current regulator 34 includes, for example, a current source that controls a current flowing through each of the nodes ND1 to ND3. The currents I1 to I3 of the current regulator 34 are proportional to the light receiving surface illuminance and the light receiving area of the light receiving section 32 of the light emitted based on the LED current of the LED 31. Therefore, by controlling the LED current of the LED 31, each of the currents I1 to I3 is adjusted to a magnitude appropriate for driving the B-type switch BSW.

The node BGND2 is connected to the node NG_B. That is, the voltage of the node BGND2 is applied to the gate ends of each of the NMOS transistors DNM1 and DNM2 included in the B-type switch BSW. The node ND5 of the VGS controller 33 is connected to the node NS_B. That is, the voltage of the node ND5 of the VGS controller 33 is applied to the source ends of the NMOS transistors DNM1 and DNM2 included in the B-type switch BSW.

If the light receiving section 32 is not irradiated with the light of the LED 31, no voltage is applied to the gate end of the depletion NMOS transistor NM60, so that the depletion NMOS transistor NM60 enters the ON state. Therefore, the node ND4 is discharged via a set of the depletion NMOS transistor NM60 and the NPN transistor NPN1 (that is, the Darlington transistors). In addition, the node ND5 (that is, the node NS_B) is discharged via the NPN transistor NPN3 at a speed based on the resistance value of the resistance element R65 and the input capacitances of the NMOS transistors DNM1 and DNM2 included in the B-type switch BSW.

If the light receiving section 32 is irradiated with the light of the LED 31, a negative voltage is applied to the gate end of the depletion NMOS transistor NM60 by the photodiode array 22b, so that the depletion NMOS transistor NM60 enters the OFF state. Therefore, a discharge path by the set of the depletion NMOS transistor NM60 and the NPN transistor NPN1 (that is, the Darlington transistors) is cut off. In addition, the currents I1 and I3 generated by the light receiving section 32 are supplied to the node ND4, and the voltage of the node ND4 increases. Then, the node ND5 (that is, the node NS_B) is charged via the NPN transistor NPN2 at a speed based on the resistance value of the resistance element R64 and the input capacitances of the NMOS transistors DNM1 and DNM2 included in the B-type switch BSW. As a result, the VGS controller 33 can apply a positive voltage to the source ends of the NMOS transistors DNM1 and DNM2. In other words, the VGS controller 33 can generate a negative potential difference between the gate and the source of each of the NMOS transistors DNM1 and DNM2.

Note that the resistance value of the resistance element R64 is designed to be lower than the resistance value of the resistance element R65. The resistance value of the resistance element R64 is, for example, 100 ohms. The resistance value of the resistance element R65 is, for example, 1 kiloohms. Therefore, the discharge speed of the node NS_B, that is, the speed of discharging from the node ND5 to the node ND4 is slower than the charge speed of the node NS_B, that is, the speed of charging from the node ND4 to the node ND5. As described above, the BSW control section 30 is configured such that the transition of the B-type switch BSW from the OFF state to the ON state is delayed, and the transition of the B-type switch BSW from the ON state to the OFF state is accelerated. The circuit configuration of the BSW control section 30 may be any other circuit configuration as long as the operation described above can be realized.

<1-2> Operations

Next, operations of the semiconductor device 1 according to the first embodiment will be described.

<1-2-1> Operations Based on Power Supply Voltage VCC

Figure 18:
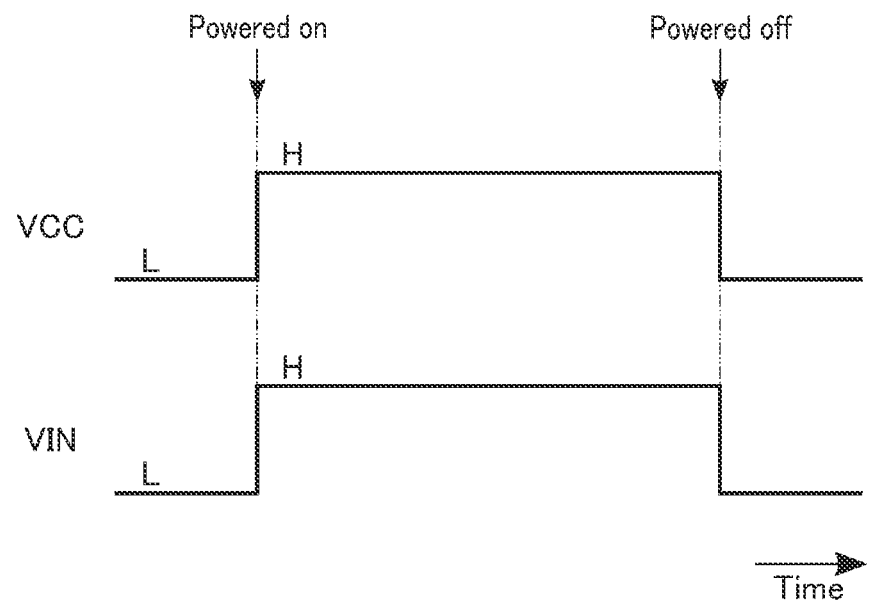
FIG. 18 is a time chart illustrating an example of an operation based on a power supply voltage in the semiconductor device according to the first embodiment.

FIG. 18 is a time chart illustrating an example of an operation based on the power supply voltage VCC in the semiconductor device 1 according to the first embodiment. FIG. 18 illustrates changes in the respective voltages of the power supply voltage VCC and the input signal VIN input to the semiconductor device 1. Hereinafter, an example of an operation based on the power supply voltage VCC in the semiconductor device 1 will be described with reference to FIG. 18.

In a case where the power supply voltage VCC is at the "L" level, the input signal VIN is usually at the "L" level. If the power supply voltage VCC transitions from the "L" level to the "H" level, the semiconductor device 1 is powered on. In addition, in a case where the power supply voltage VCC and the input signal VIN increase more slowly than the dead time DT1, the enable controller 14 can suppress the simultaneous turn-on of the A-type switch ASW and the B-type switch BSW by shifting the timings at which the ASW controller ACNT and the BSW controller BCNT are enabled.

If the semiconductor device 1 is powered on, the input signal VIN is controlled to the "H" level or the "L" level by an external device. In present example, after the power supply voltage VCC enters the "H" level, the input signal VIN is fixed to the "H" level. Then, if the power supply voltage VCC transitions from the "H" level to the "L" level, the semiconductor device 1 is powered off. In addition, as the power supply voltage VCC decreases, the input signal VIN also decreases.

When the power supply voltage VCC falls to a voltage at which the LEDs 21 and 31 cannot be driven, the LEDs 21 and 31 enter the non-light emitting state. At this time, the gate voltages of the NMOS transistors ENM1 and ENM2 are discharged via the VGS controller 23, thereby decreasing at a speed based on the resistance value of the resistance element R63. Similarly, the gate voltages of the NMOS transistors DNM1 and DNM2 are discharged via the VGS controller 33, thereby decreasing at a speed based on the resistance value of the resistance element R65.

In present example, the VGS controller 23 is configured such that the NMOS transistors ENM1 and ENM2 are turned off earlier, and the VGS controller 33 is configured such that the NMOS transistors DNM1 and DNM2 are turned on later. Therefore, in the present example, the NMOS transistors DNM1 and DNM2 can be turned on after the NMOS transistors ENM1 and ENM2 are turned off. Therefore, in the semiconductor device 1 according to the first embodiment, the simultaneous turn-on of the A-type switch ASW and the B-type switch BSW at the time of being powered off can be suppressed.

<1-2-2> Operations in Case of Occurrence of VCC Instantaneous Power Failure

Figure 19:
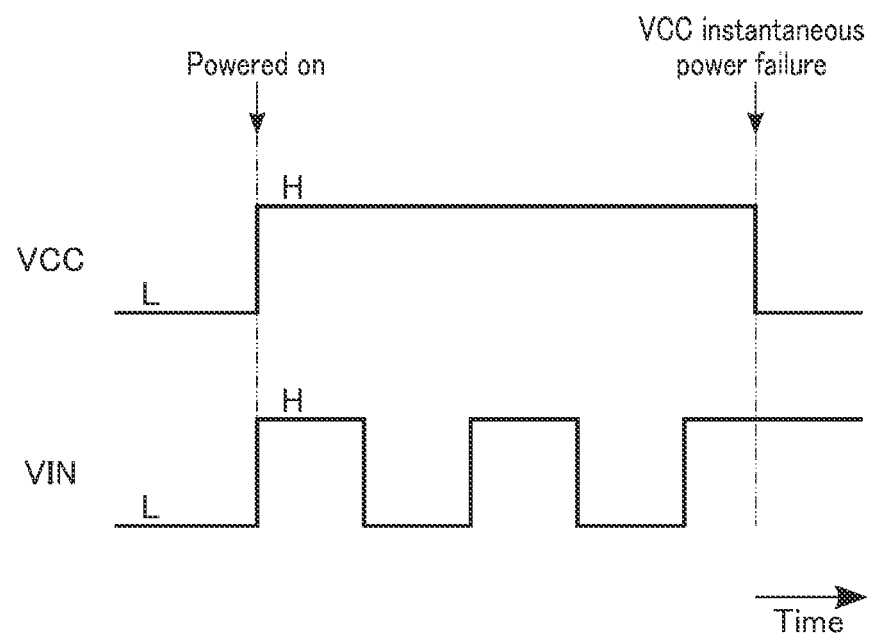
FIG. 19 is a time chart illustrating an example of an operation in a case of occurrence of a VCC instantaneous power failure in the semiconductor device according to the first embodiment.

FIG. 19 is a time chart illustrating an example of an operation in a case of occurrence of a VCC instantaneous power failure in the semiconductor device 1 according to the first embodiment. FIG. 19 illustrates changes in the respective voltages of the power supply voltage VCC and the input signal VIN input to the semiconductor device 1. Hereinafter, an example of an operation in a case of occurrence of the VCC instantaneous power failure in the semiconductor device 1 will be described with reference to FIG. 19.

If the power supply voltage VCC transitions from the "L" level to the "H" level, similarly to the description of FIG. 18, the semiconductor device 1 is powered on. In the present example, the input signal VIN is periodically controlled between the "H" level and the "L" level. Then, when the input signal VIN is at the "H" level, the power supply voltage VCC transitions from the "H" level to the "L" level due to an abnormality (VCC instantaneous power failure). As described above, even if the power supply voltage VCC is at the "L" level, the input signal VIN may be temporarily maintained at the "H" level.

Even in such a case, when the power supply voltage VCC falls to a voltage at which the LEDs 21 and 31 cannot be driven, the LEDs 21 and 31 enter the non-light emitting state. Then, the gate voltages of the NMOS transistors ENM1 and ENM2 are discharged via the VGS controller 23, thereby decreasing at a speed based on the resistance value of the resistance element R63. Similarly, the gate voltages of the NMOS transistors ENM1 and ENM2 are discharged via the VGS controller 33, thereby decreasing at a speed based on the resistance value of the resistance element R65. Therefore, in the semiconductor device 1 according to the first embodiment, the simultaneous turn-on of the A-type switch ASW and the B-type switch BSW can be suppressed even at the time of VCC instantaneous power failure.

<1-2-3> Operations of A-Type Switch ASW and B-Type Switch BSW

Figure 20:
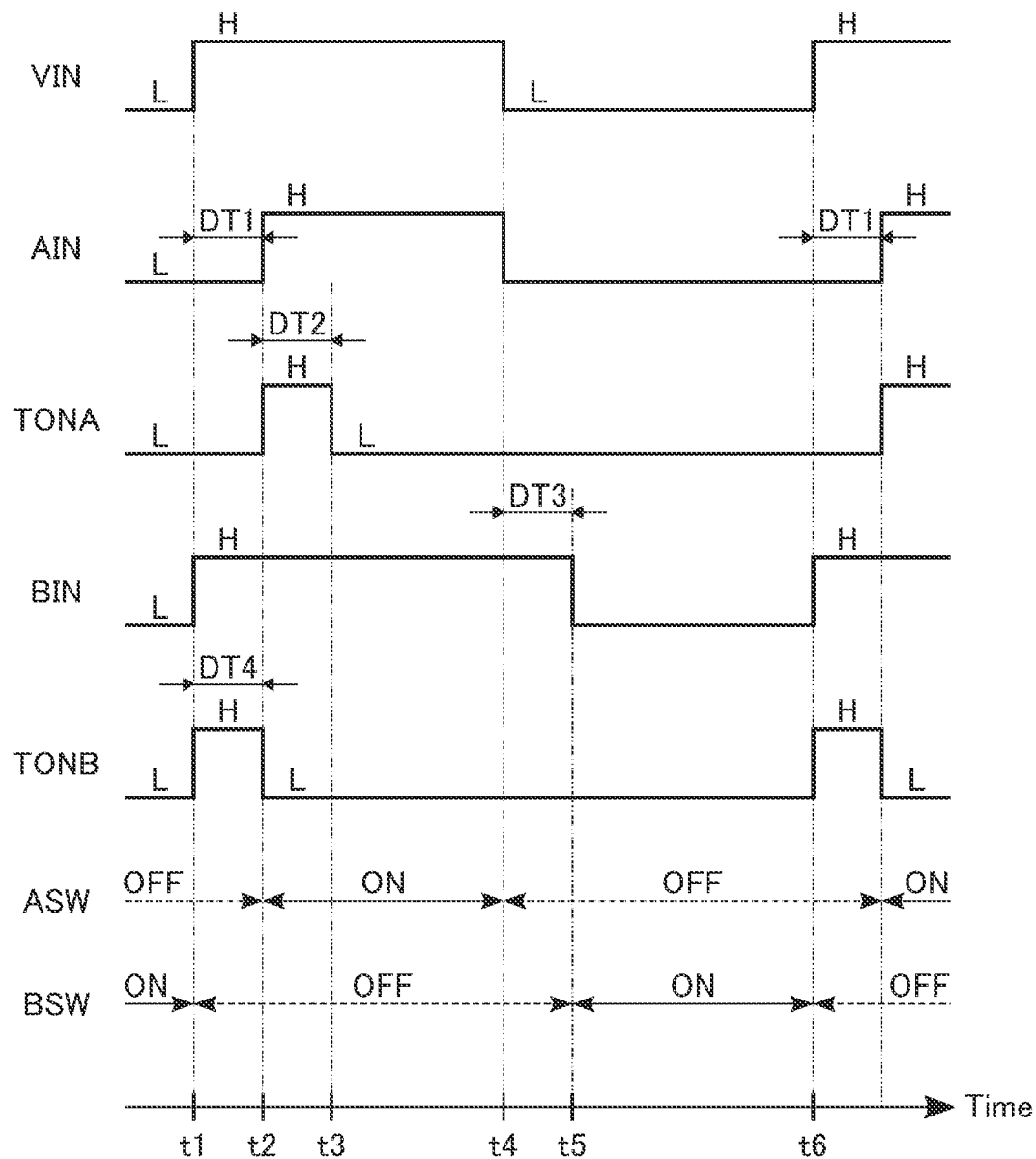

FIG. 20 is a time chart illustrating an example of operation of the A-type switch ASW and the B-type switch BSW when the semiconductor device 1 according to the first embodiment is powered on. FIG. 20 illustrates changes in the voltages of the input signal VIN and the control signals AIN, TONA, BIN, and TONB, and the states of the A-type switch ASW and the B-type switch BSW. Hereinafter, with reference to FIG. 20, a description will be given on an example of the operation of the A-type switch ASW and the B-type switch BSW when the semiconductor device 1 according to the first embodiment is powered on. In the present example, the dead times DT1 and DT4 are set to the same time. However, the times of the dead times DT1 and DT4 can be appropriately changed by the interconnect formation means of the semiconductor process.

In the initial state of the present example, the input signal VIN and each of the control signals AIN, TONA, BIN, and TONB are at the "L" level, the A-type switch ASW is in the OFF state, and the B-type switch BSW is in the ON state.

At time t1, if the input signal VIN transitions from the "L" level to the "H" level, each of the control signals BIN and TONB transitions from the "L" level to the "H" level. Then, the LED driver 60B causes the current IL3 amplified using the currents IL1 and IL2 to flow to the LED 31. Specifically, the LED current (IL3) flows from the terminal T1 (VCC) to the NMOS transistor NM53 (constant current switch) of the LED driver 60B via the anode and cathode of the LED 31. As a result, the LED 31 quickly emits light. As a result, a reverse bias is applied between the gate and the source of the NMOS transistors DNM1 and DNM2 by the VGS controller 33, and the B-type switch BSW enters the OFF state. In addition, with the transition of the input signal VIN from the "L" level to the "H" level, each of the counter CT10 of the AIN generator 41 and the counter CT40 of the TONB generator starts the counting operation of the input clock signal. In the present example, the time at which the dead time DT1 based on the count result of the counter CT10 has elapsed from the time t1 as a starting point and the time at which the dead time DT4 based on the count result of the counter CT40 has elapsed from the time t1 as a starting point correspond to time t2.

At the time t2, each of the control signals AIN and TONA transitions from the "L" level to the "H" level based on the elapse of the dead time DT1 from the time t1. Then, the LED driver 60A causes the current IL3 amplified using the currents IL1 and IL2 to flow to the LED 21. Specifically, the LED current (IL3) flows from the terminal T1 (VCC) to the NMOS transistor NM53 (constant current switch) of the LED driver 60A via the anode and cathode of the LED 21. As a result, the LED 21 quickly emits light. As a result, a forward bias is applied between the gate and the source of the NMOS transistors ENM1 and ENM2 by the VGS controller 23, and the A-type switch ASW enters the ON state. In addition, with the transition of the control signal AIN from the "L" level to the "H" level, the counter CT20 of the TONA generator 42 starts the counting operation of the input clock signal. In the present example, the time at which the dead time DT2 based on the count result of the counter CT20 has elapsed from the time t2 as a starting point corresponds to the time t3. At the time t2, the control signal TONB transitions from the "H" level to the "L" level based on the elapse of the dead time DT4 from the time t1. Then, the LED driver 60B causes the current IL4 amplified using the current IL1 to flow to the LED 31. Specifically, the LED current (IL4) flows from the terminal T1 (VCC) to the NMOS transistor NM53 (constant current switch) of the LED driver 60B via the anode and cathode of the LED 31.

Thus, the light emission of the LED 31 is maintained. Therefore, the B-type switch BSW maintains the OFF state even after the time t2.

At the time t3, the control signal TONA transitions from the "H" level to the "L" level based on the elapse of the dead time DT2 from the time t2. Then, the LED driver 60A causes the current IL4 amplified using the current IL1 to flow to the LED 21. Specifically, the LED current (IL4) flows from the terminal T1 (VCC) to the NMOS transistor NM53 (constant current switch) of the LED driver 60A via the anode and cathode of the LED 21. Thus, the light emission of the LED 21 is maintained. Therefore, the A-type switch ASW maintains the ON state even after the time t3.

At the time t4, if the input signal VIN transitions from the "H" level to the "L" level, the control signal AIN transitions from the "H" level to the "L" level. Then, the LED driver 60A suspends the supply of the current to the LED 21 and suspends the light emission of the LED 21. As a result, the gate ends of the NMOS transistors ENM1 and ENM2 are discharged by the VGS controller 23, and the A-type switch ASW enters the OFF state. Further, if each of the input signal VIN and the control signal AIN transitions from the "H" level to the "L" level at time t4, the counter CT30 of the BIN generator 51 starts the counting operation of the input clock signal. In the present example, the time at which the dead time DT3 based on the count result of the counter CT30 has elapsed from the time t4 as a starting point corresponds to the time t5.

At the time t5, the control signal BIN transitions from the "H" level to the "L" level based on the elapse of the dead time DT3 from the time t4. Then, the LED driver 60B suspends the supply of the current to the LED 31 and suspends the light emission of the LED 31. As a result, the source ends of the NMOS transistors DNM1 and DNM2 are discharged by the VGS controller 33, and the B-type switch BSW enters the ON state.

The operation of the semiconductor device 1 at the time t6 is similar to the operation of the semiconductor device 1 at time t1. Thereafter, the semiconductor device 1 executes the operations described at times t1 to t5 according to a change in the input signal VIN.

As described above, in the semiconductor device 1, the ASW controller ACNT is configured to cause the LED 21 to emit light after the dead time DT1 elapses after the input signal VIN transitions from the "L" level to the "H" level, and suspend the light emission of the LED 21 before the dead time DT3 elapses after the input signal VIN transitions from the "H" level to the "L" level. Further, the ASW controller ACNT is configured to cause the LED 21 to emit light based on the total current of the currents IL and IL2 after the input signal VIN transitions from the "L" level to the "H" level and the dead time DT1 elapses until the dead time DT2 further elapses, and cause the LED 21 to emit light based on the current IL1 after the dead time DT2 elapses. In addition, the BSW controller BCNT is configured to cause the LED 31 to emit light before the dead time DT1 elapses after the input signal VIN transitions from the "L" level to the "H" level, and suspend the light emission of the LED 31 after the dead time DT3 elapses after the input signal VIN transitions from the "H" level to the "L" level. Further, the BSW controller BCNT is configured to cause the LED 31 to emit light based on the total current of the currents IL1 and IL2 after the input signal VIN transitions from the "L" level to the "H" level until the dead time DT4 elapses, and cause the LED 31 to emit light based on the current IL1 after the dead time DT4 elapses.

The four dead times DT1 to DT4 are parameters determined by independent counters CT. Therefore, each of the dead times DT1 to DT4 can be easily changed by modifying the circuit configuration of the driver circuits 40 and 50.

Figure 21:
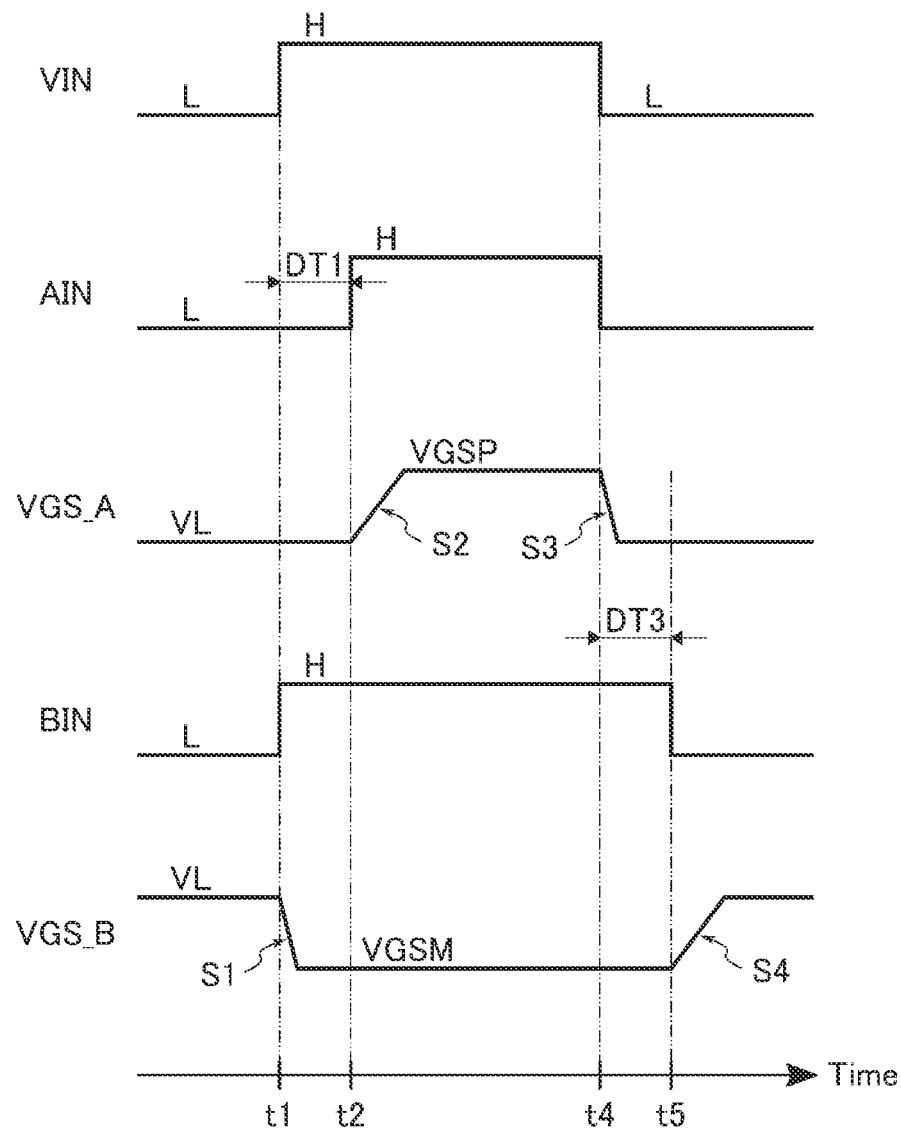

FIG. 21 is a time chart illustrating an example of a change in the gate-source voltage when the semiconductor device 1 according to the first embodiment is powered on. FIG. 21 illustrates changes in the voltages of the input signal VIN, the control signals AIN and BIN, the gate-source voltages VGS_A of the NMOS transistors ENM1 and ENM2, and the gate-source voltages VGS_B of the NMOS transistors DNM1 and DNM2. Times t1, t2, t4, and t5 in FIG. 21 correspond to times t1, t2, t4, and t5 in FIG. 20, respectively, that is, at each of times t1, t2, t4, and t5 in FIG. 21, the operation of the semiconductor device 1 described in FIG. 20 is executed. Hereinafter, with reference to FIG. 21, a description will be given on an example of a change in the source-gate voltage when the semiconductor device 1 according to the first embodiment is powered on.

In the initial state of the present example, each voltage of the gate-source voltage VGS_A of the NMOS transistors ENM1 and ENM2 and the gate-source voltage VGS_B of the NMOS transistors DNM1 and DNM2 is VL. VL is a voltage based on the voltage of the node AGND2 or BGND2, and is, for example, 0 V.

At the time t1, if each of the input signal VIN and the control signal BIN transitions from the "L" level to the "H" level, the LED 31 emits light. Then, the VGS controller 33 charges the node NS_B using the current (photocurrent) generated by the light receiving section 32. Hereinafter, the slope indicating the charging speed of the node NS_B is referred to as "S1". The slope S1 is determined based on, for example, the resistance value of the resistance element R64 of the VGS controller 33 and the input capacitances of the NMOS transistors DNM1 and DNM2. By the charging of the node NS_B, the gate-source voltages VGS_B of the NMOS transistors DNM1 and DNM2 fall to VGSM. VGSM is a negative voltage and is a voltage lower than the threshold voltage of each of the NMOS transistors DNM1 and DNM2. Therefore, since VGS_B falls below the threshold voltages of the NMOS transistors DNM1 and DNM2 after the time t1, the B-type switch BSW enters the OFF state.

At the time t2, if the control signal AIN transitions from the "L" level to the "H" level, the LED 21 emits light. Then, the VGS controller 23 charges the node NG_A using the current (photocurrent) generated by the light receiving section 22. Hereinafter, the slope indicating the charging speed of the node NG_A is referred to as "S2". The slope S2 is determined based on, for example, the resistance value of the resistance element R62 of the VGS controller 23 and the input capacitances of the NMOS transistors ENM1 and ENM2. By the charging of the node NG_A, the gate-source voltages VGS_A of the NMOS transistors ENM1 and ENM2 increases to VGSP. VGSP is a positive voltage and is a voltage higher than the threshold voltage of each of the NMOS transistors ENM1 and ENM2. Therefore, since VGS_A becomes equal to or higher than the threshold voltages of the NMOS transistors ENM1 and ENM2 after the time t2, the A-type switch ASW enters the ON state. That is, a period between the fall time of the VGSM based on S1 and the rise time of the VGSP based on S2 corresponds to a period in which the A-type switch ASW and the B-type switch BSW are not turned on simultaneously, that is, a period in which both the A-type switch ASW and the B-type switch BSW are in the OFF state.

At the time t4, if each of the input signal VIN and the control signal AIN transitions from the "H" level to the "L" level, the light emission of the LED 21 is suspended. Then, the VGS controller 23 discharges the node NG_A using the Darlington-connected depletion NMOS transistor NM60 and NPN transistor NPN1. Hereinafter, the slope indicating the discharging speed of the node NG_A is referred to as "S3". The slope S3 is determined based on, for example, the resistance value of the resistance element R63 of the VGS controller 23 and the input capacitances of the NMOS transistors ENM1 and ENM2. By the discharging of the node NG_A, the gate-source voltages VGS_A of the NMOS transistors ENM1 and ENM2 falls to VL. Therefore, since VGS_A falls below the threshold voltages of the NMOS transistors ENM1 and ENM2 after the time t4, the A-type switch ASW enters the OFF state.

At the time t5, if the control signal BIN transitions from the "H" level to the "L" level, the light emission of the LED 31 is suspended. Then, the VGS controller 33 discharges the node NS_B using the Darlington-connected depletion NMOS transistor NM60 and NPN transistor NPN1. Hereinafter, the slope indicating the discharging speed of the node NS_B is referred to as "S4". The slope S4 is determined based on, for example, the resistance value of the resistance element R65 of the VGS controller 33 and the input capacitances of the NMOS transistors DNM1 and DNM2. By the discharging of the node NS_B, the gate-source voltages VGS_B of the NMOS transistors DNM1 and DNM2 increases to VL. Therefore, since VGS_B becomes equal to or higher than the threshold voltages of the NMOS transistors DNM1 and DNM2 after the time t5, the B-type switch BSW enters the ON state. That is, a period between the fall time of the VGSP based on S3 and the rise time of the VGSM based on S4 corresponds to a period in which the A-type switch ASW and the B-type switch BSW are not turned on simultaneously, that is, a period in which both the A-type switch ASW and the B-type switch BSW are in the OFF state.

In the semiconductor device 1, each of the resistance elements R62 and R63 of the VGS controller 23 and the resistance elements R64 and R65 of the VGS controller 33 is set to a resistance value that compensates for a difference in gate capacitance between the A-type switch ASW and the B-type switch BSW. As a result, in the A-type switch ASW, the transition from the OFF state to the ON state is delayed as indicated by the slope S2, and the transition from the ON state to the OFF state is accelerated as indicated by the slope S3. Similarly, in the B-type switch BSW, the transition from the ON state to the OFF state is accelerated as indicated by the slope S1, and the transition from the OFF state to the ON state is delayed as indicated by the slope S4.

The slope S1 is preferably designed such that the gate-source voltages VGS_B of the NMOS transistors DNM1 and DNM2 fall from VL to VGSM within the dead time DT1. Similarly, the slope S3 is preferably designed such that the gate-source voltages VGS_A of the NMOS transistors ENM1 and ENM2 fall from VGSP to VL within the dead time DT3. The present invention is not limited to this, and each of the slopes S1 to S4 may be designed so as to be able to suppress at least simultaneous turn-on of the A-type switch ASW and the B-type switch BSW.

<1-3> Advantageous Effects of First Embodiment

According to the semiconductor device 1 according to the first embodiment described above, it is possible to prevent the two switch elements (the A-type switch ASW and the B-type switch BSW) from being simultaneously turned on. Hereinafter, advantageous effects of the first embodiment will be described in detail.

In the photorelay configured to electrically switch ON/OFF of the A-type switch ASW and the B-type switch BSW, it is preferable to shorten a delay time of ON/OFF. However, if the ON/OFF responses of the A-type switch ASW and the B-type switch BSW are made fast, there is a possibility that a period in which the two switch elements are simultaneously turned on occurs.

Therefore, in the semiconductor device 1 according to the first embodiment, two delay times (dead times DT1 and DT3) are respectively provided at the edge of the waveform in a case where the input signal VIN transitions from the "L" level to the "H" level and the edge of the waveform in a case where the input signal VIN transitions from the "H" level to the "L" level. Specifically, if the semiconductor device 1 detects the edge of the waveform in a case where the input signal VIN transitions from the "L" level to the "H" level, the semiconductor device 1 delays the timing at which the A-type switch ASW is turned on by the dead time DT1. In addition, if the semiconductor device 1 detects the edge of the waveform in a case where the input signal VIN transitions from the "H" level to the "L" level, the semiconductor device 1 delays the timing at which the B-type switch BSW is turned off by the dead time DT3.

Accordingly, if the input signal VIN transitions from the "L" level to the "H" level, the semiconductor device 1 can turn off the B-type switch BSW before the A-type switch ASW is turned on. Similarly, in a case where the input signal VIN transitions from the "H" level to the "L" level, the semiconductor device 1 can turn off the A-type switch ASW before the B-type switch BSW is turned on. Therefore, the semiconductor device 1 can prevent the A-type switch ASW and the B-type switch BSW from being simultaneously turned on.

On the other hand, setting the dead times DT1 and DT3 so as not to simultaneously turn on the A-type switch ASW and the B-type switch BSW may cause a delay in the switching operation. That is, the setting of the dead times DT1 and DT3 and the speed of the switching operation have a trade-off relationship. Therefore, the semiconductor device 1 is provided with a delay time (dead time DT2) for controlling the control signal TONA for turning on the A-type switch ASW at a high speed and a delay time (dead time DT4) for controlling the control signal TONB for turning off the B-type switch BSW at a high speed. The single pulse signal of the control signal TONA generated based on the dead time DT2 can accelerate the start of light emission of the LED 21. Similarly, the single pulse signal of the control signal TONB generated based on the dead time DT4 can accelerate the start of light emission of the LED 31. Therefore, the semiconductor device 1 according to the first embodiment can realize high-speed switching by the control signals TONA and TONB as compared with a case where the LEDs 21 and 31 are driven only by the control signals AIN and BIN. That is, the operation using the control signals TONA and TONB can reduce the delay of the switching operation caused by providing the dead times DT1 and DT3. That is, the semiconductor device 1 according to the first embodiment can solve the trade-off problem regarding the speed of the switching operation by combining the setting of the dead times DT1 and DT3 and the use of the control signals TONA and TONB.

Further, the semiconductor device 1 has a configuration in which a circuit on a secondary side in the photo relay is operated in a solar cell mode. In this case, each of the ON-time of the A-type switch ASW and the OFF-time of the B-type switch BSW can be shortened by controlling the LED current of the circuit on the primary side. On the other hand, the OFF-time of the A-type switch ASW and the ON-time of the B-type switch BSW are determined based on the characteristics of the discharge circuit of the OFF-circuit included in the circuit on the secondary side. Therefore, in the semiconductor device 1, as an OFF circuit, each of the VGS controllers 23 and 33 includes a depletion NMOS transistor NM60 and an NPN transistor NPN1 configured by Darlington connection. The semiconductor device 1 can increase the drive current of the OFF circuit by adjusting the depletion NMOS transistor NM 60 and the NPN transistor NPN1. That is, the semiconductor device 1 can shorten each of the time required to turn off the A-type switch ASW and the time required to turn on the B-type switch BSW.

In addition, in the semiconductor device 1, the VGS controller 23 is configured by the resistance elements R62 and R 63 to operate earlier in a case where the A-type switch ASW is turned off than in a case where the A-type switch ASW is turned on. Similarly, the VGS controller 33 is configured by the resistance elements R64 and R 65 to operate earlier in a case where the B-type switch BSW is turned off than in a case where the B-type switch BSW is turned on. As a result, even if each of the node NG_A and the node NS_B is discharged due to the cutoff of the power supply to the semiconductor device 1, the operation in which the A-type switch ASW is turned off can be earlier than the operation in which the B-type switch BSW is turned on. Therefore, the semiconductor device 1 according to the first embodiment can also suppress simultaneous turn-on of the A-type switch ASW and the B-type switch BSW in a case where the power supply voltage VCC is cut off.

In addition, the semiconductor device 1 includes a terminal T3 and a circuit (LED test circuit 17) for monitoring a current flowing through the LED 21 and/or 31. Accordingly, even in a case where the LED current cannot be monitored by the product test due to package restrictions, the presence or absence of a defect of the LED 21 and/or 31 of the semiconductor device 1 can be determined by connecting a tester to the terminal T3. As described above, since the semiconductor device 1 is configured to be able to omit defects in a die sorter test, a test at the time of die mounting, a final test after wiring or resin sealing, and the like, the reliability of the semiconductor device 1 can be enhanced.

<2> Second Embodiment

A semiconductor device 1a according to the second embodiment is a photo relay including two of A-type switches ASW1 and ASW2, and configured to electrically switch ON/OFF of the two of the A-type switches ASW1 and ASW2 according to an input signal. The semiconductor device 1a suppresses the occurrence of simultaneous turn-on of two of the A-type switches ASW1 and ASW2, by adjusting the on-off timing of each of two of the A-type switches ASW1 and ASW2. Hereinafter, details of the semiconductor device 1a according to the second embodiment will be described.

<2-1> Configuration

First, a configuration of the semiconductor device 1a according to the second embodiment will be described.

<2-1-1> External Appearance of Semiconductor Device 1a

Figures 22, 23:
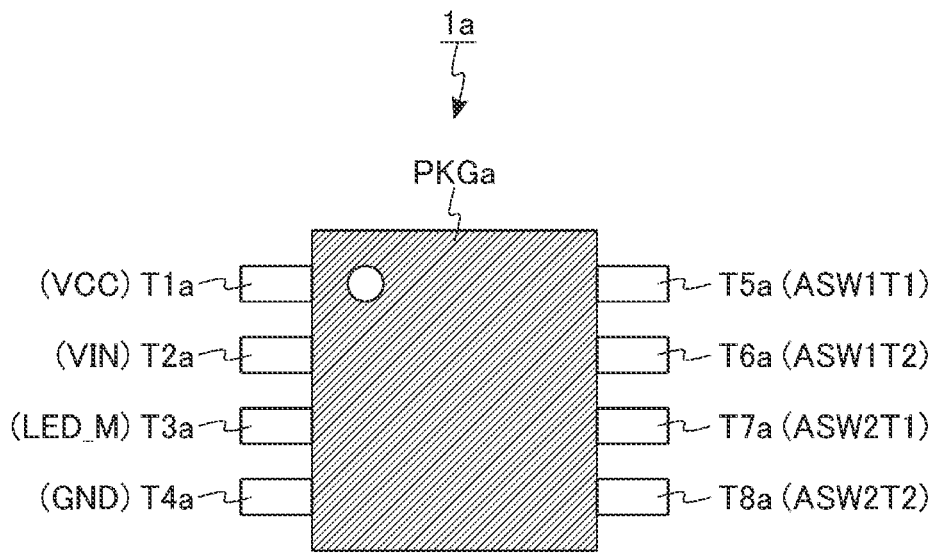
FIG. 22 is a plan view illustrating an example of an external appearance of a semiconductor device according to a second embodiment.
FIG. 23 is a table illustrating an example of input/output characteristics of the semiconductor device according to the second embodiment.

FIG. 22 is a plan view illustrating an example of an external appearance of the semiconductor device 1a according to the second embodiment. As illustrated in FIG. 22, the semiconductor device 1a is sealed in a package PKGa in which terminals Tla to T8a are exposed, for example. The package PKGa includes a light emitting element, a light receiving element, and the like for the semiconductor device 1a to function as a photorelay.

The terminals T1a to T4a are terminals on the input side of the semiconductor device 1a. Specifically, the terminal T1a is a power supply terminal of the semiconductor device 1a. For example, a power supply voltage VCC is applied to the terminal T1a. The terminal T2a is an input terminal of the semiconductor device 1a. For example, an input signal VIN is input to the terminal T2a. The terminal T3a is, for example, a terminal used for an operation test of an LED included in the semiconductor device 1a. The terminal T4a is a ground terminal of the semiconductor device 1a. For example, a ground voltage GND is applied to the terminal T4a. In a case where the operation test of the LED is not performed, the terminal T3a may be a non-contact terminal. In this case, the function related to the operation test of the LED is omitted from the integrated circuit in the semiconductor device 1a, and the chip size can be designed to be small. As described above, an inexpensive product group may be configured as the semiconductor device 1a.

The terminals T5a and Toa are terminals on the output side of the semiconductor device 1a. Specifically, the terminal T5a corresponds to one end (ASW1T1) of the A-type switch ASW1 included in the semiconductor device 1a. The terminal T6a corresponds to other end (ASW1T2) of the A-type switch ASW1 included in the semiconductor device 1a. The semiconductor device 1a can form or cut off a current path between the terminals Ta and T6a based on the input signal VIN. The state in which the current path between the terminals T5a and T6a is formed in the semiconductor device 1a corresponds to the ON state of the A-type switch ASW1. The state in which the current path between the terminals T5a and T6a is cut off in the semiconductor device 1a corresponds to the OFF state of the A-type switch ASW1.

The terminals T1a and T8a are terminals on the output side of the semiconductor device 1a. Specifically, the terminal T7a corresponds to one end (ASW2T1) of the A-type switch ASW2 included in the semiconductor device 1a. The terminal T8a corresponds to other end (ASW2T2) of the A-type switch ASW2 included in the semiconductor device 1a. The semiconductor device 1a can form or cut off a current path between the terminals T1a and T8a based on the input signal VIN. The state in which the current path between the terminals T7a and T8a is formed in the semiconductor device 1a corresponds to the ON state of the A-type switch ASW2. The state in which the current path between the terminals T1a and T8a is cut off in the semiconductor device 1a corresponds to the OFF state of the A-type switch ASW2.

<2-1-2> Input/Output Characteristics of Semiconductor Device 1a

FIG. 23 is a table illustrating an example of input/output characteristics of the semiconductor device 1a according to the second embodiment. FIG. 23 illustrates a correspondence relationship between the states of the power supply voltage VCC, the ground voltage GND, and the input signal VIN corresponding to the input side and the states of the A-type switches ASW1 and ASW2 corresponding to the output side. As illustrated in FIG. 23, the semiconductor device 1a can operate in one of three states. Additionally, the ground voltage GND is at the "L" level in any of the three states.

In a case where the power supply voltage VCC is at the "L" level or the power supply is not connected to the terminal T1a, the semiconductor device 1a enters a state not to accept control by the input signal VIN ("–" in FIG. 23). In this case, each of the A-type switches ASW1 and ASW2 enters the OFF state.

In a case where the power supply voltage VCC is at the "H" level, the semiconductor device 1a is in a state to receive control by the input signal VIN. That is, in a case where the power supply voltage VCC is at the "H" level, the semiconductor device 1a complementarily controls ON/OFF of the A-type switches ASW1 and ASW2 based on the input signal VIN.

Specifically, in a case where the power supply voltage VCC is at the "H" level and the input signal VIN is at the "H" level, the semiconductor device 1a controls the A-type switches ASW1 and ASW2, such that the A-type switch ASW1 enters the ON state and the A-type switch ASW2 enters the OFF state. In a case where the power supply voltage VCC is at the "H" level and the input signal VIN is at the "L" level, the semiconductor device 1a controls the A-type switches ASW1 and ASW2, such that the A-type switch ASW1 enters the OFF state and the A-type switch ASW2 enters the ON state.

<2-1-3> Configuration of Package PKGa

FIG. 24 is a block diagram illustrating an example of a configuration of a package PKGa of the semiconductor device 1a according to the second embodiment. As illustrated in FIG. 24, the package PKGa includes, for example, A-type switches ASW1 and ASW2, an integrated circuit 10a, and ASW control sections 20-1 and 20-2.

The A-type switch ASW1 includes NMOS transistors ENM1-1 and ENM2-1. Each of the NMOS transistors ENM1-1 and ENM2-1 is an enhancement type NMOS transistor. The gate ends of the NMOS transistors ENM1-1 and ENM2-1 are connected to node NG_A1. The source ends of the NMOS transistors ENM1-1 and ENM2-1 are connected to node NS_A1. A drain end of the NMOS transistor ENM1-1 is connected to the terminal T5a. A drain end of the NMOS transistor ENM2-1 is connected to the terminal T6a. FIG. 24 illustrates parasitic diodes provided between the source end and the drain end of each of the NMOS transistors ENM1-1 and ENM2-1. The state in which each of the NMOS transistors ENM1-1 and ENM2-1 enters the ON state corresponds to the ON state of the A-type switch ASW1. The state in which each of the NMOS transistors ENM1-1 and ENM2-1 enters the OFF state corresponds to the OFF state of the A-type switch ASW1.

The A-type switch ASW2 includes NMOS transistors ENM1-2 and ENM2-2. Each of the NMOS transistors ENM1-2 and ENM2-2 is an enhancement type NMOS transistor. The gate ends of the NMOS transistors ENM1-2 and ENM2-2 are connected to node NG_A2. The source ends of the NMOS transistors ENM1-2 and ENM2-2 are connected to node NS_A2. A drain end of the NMOS transistor ENM1-2 is connected to the terminal T7a. A drain end of the NMOS transistor ENM2-2 is connected to the terminal T8a. FIG. 24 illustrates parasitic diodes provided between the source end and the drain end of each of the NMOS transistors ENM1-2 and ENM2-2. The state in which each of the NMOS transistors ENM1-2 and ENM2-2 enters the ON state corresponds to the ON state of the A-type switch ASW2. The state in which each of the NMOS transistors ENM1-2 and ENM2-2 enters the OFF state corresponds to the OFF state of the A-type switch ASW2.

The integrated circuit 10a is a circuit disposed on the input side of the semiconductor device 1a, and controls each of the ASW control sections 20-1 and 20-2. The integrated circuit 10a is connected to each of the terminals T1a to T4a. The integrated circuit 10a includes nodes CA_A1 and CA_A2. The integrated circuit 10a is configured to control the voltage of each of the nodes CA_A1 and CA_A2 based on the power supply voltage VCC supplied to the terminal T1a and the input signal VIN supplied to the terminal T2a. Furthermore, the integrated circuit 10a is configured to supply, to the terminal T3a, for example, a current based on the current flowing through the nodes CA_A1 and/or CA_A2.

The ASW control section 20-1 controls ON/OFF of the A-type switch ASW1 based on the control of the integrated circuit 10a. The ASW control section 20-1 includes a light-emitting diode (LED) 21-1, a light receiving section 22-1, and a VGS controller 23-1. The configurations of the LED 21-1, the light receiving section 22-1, and the VGS controller 23-1 are similar to those of the LED 21, the light receiving section 22, and the VGS controller 23 described in the first embodiment, respectively. The anode of the LED 21-1 is connected to the terminal T1a. The cathode of the LED 21-1 is connected to the node CA_A1 of the integrated circuit 10a. In a case where the LED 21-1 is in the light emitting state, the light receiving section 22-1 receives light emitted from the LED 21-1 and enters ON state. The light receiving section 22-1 in the ON state supplies a current to the VGS controller 23-1. The node ND5 of the VGS controller 23-1 is connected to the node NG_A1. The node AGND2 of the VGS controller 23-1 is connected to the node NS_A1. The VGS controller 23-1 operates based on the current generated by the light receiving section 22-1 and controls the voltages at the nodes NG_A1 and NS_A1. The ASW control section 20-1 is configured to be able to apply a positive voltage to the gate ends of the NMOS transistors ENM1-1 and ENM2-1. As a result, the ASW control section 20-1 can generate a positive potential difference between the gate and the source of the NMOS transistors ENM1-1 and ENM2-1.

The ASW control section 20-2 controls ON/OFF of the A-type switch ASW2 based on the control of the integrated circuit 10a. The ASW control section 20-2 includes a light-emitting diode (LED) 21-2, a light receiving section 22-2, and a VGS controller 23-2. The configurations of the LED 21-2, the light receiving section 22-2, and the VGS controller 23-2 are similar to those of the LED 21, the light receiving section 22, and the VGS controller 23 described in the first embodiment, respectively. The anode of the LED 21-2 is connected to the terminal T1a. The cathode of the LED 21-2 is connected to the node CA_A2 of the integrated circuit 10a. In a case where the LED 21-2 is in the light emitting state, the light receiving section 22-2 receives light emitted from the LED 21-2 and enters ON state. The light receiving section 22-2 in the ON state supplies a current to the VGS controller 23-2. The node ND5 of the VGS controller 23-2 is connected to the node NG_A2. The node AGND2 of the VGS controller 23-2 is connected to the node NS_A2. The VGS controller 23-2 operates based on the current generated by the light receiving section 22-2 and controls the voltages at the nodes NG_A2 and NS_A2. The ASW control section 20-2 is configured to be able to apply a positive voltage to the gate ends of the NMOS transistors ENM1-2 and ENM2-2. As a result, the ASW control section 20-2 can generate a positive potential difference between the gate and the source of the NMOS transistors ENM1-2 and ENM2-2.

<2-1-4> Configuration of Integrated Circuit 10a

Figure 25:
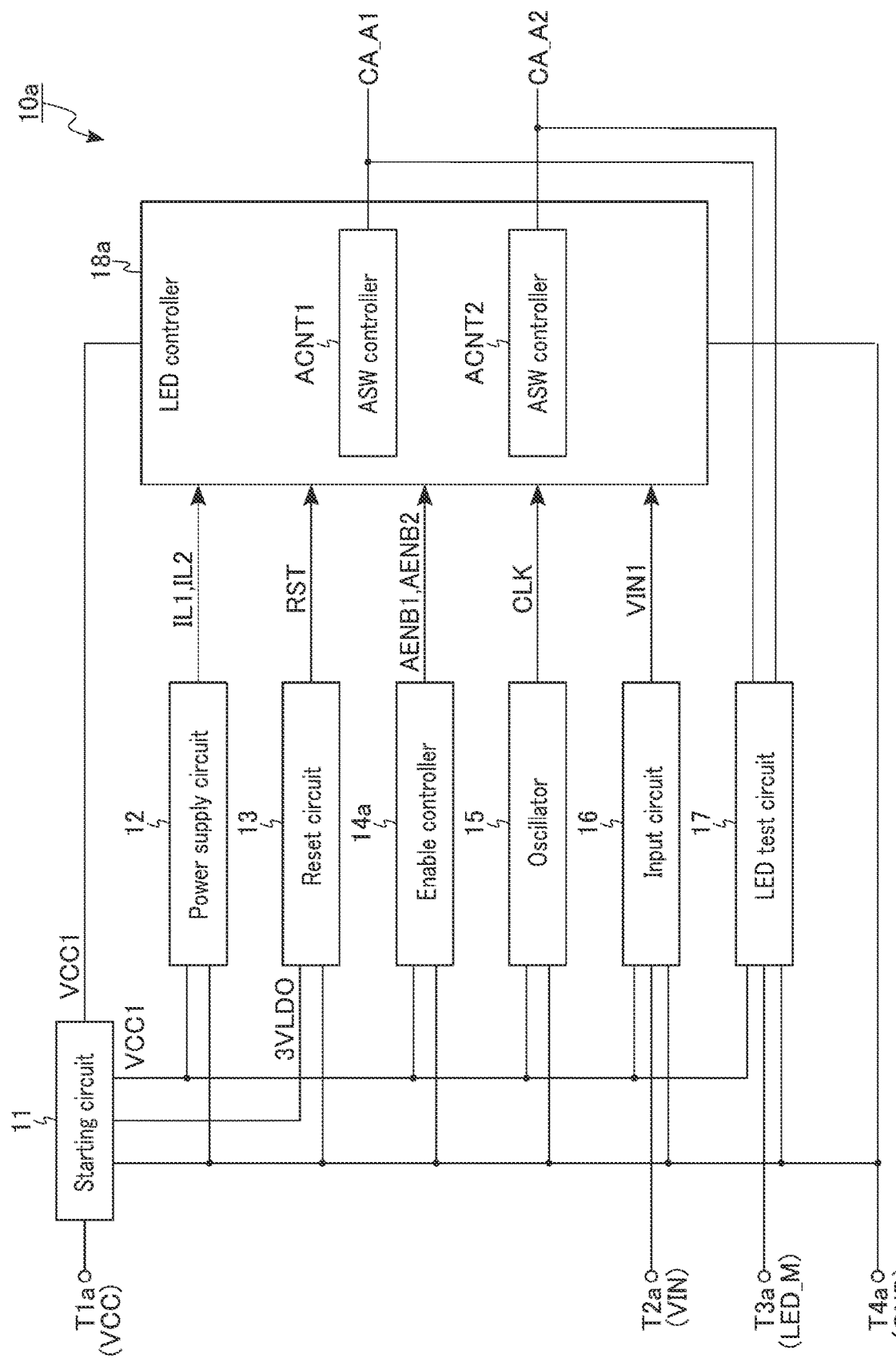
FIG. 25 is a block diagram illustrating an example of a configuration of an integrated circuit included in the semiconductor device according to the second embodiment.

FIG. 25 is a block diagram illustrating an example of a configuration of the integrated circuit 10a included in the semiconductor device 1a according to the second embodiment. As illustrated in FIG. 25, the integrated circuit 10a includes, for example, a starting circuit 11, a power supply circuit 12, a reset circuit 13, an enable controller 14a, an oscillator 15, an input circuit 16, an LED test circuit 17, and an LED controller 18a. The configurations of the starting circuit 11, the power supply circuit 12, the reset circuit 13, the oscillator 15, the input circuit 16, and the LED test circuit 17 in the integrated circuit 10a are similar to those in the first embodiment.

The starting circuit 11 in the integrated circuit 10a generates power supply voltages VCC1 and 3VLDO based on the power supply voltage VCC supplied to the terminal T1a. The input circuit 16 in the integrated circuit 10a receives the input signal VIN input to the terminal T2a, and supplies the received input signal VIN to the LED controller 18a as an input signal VIN1. The LED test circuit 17 in the integrated circuit 10a has a function of supplying the terminal T3a with a current based on the current flowing through the nodes CA_A1 and/or CA_A2. In the integrated circuit 10a, each of the starting circuit 11, the power supply circuit 12, the reset circuit 13, the enable controller 14a, the oscillator 15, the input circuit 16, the LED test circuit 17, and the LED controller 18a is connected to the terminal T4a. The power supply voltage VCC1 is supplied to each of the enable controller 14a and the LED controller 18a via the power supply node, and the ground voltage GND is supplied thereto via the ground node.

The enable controller 14a generates enable signals AENB1 and AENB2, and supplies the generated enable signals AENB1 and AENB2 to the LED controller 18a. The enable signal AENB1 is a control signal for enabling the A-type switch ASW1. In a case where the enable signal AENB1 is at the "H" level, the A-type switch ASW1 is enabled. The enable signal AENB2 is a control signal for enabling the A-type switch ASW2. In a case where the enable signal AENB2 is at the "H" level, the A-type switch ASW2 is enabled. Furthermore, the enable controller 14a is configured such that the operations of the enable signals AENB1 and AENB2 correspond to the operations of the enable signals AENB and BENB described with reference to FIG. 7, respectively. In other words, the enable controller 14a is configured such that a period in which the enable signal AENB1 is at the "H" level is included in a period in which the enable signal AENB2 is at the "H" level.

The LED controller 18a operates based on the currents IL1 and IL2, the reset signal RST, the enable signals AENB1 and AENB2, the clock signal CLK, and the input signal VIN1. The LED controller 18a includes an ASW controller ACNT1 and an ASW controller ACNT2. The ASW controller ACNT1 controls a current of the node CA_A1. That is, the ASW controller ACNT1 controls the current of the cathode of the LED 21-1. The ASW controller ACNT2 controls a current of the node CA_A2. That is, the ASW controller ACNT2 controls the current of the cathode of the LED 21-2.

<2-1-5> Configuration of LED Controller 18a

FIG. 26 is a block diagram illustrating an example of configuration of the LED controller 18a in the integrated circuit 10a included in the semiconductor device 1a according to the second embodiment. As illustrated in FIG. 26, the LED controller 18a includes, for example, driver circuits 40a and 40b, LED drivers 60A-1 and 60A-2, and an inverter IV60. A set of the driver circuit 40a and the LED driver 60A-1 corresponds to the ASW controller ACNT1. A set of the driver circuit 40b and the LED driver 60A-2 corresponds to the ASW controller ACNT2. The inverter IV60 inverts the input signal VIN and outputs an input signal VIN1b.

The driver circuit 40a controls the LED driver 60A-1 based on the input signal VIN1, the enable signal AENB1, the clock signal CLK, and the reset signal RST. The driver circuit 40a includes an AIN generator 41a and a TONA generator 42a. The AIN generator 41a generates a control signal AIN1. The control signal AIN1 is a signal that controls light emission of the LED 21-1 associated with the A-type switch ASW1. The TONA generator 42a generates a control signal TONA1. The control signal TONA1 is a signal used to accelerate the rise of the emission of the LED 21-1 associated with the A-type switch ASW1. The configurations of the AIN generator 41a and the TONA generator 42a are similar to the configuration in which the enable signal AENB is replaced with the enable signal AENB1, the control signals AIN and TONA are replaced with the control signals AIN1 and TONA1, respectively, and the control signal BIN is replaced with the control signal AIN2 in the AIN generator 41 and the TONA generator 42 described in the first embodiment. Hereinafter, in the AIN generator 41a, the dead time DT1 generated using the counter CT10 is referred to as "dead time DT1a". In the TONA generator 42a, the dead time DT2 generated using the counter CT20 is referred to as "dead time DT2a".

The driver circuit 40b controls the LED driver 60A-2 based on the input signal VIN1b, the enable signal AENB2, the clock signal CLK, and the reset signal RST. The driver circuit 40b includes an AIN generator 41b and a TONA generator 42b. The AIN generator 41b generates a control signal AIN2. The control signal AIN2 is a signal that controls light emission of the LED 21-2 associated with the A-type switch ASW2. The TONA generator 42b generates a control signal TONA2. The control signal TONA2 is a signal used to accelerate the rise of the emission of the LED 21-2 associated with the A-type switch ASW2. The configurations of the AIN generator 41b and the TONA generator 42b are similar to the configuration in which the input signal VIN1 is replaced with the input signal VIN1b, the enable signal AENB is replaced with the enable signal AENB2, the control signals AIN and TONA are replaced with the control signals AIN2 and TONA2, respectively, and the control signal BIN is replaced with the control signal AIN1 in the AIN generator 41 and the TONA generator 42 described in the first embodiment. Hereinafter, in the AIN generator 41b, the dead time DT1 generated using the counter CT10 is referred to as "dead time DT1b". In the TONA generator 42b, the dead time DT2 generated using the counter CT20 is referred to as "dead time DT2b".

The LED driver 60A-1 controls light emission and non-light emission of the LED 21-1 by controlling the voltage of the node CA_A1. The LED driver 60A-2 controls light emission and non-light emission of the LED 21-2 by controlling the voltage of the node CA_A2. The configuration of each of the LED drivers 60A-1 and 60A-2 is similar to that of the LED driver 60A described in the first embodiment. The control signal AIN1 is input to the node IN1 of the LED driver 60A-1. The control signal TONA1 is input to the node IN2 of the LED driver 60A-1. The node OUT of the LED driver 60A-1 is connected to the node CA_A1. The control signal AIN2 is input to the node IN1 of the LED driver 60A-2. The control signal TONA2 is input to the node IN2 of the LED driver 60A-2. The node OUT of the LED driver 60A-2 is connected to the node CA_A2.

Note that the circuit configuration of the LED controller 18a may be any other circuit configuration as long as the operation described above can be realized. Other configurations of the semiconductor device 1a according to the second embodiment are similar to those of the semiconductor device 1 according to the first embodiment.

<2-2> Operations

FIG. 27 is a time chart illustrating an example of operation of two of the A-type switches ASW1 and ASW2 when the semiconductor device 1a according to the second embodiment is powered on. FIG. 27 illustrates changes in the voltages of the input signal VIN and the control signals AIN1, TONA1, AIN2, and TONA2, and the states of the A-type switches ASW1 and ASW2. Hereinafter, with reference to FIG. 27, a description will be given on an example of the operation of the two of the A-type switches ASW1 and ASW2 when the semiconductor device 1a according to the second embodiment is powered.

In the initial state of the present example, the input signal VIN and each of the control signals AIN1, TONA1, and TONA2 are at the "L" level, the control signal AIN2 is at the "H" level, the A-type switch ASW1 is in the OFF state, and the A-type switch ASW2 is in the ON state. That is, the LED 21-1 is in the non-light emitting state, and the LED 21-2 is in the light emitting state.

At the time t1a, if the input signal VIN transitions from the "L" level to the "H" level, the control signal AIN2 transitions from the "H" level to the "L" level. Then, the LED driver 60A-2 suspends the supply of the current to the LED 21-2 and suspends the light emission of the LED 21-2. As a result, the gate ends of the NMOS transistors ENM1-2 and ENM2-2 are discharged by the VGS controller 23-2, and the A-type switch ASW2 enters the OFF state. Further, if the input signal VIN transitions from the "L" level to the "H" level, the counter CT10 of the AIN generator 41a starts the counting operation of the input clock signal. In the present example, the time at which the dead time DT1a based on the count result of the counter CT10 of the AIN generator 41a has elapsed from the time t1a as a starting point corresponds to the time t2a.

At the time t2a, each of the control signals AIN1 and TONA1 transitions from the "L" level to the "H" level based on the elapse of the dead time DT1a from the time t1a. Then, the LED driver 60A-1 causes the current IL3 amplified using the currents IL1 and IL2 to flow to the LED 21-1. Specifically, the LED current (IL3) flows from the terminal T1a (VCC) to the NMOS transistor NM53 (constant current switch) of the LED driver 60A-1 via the anode and cathode of the LED 21-1. As a result, the LED 21-1 quickly emits light. As a result, a forward bias is applied between the gate and the source of the NMOS transistors ENM1-1 and ENM2-1 by the VGS controller 23-1, and the A-type switch ASW1 enters the ON state. In addition, if the control signal AIN1 transitions from the "L" level to the "H" level, the counter CT20 of the TONA generator 42a starts the counting operation of the input clock signal. In the present example, the time at which the dead time DT2a based on the count result of the counter CT20 of the TONA generator 42a has elapsed from the time t2a as a starting point corresponds to the time t3a.

At the time t3a, the control signal TONA1 transitions from the "H" level to the "L" level based on the elapse of the dead time DT2a from the time t2a. Then, the LED driver 60A-1 causes the current IL4 amplified using the current IL1 to flow to the LED 21-1. Specifically, the LED current (IL4) flows from the terminal T1a (VCC) to the NMOS transistor NM53 (constant current switch) of the LED driver 60A-1 via the anode and cathode of the LED 21-1. Thus, the light emission of the LED 21-1 is maintained. Therefore, the A-type switch ASW1 maintains the ON state even after the time t3a.

At the time t4a, if the input signal VIN transitions from the "H" level to the "L" level, the control signal AIN1 transitions from the "H" level to the "L" level. Then, the LED driver 60A-1 suspends the supply of the current to the LED 21-1 and suspends the light emission of the LED 21-1. As a result, the gate ends of the NMOS transistors ENM1-1 and ENM2-1 are discharged by the VGS controller 23-1, and the A-type switch ASW1 enters the OFF state. Further, at the time t4a, if the input signal VIN transitions from the "H" level to the "L" level, the counter CT10 of the AIN generator 41a starts the counting operation of the input clock signal. In the present example, the time at which the dead time DT1b based on the count result of the counter CT10 of the AIN generator 41b has elapsed from the time t4a as a starting point corresponds to the time t5a.

At the time t5a, each of the control signals AIN2 and TONA2 transitions from the "L" level to the "H" level based on the elapse of the dead time DT1b from the time t4a. Then, the LED driver 60A-2 causes the current IL3 amplified using the currents IL1 and IL2 to flow to the LED 21-2. Specifically, the LED current (IL3) flows from the terminal T1a (VCC) to the NMOS transistor NM53 (constant current switch) of the LED driver 60A-2 via the anode and cathode of the LED 21-2. As a result, the LED 21-2 quickly emits light. As a result, a forward bias is applied between the gate and the source of the NMOS transistors ENM1-2 and ENM2-2 by the VGS controller 23-2, and the A-type switch ASW2 enters the ON state. In addition, if the control signal AIN2 transitions from the "L" level to the "H" level, the counter CT20 of the TONA generator 42b starts the counting operation of the input clock signal. In the present example, the time at which the dead time DT2b based on the count result of the counter CT20 of the TONA generator 42b has elapsed from the time t5a as a starting point corresponds to the time t6a.

At the time toa, the control signal TONA2 transitions from the "H" level to the "L" level based on the elapse of the dead time DT2b from the time t5a. Then, the LED driver 60A-2 causes the current IL4 amplified using the current IL1 to flow to the LED 21-2. Specifically, the LED current (IL4) flows from the terminal T1a (VCC) to the NMOS transistor NM53 (constant current switch) of the LED driver 60A-2 via the anode and cathode of the LED 21-2. Thus, the light emission of the LED 21-2 is maintained. Therefore, the A-type switch ASW2 maintains the ON state even after the time t6a.

The operation of the semiconductor device 1a at the time t1a is similar to the operation of the semiconductor device 1a at time t1a. Thereafter, the semiconductor device 1a executes the operations described at times t1a to t6a according to a change in the input signal VIN. The four dead times DT1a, DT2a, DT1b, and DT2b are parameters determined by independent counters CT. Therefore, each of the dead times DT1a, DT2a, DT1b, and DT2b can be easily changed by modifying the circuit configuration of the driver circuits 40a and 40b.

As described above, in the semiconductor device 1a, the ASW controller ACNT1 is configured to cause the LED 21-1 to emit light after the dead time DT1a elapses after the input signal VIN transitions from the "L" level to the "H" level, and suspend the light emission of the LED 21-1 before the dead time DT1b elapses after the input signal VIN transitions from the "H" level to the "L" level. Further, the ASW controller ACNT1 is configured to cause the LED 21-1 to emit light based on the total current of the currents IL1 and IL2 after the input signal VIN transitions from the "L" level to the "H" level and the dead time DT1a elapses until the dead time DT2a further elapses, and cause the LED 21-1 to emit light based on the current IL1 after the dead time DT2a elapses.

In addition, the ASW controller ACNT2 is configured to suspend the light emission of the LED 21-2 before the dead time DT1a elapses after the input signal VIN transitions from the "L" level to the "H" level, and cause the LED 21-2 to emit light after the dead time DT1b elapses after the input signal VIN transitions from the "H" level to the "L" level. Further, the ASW controller ACNT2 is configured to cause the LED 21-2 to emit light based on the total current of the currents IL1 and IL2 after the input signal VIN transitions from the "L" level to the "H" level and the dead time DT1b elapses until the dead time DT2b further elapses, and cause the LED 21-2 to emit light based on the current IL1 after the dead time DT2b elapses.

Other operations of the semiconductor device 1a according to the second embodiment are similar to the operations of the semiconductor device 1 according to the first embodiment.

<2-3> Advantageous Effects of Second Embodiment

In a case where the input signal VIN transitions from the "L" level to the "H" level, the semiconductor device 1a according to the second embodiment can turn off the A-type switch ASW2 before the A-type switch ASW1 is turned on. Similarly, in a case where the input signal VIN transitions from the "H" level to the "L" level, the semiconductor device 1a can turn off the A-type switch ASW1 before the A-type switch ASW2 is turned on. Therefore, similarly to the first embodiment, the semiconductor device 1a can prevent the two switch elements (the A-type switches ASW1 and ASW2) from being simultaneously turned on. Other effects of the semiconductor device 1a according to the second embodiment are similar to those of the first embodiment. As described above, the semiconductor device 1 may be configured as the semiconductor device 1a that is a combination of two of the A-type switches ASW1 and ASW2 and two of the ASW controllers ACNT1 and ACNT2. That is, the semiconductor device 1 can be changed in design according to the characteristics of the NMOS transistor used for output.

<3> Modifications and the Like

Each of the semiconductor device 1 according to the first embodiment and the semiconductor device 1a according to the second embodiment can be used as an alternative to a reed relay such as a tester relay or a sequencer, a mercury relay, or a mechanical relay. The semiconductor devices 1 and 1a described above may be configured as follows.

FIG. 28 is a circuit diagram illustrating a modification of the circuit configuration of the light receiving section 22 and the VGS controller 23 included in the ASW control section 20. FIG. 28 illustrates a circuit configuration of the light receiving section 22 similar to that of the first embodiment and a modification of the circuit configuration of the VGS controller 23 (VGS controller 23a). As illustrated in FIG. 28, the VGS controller 23a has a configuration in which the NPN transistors NPN2 and NPN3 and the resistance element R63 are omitted in the VGS controller 23 described in the first embodiment. Further, in the VGS controller 23a, each of the drain end of the depletion NMOS transistor NM60 and the collector end of the NPN transistor NPN1 is connected not to the node ND4 but to the node ND5. In this case, the on-resistances of the depletion NMOS transistor NM60 and the NPN transistor NPN1 are used similarly to the resistance element R63 of the first embodiment. A set of the light receiving section 22 and the VGS controller 23a operates similarly to a set of the light receiving section 22 and the VGS controller 23 of the first embodiment, and can realize a similar effect. Note that a resistance element R63 (not illustrated) designed to have a lower resistance value than the resistance element R 62 may be connected between the node ND5 and a set of the drain end of the depletion NMOS transistor NM60 and the collector end of the NPN transistor NPN1.

FIG. 29 is a circuit diagram illustrating a modification of the circuit configuration of the light receiving section 32 and the VGS controller 33 included in the BSW control section 30. FIG. 29 illustrates a circuit configuration of the light receiving section 32 similar to that of the first embodiment and a modification of the circuit configuration of the VGS controller 33 (VGS controller 33a). As illustrated in FIG. 29, the VGS controller 33a has a configuration in which the NPN transistors NPN2 and NPN3 are omitted in the VGS controller 33 described in the first embodiment. Furthermore, in the VGS controller 33a, the node ND4 is connected to the node ND5 via the resistance element R64. Each of a drain end of the depletion NMOS transistor NM60 and a collector end of the NPN transistor NPN1 is connected to the node ND5 via a resistance element R65 designed to have a higher resistance value than the resistance element R64. A set of the light receiving section 32 and the VGS controller 33a operates similarly to a set of the light receiving section 32 and the VGS controller 33 of the first embodiment, and can realize a similar effect.

FIG. 30 is a block diagram illustrating a modification of the configuration of the package PKG of the semiconductor device 1 (package PKGb). Hereinafter, the semiconductor device 1 including the package PKGb is referred to as a "semiconductor device 1b". The package PKGb includes, for example, an A-type switch ASW, a B-type switch BSW, an integrated circuit 10b, an ASW control section 20a, and a BSW control section 30a. In this example, the terminal T3 is omitted. The integrated circuit 10b includes a voltage stabilizer 101, a DT circuit 102, driver circuits 103a and 103b, and signal generators 104a and 104b. The ASW control section 20a includes coils L21 and L22, a receive circuit 25, and a driver circuit 26. The BSW control section 30a includes coils L31 and L32, a receive circuit 35, and a driver circuit 36. Each of a set of coils L21 and L22 and a set of coils L31 and L32 may be referred to as an insulating element or a magnetic coupling element.

The voltage stabilizer 101 is a circuit that supplies a constant voltage VREG to, for example, the DT circuit 102, the driver circuits 103a and 103b, and the signal generators 104a and 104b based on the power supply voltage VCC applied to the terminal T1. The voltage stabilizer 101 is, for example, a linear regulator. The DT circuit 102 operates an insulating element of either one of the ASW control section 20a and the BSW control section 30a at a timing different from that of the other insulating element based on the input signal VIN input to the terminal T2. Specifically, the DT circuit 102 controls the operation of the insulating element of the ASW control section 20a via the driver circuit 103a and the signal generator 104a. Similarly, the DT circuit 102 controls the operation of the insulating element of the BSW control section 30a via the driver circuit 103b and the signal generator 104b. The driver circuit 103a is a circuit that drives the insulating element of the ASW control section 20a. The driver circuit 103a supplies a voltage generated based on the control of the DT circuit 102 to the signal generator 104a. In a case where the voltage at the "H" level is supplied from the driver circuit 103a, the signal generator 104a transmits the modulated voltage to one end of the coil L21. The driver circuit 103b is a circuit that drives the insulating element of the BSW control section 30a. The driver circuit 103b supplies a voltage generated based on the control of the DT circuit 102 to the signal generator 104b. In a case where the voltage at the "H" level is supplied from the driver circuit 103b, the signal generator 104b transmits the modulated voltage to one end of the coil L31. Each of the signal generators 104a and 104b includes, for example, an oscillator.

The other end of the coil L21 is connected to the ground node. The coil L21 and the coil L22 are electrically insulated and magnetically coupled by an insulating layer (not illustrated) provided between the coils L21 and L22. One end of the coil L22 is connected to the receive circuit 25. The other end of the coil L22 is connected to the ground node. The receive circuit 25 is a circuit that receives a signal. The receive circuit 25 demodulates a signal received from the coil L22 and supplies the demodulated signal to the driver circuit 26. The receive circuit 25 includes, for example, a smoothing circuit. The driver circuit 26 is a circuit that drives the NMOS transistors ENM1 and ENM2 based on the voltage supplied from the receive circuit 25. When receiving the modulated voltage from the signal generator 104a, the ASW control section 20a applies a positive voltage to the gate ends (node NG_A) of the NMOS transistors ENM1 and ENM2. In other words, when receiving the modulated voltage from the signal generator 104a, the ASW control section 20a applies a positive voltage between the gate and the source of the NMOS transistors ENM1 and ENM2.

The other end of the coil L31 is connected to the ground node. The coil L31 and the coil L32 are electrically insulated and magnetically coupled by an insulating layer (not illustrated) provided between the coils L31 and L32. One end of the coil L32 is connected to the receive circuit 35. The other end of the coil L32 is connected to the ground node. The receive circuit 35 is a circuit that receives a signal. The receive circuit 35 demodulates a signal received from the coil L32 and supplies the demodulated signal to the driver circuit 36. The receive circuit 35 includes, for example, a smoothing circuit. The driver circuit 36 is a circuit that drives the NMOS transistors DNM1 and DNM2 based on the voltage supplied from the receive circuit 35. When receiving the modulated voltage from the signal generator 104b, the BSW control section 30a applies a positive voltage to the source ends (node NS_B) of the NMOS transistors DNM1 and DNM2. In other words, when receiving the modulated voltage from the signal generator 104b, the BSW control section 30a applies a reverse voltage between the gate and the source of the NMOS transistors DNM1 and DNM2.

Then, a set of the A-type switch ASW and the B-type switch BSW, the integrated circuit 10b, and the ASW control section 20a and the BSW control section 30a operates similarly to FIG. 20. In the ASW control section 20a, a signal and power are transmitted between the magnetically coupled coils L21 and L22, and conduction and cutoff of the A-type switch ASW are executed. In the BSW control section 30a, a signal and power are transmitted between the magnetically coupled coils L31 and L32, and conduction and cutoff of the B-type switch BSW are executed. As described above, the semiconductor device 1b is configured to control the A-type switch ASW and the B-type switch BSW by magnetic coupling. The DT circuit 102 can complementarily control the A-type switch ASW and the B-type switch BSW by setting the dead times DT1 to DT4 similarly to the ASW controller ACNT and the BSW controller BCNT of the first embodiment. Further, each of the driver circuits 103a and 103b may have the similar configuration as the driver circuit 40 of the first embodiment. In this case, each of the driver circuits 103a and 103b increases the voltage for driving the signal generators 104a and 104b based on the control signal RUSHON. Even in such a case, the semiconductor device 1b can obtain the same effects as those of the first embodiment. Further, in the semiconductor device 1b, a combination of two of the A-type switches ASW1 and ASW2 may be used. In this case, the semiconductor device 1b is configured to operate similarly to the second embodiment.

Note that, in the semiconductor device 1b, the case of using magnetic coupling has been exemplified, but capacitive coupling may be used instead of magnetic coupling. In this case, for example, each of the set of coils L21 and L22 and the set of coils L31 and L32 is replaced with a capacitor which is a capacitive coupling element. Then, each of the driver circuits 103a and 103b, the signal generators 104a and 104b, the receive circuits 25 and 35, and the driver circuits 26 and 36 is changed to a configuration capable of transmitting a signal via the capacitor. Even in such a case, the semiconductor device 1b can obtain the same effects as those of the first embodiment. Furthermore, although not illustrated, an insulating coupling element may be optimally connected to the driver circuit and the receive circuit, respectively. The insulating coupling element is used in a configuration with two different insulated power-to-ground points.

In the present specification, each of a set of an LED and a light receiving section (for example, the LED 21 and the light receiving section 22) that transmit a signal by optical coupling, a set of two coils (for example, coils L21 and L22) that transmit a signal by magnetic coupling, and a capacitor that transmits a signal by capacitive coupling may be referred to as a "insulating coupling element". The insulating coupling element is configured to transmit a signal in its operation and to stop transmitting a signal in a case where the operation is stopped. For example, the ASW control section 20 is configured to control the A-type switch ASW to the conductive state (ON state) in a case where a signal is transmitted from the insulating coupling element including the LED 21 and the light receiving section 22, that is, in a case where the associated insulating coupling element is operating. In addition, the ASW control section 20 is configured to control the A-type switch ASW to the non-conductive state (OFF state) in a case where a signal is not transmitted from the insulating coupling element including the LED 21 and the light receiving section 22, that is, in a case where the associated insulating coupling element stops operating. The BSW control section 30 is configured to control the B-type switch BSW to the non-conductive state (OFF state) in a case where a signal is transmitted from the insulating coupling element including the LED 31 and the light receiving section 32, that is, in a case where the associated insulating coupling element is operating. In addition, the BSW control section 30 is configured to control the B-type switch BSW to the conductive state (ON state) in a case where a signal is not transmitted from the insulating coupling element including the LED 31 and the light receiving section 32, that is, in a case where the associated insulating coupling element stops operating.

In the present specification, the voltage at the "H" level corresponds to a voltage equal to or higher than a threshold value when data is determined by binary values. The voltage at the "L" level corresponds to a voltage lower than a threshold value when data is determined by binary values. "Connection" indicates electrical connection, and does not exclude that another element is interposed therebetween, for example. The "electrically connected" may be via an insulator as long as it can operate in the same manner as the electrically connected one. In the present specification, "conductive type" corresponds to "N-type" or "P type". For example, the transistor of the first conductive type corresponds to one of the NMOS transistor and the PMOS transistor, and the transistor of the second conductive type corresponds to the other of the NMOS transistor and the PMOS transistor. The collector end and the emitter end of the NPN transistor may be referred to as one end and the other end of the transistor. Similarly, the drain end and the source end of the NMOS transistor may be referred to as one end and the other end of the transistor. One end and the other end of the transistor may be referred to as a "first end" and a "second end". The ground node may be referred to as a power node. Each of the ASW controllers ACNT, ACNT1, and ACNT2, and the BSW controller BCNT may be referred to as a "switch control circuit". Each of the VGS controllers 23, 23a, 33a, and 33b may be referred to as a "voltage control circuit". Each circuit configuration in the semiconductor devices 1 and 1a described above may have any other circuit configuration as long as similar functions and operations can be realized.

Some or all of the above embodiments may be described as the following supplementary notes, but are not limited to the following.

Supplementary Note 1

A semiconductor device including:
a first switch element including a first MOS transistor and a second MOS transistor each having one end connected to a first node and a gate end connected to a second node;
a second switch element including a third MOS transistor and a fourth MOS transistor each having one end connected to a third node and a gate end connected to a fourth node;
a first light emitting element and a second light emitting element;
a first light receiving element configured to generate a current based on light generated by the first light emitting element;
a second light receiving element configured to generate a current based on light generated by the second light emitting element;
a first voltage control circuit configured to apply a voltage to the second node based on the current generated by the first light receiving element;
a second voltage control circuit configured to apply a voltage to the third node based on the current generated by the second light receiving element;
a first switch control circuit configured to cause the first light emitting element to emit light after a first time elapses after an input signal transitions from a first logic level to a second logic level; and
a second switch control circuit configured to suspend light emission of the second light emitting element after a second time elapses after the input signal transitions from the second logic level to the first logic level.

Supplementary Note 2

The semiconductor device according to supplementary note 1, wherein
the first switch control circuit is configured to suspend light emission of the first light emitting element before the second time elapses after the input signal has transitioned from the second logic level to the first logic level, and
the second switch control circuit is configured to cause the second light emitting element to emit light before the first time elapses after the input signal has transitioned from the first logic level to the second logic level.

Supplementary Note 3

The semiconductor device according to supplementary note 1 or supplementary note 2, wherein
the first switch control circuit is configured to cause the first light emitting element to emit light based on a first current until a third time further elapses after the first time elapses after the input signal has transitioned from the first logic level to the second logic level, and cause the first light emitting element to emit light based on a second current smaller than the first current after the third time has elapsed, and
the second switch control circuit is configured to cause the second light emitting element to emit light based on a third current until a fourth time elapses after the input signal has transitioned from the first logic level to the second logic level, and cause the second light emitting element to emit light based on a fourth current smaller than the third current after the fourth time has elapsed.

Supplementary Note 4

The semiconductor device according to any one of supplementary notes 1 to 3, further including:
an enable controller configured to generate a first enable signal that enables control of conduction of the first switch element and a second enable signal that enables control of conduction of the second switch element based on supply of a power supply voltage, wherein
a timing at which the first enable signal transitions from the first logic level to the second logic level based on the supply of the power supply voltage is later than a timing at which the second enable signal transitions from the first logic level to the second logic level based on the supply of the power supply voltage, and
a timing at which the first enable signal transitions from the second logic level to the first logic level based on suspension of the supply of the power supply voltage is earlier than a timing at which the second enable signal transitions from the second logic level to the first logic level based on the suspension of the supply of the power supply voltage.

Supplementary Note 5

The semiconductor device according to any one of supplementary notes 1 to 4, wherein the first voltage control circuit includes a first resistance element connected to a path for charging the second node and a second resistance element connected to a path for discharging the first node and having a resistance value lower than a resistance value of the first resistance element, and the second voltage control circuit includes a third resistance element connected to a path for charging the third node and a fourth resistance element connected to a path for discharging the fourth node and having a resistance value higher than a resistance value of the third resistance element.

Supplementary Note 6

The semiconductor device according to any one of supplementary note 1 to 5, wherein
each of the first MOS transistor and the second MOS transistor is an enhancement type N-channel MOSFET, and
each of the third MOS transistor and the fourth MOS transistor is a depletion type N-channel MOSFET.

Supplementary Note 7

A semiconductor device including:
a first switch element including a first transistor and a second transistor each having a source end connected to a first node and a gate end connected to a second node;
a second switch element including a third transistor and a fourth transistor each having a source end connected to a third node and a gate end connected to a fourth node;
a first light emitting element and a second light emitting element;
a first light receiving element that generates a current based on light generated by the first light emitting element;
a second light receiving element that generates a current based on light generated by the second light emitting element;
a first voltage control circuit that applies a voltage to the second node based on the current generated by the first light receiving element;
a second voltage control circuit that applies a voltage to the fourth node based on the current generated by the second light receiving element;
a first switch control circuit configured to cause the first light emitting element to emit light after a first time elapses after an input signal transitions from a first logic level to a second logic level; and
a second switch control circuit configured to cause the second light emitting element to emit light after a second time elapses after the input signal transitions from the second logic level to the first logic level.

Supplementary Note 8

The semiconductor device according to supplementary note 7, wherein
the first switch control circuit is configured to suspend light emission of the first light emitting element before the second time elapses after the input signal has transitioned from the second logic level to the first logic level, and
the second switch control circuit is configured to suspend light emission of the second light emitting element before the first time elapses after the input signal has transitioned from the first logic level to the second logic level.

Supplementary Note 9

The semiconductor device according to supplementary note 7 or supplementary note 8, wherein
the first switch control circuit is configured to cause the first light emitting element to emit light based on a first current until a third time further elapses after the first time elapses after the input signal has transitioned from the first logic level to the second logic level, and cause the first light emitting element to emit light based on a second current smaller than the first current after the third time has elapsed, and
the second switch control circuit is configured to cause the second light emitting element to emit light based on a third current until a fourth time further elapses after the second time elapses after the input signal has transitioned from the second logic level to the first logic level, and cause the second light emitting element to emit light based on a fourth current smaller than the third current after the fourth time has elapsed.

Supplementary Note 10

The semiconductor device according to any one of supplementary notes 7 to 9, wherein
each of the first transistor, the second transistor, the third transistor, and the fourth transistor is an enhancement type N-channel MOSFET.

Supplementary Note 11

A semiconductor device, including:
a first switch element;
a second switch element;
a first insulating coupling element and a second insulating coupling element;
a first control circuit configured to control the first switch element to be in a conductive state in a case where the first insulating coupling element transmits a signal, and to control the first switch element to be in a non-conductive state in a case where the first insulating coupling element does not transmit a signal;
a second control circuit configured to control the second switch element to be in a non-conductive state in a case where the second insulating coupling element transmits a signal, and to control the second switch element to be in a conductive state in a case where the second insulating coupling element does not transmit a signal;
a first switch control circuit configured to cause the first insulating coupling element to transmit a signal after a first time elapses after an input signal has transitioned from a first logic level to a second logic level; and
a second switch control circuit configured to suspend transmission of a signal of the second insulating coupling element after a second time elapses after the input signal has transitioned from the second logic level to the first logic level.

Supplementary Note 12

The semiconductor device according to supplementary note 11, wherein
the first switch control circuit is configured to suspend transmission of the first insulating coupling element before the second time elapses after the input signal has transitioned from the second logic level to the first logic level, and
the second switch control circuit is configured to cause the second insulating coupling element to transmit a signal before the first time elapses after the input signal has transitioned from the first logic level to the second logic level.

Supplementary Note 13

The semiconductor device according to supplementary note 11 or supplementary note 12, wherein
the first switch control circuit is configured to promote transmission of a signal of the first insulating coupling element until a third time further elapses after the first time has elapsed after the input signal has transitioned from the first logic level to the second logic level, and
the second switch control circuit is configured to promote transmission of a signal of the second insulating coupling element until a fourth time elapses after the input signal has transitioned from the first logic level to the second logic level.

Supplementary Note 14

A semiconductor device, including:
a first switch element;
a second switch element;
a first insulating coupling element and a second insulating coupling element;
a first control circuit configured to control the first switch element to be in a conductive state in a case where the first insulating coupling element transmits a signal, and to control the first switch element to be in a non-conductive state in a case where the first insulating coupling element does not transmit a signal;
a second control circuit configured to control the second switch element to be in a conductive state in a case where the second insulating coupling element transmits a signal, and to control the second switch element to be in a non-conductive state in a case where the second insulating coupling element does not transmit a signal;
a first switch control circuit configured to cause the first insulating coupling element to transmit a signal after a first time elapses after an input signal has transitioned from a first logic level to a second logic level; and
a second switch control circuit configured to cause the second insulating coupling element to transmit a signal after a second time elapses after the input signal has transitioned from the second logic level to the first logic level.

Supplementary Note 15

The semiconductor device according to supplementary note 14, wherein
the first switch control circuit is configured to suspend transmission of the first insulating coupling element before the second time elapses after the input signal has transitioned from the second logic level to the first logic level, and
the second switch control circuit is configured to suspend transmission of a signal of the second insulating coupling element before the first time elapses after the input signal has transitioned from the first logic level to the second logic level.

Supplementary Note 16

The semiconductor device according to supplementary note 14 or supplementary note 15, wherein
the first switch control circuit is configured to promote transmission of a signal of the first insulating coupling element until a third time further elapses after the first time has elapsed after the input signal has transitioned from the first logic level to the second logic level, and
the second switch control circuit is configured to promote transmission operation of a signal of the second insulating coupling element until a fourth time further elapses after the second time has elapsed after the input signal has transitioned from the second logic level to the first logic level.

Supplementary Note 17

The semiconductor device according to any one of supplementary notes 11 to 16, further including:
an enable controller configured to generate a first enable signal that enables control of conduction of the first switch element and a second enable signal that enables control of conduction of the second switch element based on supply of a power supply voltage, wherein
a timing at which the first enable signal transitions from the first logic level to the second logic level based on the supply of the power supply voltage is later than a timing at which the second enable signal transitions from the first logic level to the second logic level based on the supply of the power supply voltage, and
a timing at which the first enable signal transitions from the second logic level to the first logic level based on suspension of the supply of the power supply voltage is earlier than a timing at which the second enable signal transitions from the second logic level to the first logic level based on the suspension of the supply of the power supply voltage.

Supplementary Note 18

The semiconductor device according to any one of supplementary notes 11 to 17, wherein
each of the first insulating coupling element and the second insulating coupling element is configured to transmit a signal using optical coupling.

Supplementary Note 19

The semiconductor device according to any one of supplementary notes 11 to 17, wherein each of the first insulating coupling element and the second insulating coupling element is configured to transmit a signal using magnetic coupling.

Supplementary Note 20

The semiconductor device according to any one of supplementary notes 11 to 17, wherein
each of the first insulating coupling element and the second insulating coupling element is configured to transmit a signal using capacitive coupling.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device, comprising:
a first switch element including a first MOS transistor and a second MOS transistor each having one end connected to a first node and a gate end connected to a second node, and
a second switch element including a third MOS transistor and a fourth MOS transistor each having one end connected to a third node and a gate end connected to a fourth node;
a first light emitting element and a second light emitting element,
a first light receiving element configured to generate a current based on light generated by the first light emitting element;
a second light receiving element configured to generate a current based on light generated by the second light emitting element;
a first voltage control circuit configured to apply a voltage to the second node based on the current generated by the first light receiving element;
a second voltage control circuit configured to apply a voltage to the third node based on the current generated by the second light receiving element;
a first switch control circuit configured to cause the first light emitting element to emit light after a first time elapses after an input signal has transitioned from a first logic level to a second logic level; and
a second switch control circuit configured to suspend light emission of the second light emitting element after a second time elapses after the input signal has transitioned from the second logic level to the first logic level, wherein
each of the first MOS transistor and the second MOS transistor is an enhancement type N-channel MOSFET, and
each of the third MOS transistor and the fourth MOS transistor is a depletion type N-channel MOSFET.

2. The semiconductor device of claim 1, wherein
the first switch control circuit is configured to suspend light emission of the first light emitting element before the second time elapses after the input signal has transitioned from the second logic level to the first logic level, and the second switch control circuit is configured to cause the second light emitting element to emit light before the first time elapses after the input signal has transitioned from the first logic level to the second logic level.

3. The semiconductor device of claim 1, wherein
the first switch control circuit is configured to:
cause the first light emitting element to emit light based on a first current until a third time further elapses after the first time elapses after the input signal has transitioned from the first logic level to the second logic level; and
cause the first light emitting element to emit light based on a second current smaller than the first current after the third time has elapsed, and
the second switch control circuit is configured to:
cause the second light emitting element to emit light based on a third current until a fourth time elapses after the input signal has transitioned from the first logic level to the second logic level; and
cause the second light emitting element to emit light based on a fourth current smaller than the third current after the fourth time has elapsed.

4. The semiconductor device of claim 1, further comprising:
an enable controller configured to generate a first enable signal and a second enable signal based on supply of a power supply voltage, wherein
the first enable signal enables control of conduction of the first switch element,
the second enable signal enables control of conduction of the second switch element,
a timing at which the first enable signal transitions from the first logic level to the second logic level based on the supply of the power supply voltage is later than a timing at which the second enable signal transitions from the first logic level to the second logic level based on the supply of the power supply voltage, and
a timing at which the first enable signal transitions from the second logic level to the first logic level based on suspension of the power supply voltage is earlier than a timing at which the second enable signal transitions from the second logic level to the first logic level based on the suspension of the supply of the power supply voltage.

5. The semiconductor device of claim 1, wherein
the first voltage control circuit includes a first resistance element and a second resistance element,
the second voltage control circuit includes a third resistance element and a fourth resistance element,
the first resistance element is connected to a path for charging the second node,
the second resistance element is connected to a path for discharging the first node,
a resistance value of the second resistance element is lower than a resistance value of the first resistance element,
the third resistance element is connected to a path for charging the third node,
the fourth resistance element is connected to a path for discharging the fourth node, and
a resistance value of the fourth resistance element is higher than a resistance value of the third resistance element.

6. A semiconductor device, comprising:
a first switch element including a first transistor and a second transistor each having a source end connected to a first node and a gate end connected to a second node, and
a second switch element including a third transistor and a fourth transistor each having a source end connected to a third node and a gate end connected to a fourth node;
a first light emitting element and a second light emitting element,
a first light receiving element configured to generate a current based on light generated by the first light emitting element;
a second light receiving element configured to generate a current based on light generated by the second light emitting element;
a first voltage control circuit configured to apply a voltage to the second node based on the current generated by the first light receiving element;
a second voltage control circuit configured to apply a voltage to the fourth node based on the current generated by the second light receiving element;
a first switch control circuit configured to cause the first light emitting element to emit light after a first time elapses after an input signal has transitioned from a first logic level to a second logic level; and
a second switch control circuit configured to cause the second light emitting element to emit light after a second time elapses after the input signal has transitioned from the second logic level to the first logic level, wherein
each of the first transistor, the second transistor, the third transistor, and the fourth transistor is an enhancement type N-channel MOSFET.

7. The semiconductor device of claim 6, wherein
the first switch control circuit is configured to suspend light emission of the first light emitting element before the second time elapses after the input signal has transitioned from the second logic level to the first logic level, and
the second switch control circuit is configured to suspend light emission of the second light emitting element before the first time elapses after the input signal has transitioned from the first logic level to the second logic level.

8. The semiconductor device of claim 6, wherein
the first switch control circuit is configured to:
  cause the first light emitting element to emit light based on a first current until a third time further elapses after the first time elapses after the input signal has transitioned from the first logic level to the second logic level; and
  cause the first light emitting element to emit light based on a second current smaller than the first current after the third time has elapsed, and
the second switch control circuit is configured to:
  cause the second light emitting element to emit light based on a third current until a fourth time further elapses after the second time elapses after the input signal has transitioned from the second logic level to the first logic level; and
  cause the second light emitting element to emit light based on a fourth current smaller than the third current after the fourth time has elapsed.

9. A semiconductor device, comprising:
a first switch element;
a second switch element;
a first insulating coupling element and a second insulating coupling element;
a first control circuit configured to control the first switch element to be in a conductive state in a case where the first insulating coupling element transmits a signal, and to control the first switch element to be in a non-conductive state in a case where the first insulating coupling element does not transmit a signal;
a second control circuit configured to control the second switch element to be in a non-conductive state in a case where the second insulating coupling element transmits a signal, and to control the second switch element to be in a conductive state in a case where the second insulating coupling element does not transmit a signal;
a first switch control circuit configured to cause the first insulating coupling element to transmit a signal after a first time elapses after an input signal has transitioned from a first logic level to a second logic level; and
a second switch control circuit configured to suspend transmission of a signal of the second insulating coupling element after a second time elapses after the input signal has transitioned from the second logic level to the first logic level.

10. The semiconductor device of claim 9, wherein
the first switch control circuit is configured to suspend transmission of a signal of the first insulating coupling element before the second time elapses after the input signal has transitioned from the second logic level to the first logic level, and
the second switch control circuit is configured to cause the second insulating coupling element to transmit a signal before the first time elapses after the input signal has transitioned from the first logic level to the second logic level.

11. The semiconductor device of claim 9, wherein
the first switch control circuit is configured to promote transmission of a signal of the first insulating coupling element until a third time further elapses after the first time has elapsed after the input signal has transitioned from the first logic level to the second logic level, and
the second switch control circuit is configured to promote transmission of a signal of the second insulating coupling element until a fourth time elapses after the input signal has transitioned from the first logic level to the second logic level.

12. The semiconductor device of claim 9, further comprising:
an enable controller configured to generate a first enable signal that enables control of conduction of the first switch element and a second enable signal that enables control of conduction of the second switch element based on supply of a power supply voltage, wherein
a timing at which the first enable signal transitions from the first logic level to the second logic level based on the supply of the power supply voltage is later than a timing at which the second enable signal transitions from the first logic level to the second logic level based on the supply of the power supply voltage, and
a timing at which the first enable signal transitions from the second logic level to the first logic level based on suspension of the supply of the power supply voltage is earlier than a timing at which the second enable signal transitions from the second logic level to the first logic level based on the suspension of the supply of the power supply voltage.

13. The semiconductor device of claim 9, wherein each of the first insulating coupling element and the second insulating coupling element is configured to transmit a signal using optical coupling.

14. The semiconductor device of claim 9, wherein each of the first insulating coupling element and the second insulating coupling element is configured to transmit a signal using magnetic coupling.

15. The semiconductor device of claim 9, wherein each of the first insulating coupling element and the second insulating coupling element is configured to transmit a signal using capacitive coupling.

16. A semiconductor device, comprising:
a first switch element;
a second switch element;
a first insulating coupling element and a second insulating coupling element;
a first control circuit configured to control the first switch element to be in a conductive state in a case where the first insulating coupling element transmits a signal, and to control the first switch element to be in a non-conductive state in a case where the first insulating coupling element does not transmit a signal;
a second control circuit configured to control the second switch element to be in a conductive state in a case where the second insulating coupling element transmits a signal, and to control the second switch element to be in a non-conductive state in a case where the second insulating coupling element does not transmit a signal;
a first switch control circuit configured to cause the first insulating coupling element to transmit a signal after a first time elapses after an input signal has transitioned from a first logic level to a second logic level; and
a second switch control circuit configured to cause the second insulating coupling element to transmit a signal after a second time elapses after the input signal has transitioned from the second logic level to the first logic level.

17. The semiconductor device of claim 16, wherein
the first switch control circuit is configured to suspend transmission of a signal of the first insulating coupling element before the second time elapses after the input signal has transitioned from the second logic level to the first logic level, and
the second switch control circuit is configured to suspend transmission of a signal of the second insulating coupling element before the first time elapses after the input signal has transitioned from the first logic level to the second logic level.

18. The semiconductor device of claim 16, wherein
the first switch control circuit is configured to promote transmission of a signal of the first insulating coupling element until a third time further elapses after the first time has elapsed after the input signal has transitioned from the first logic level to the second logic level, and
the second switch control circuit is configured to promote transmission operation of a signal of the second insulating coupling element until a fourth time further elapses after the second time has elapsed after the input signal has transitioned from the second logic level to the first logic level.

19. The semiconductor device of claim 16, further comprising:
an enable controller configured to generate a first enable signal that enables control of conduction of the first switch element and a second enable signal that enables control of conduction of the second switch element based on supply of a power supply voltage, wherein
a timing at which the first enable signal transitions from the first logic level to the second logic level based on the supply of the power supply voltage is later than a timing at which the second enable signal transitions from the first logic level to the second logic level based on the supply of the power supply voltage, and
a timing at which the first enable signal transitions from the second logic level to the first logic level based on suspension of the supply of the power supply voltage is earlier than a timing at which the second enable signal transitions from the second logic level to the first logic level based on the suspension of the supply of the power supply voltage.

* * * * *